United States Patent [19]
Diekema et al.

[11] Patent Number: 5,469,365
[45] Date of Patent: Nov. 21, 1995

[54] POWER MONITOR UNIT

[75] Inventors: Jon M. Diekema, Jenison; Joseph B. Steffler, Alto; Jerald W. Van Baren, Grand Rapids; Vincent Sancimino, Roseville, all of Mich.

[73] Assignees: Customs Ideas, Ada; CPM, Roseville, both of Mich.

[21] Appl. No.: 27,326

[22] Filed: Jan. 25, 1993

[51] Int. Cl.⁶ .......................... G01R 21/00; G01R 11/02
[52] U.S. Cl. ............... 364/483; 340/870.02; 340/870.03; 364/464.04
[58] Field of Search .................. 340/870.02, 870.03; 364/464.04, 483

[56] References Cited

U.S. PATENT DOCUMENTS

| Re. 26,331 | 1/1968 | Brothman et al. | 340/870.02 X |
|---|---|---|---|
| 3,098,123 | 7/1963 | Stonor | 379/106 |
| 3,842,208 | 10/1974 | Paraskevakos | 179/5 R |
| 4,086,434 | 4/1978 | Bocchi | 179/2 AM |
| 4,504,831 | 3/1985 | Jahr et al. | 340/870.03 |
| 4,700,188 | 10/1987 | James | 340/870.03 |
| 4,703,325 | 10/1987 | Chamberlin et al. | 340/825.17 |
| 4,996,646 | 2/1991 | Farrington | 364/483 |
| 5,027,285 | 6/1991 | McCartney et al. | 364/483 |
| 5,166,887 | 11/1992 | Farrington et al. | 364/483 |
| 5,170,360 | 12/1992 | Porter et al. | 364/483 |
| 5,179,376 | 1/1993 | Pomatto | 340/870.02 |
| 5,181,026 | 1/1993 | Granville | 340/870.28 |
| 5,185,705 | 2/1993 | Farrington | 364/483 |
| 5,315,531 | 5/1994 | Oravetz et al. | 364/550 |
| 5,315,533 | 5/1994 | Stich et al. | 364/480 |

*Primary Examiner*—Edward R. Cosimano
*Attorney, Agent, or Firm*—Cushman, Darby & Cushman

[57] ABSTRACT

A unit monitors power and reports to a central location. The unit receives an A/C power signal to be monitored, senses a zero crossing of the A/C power signal, and delays an interval so as to sample the A/C signal after a 90 degree phase delay after the zero crossing. Samples are stored in a static recording medium, such as an EEPROM. A processor detects anomalous conditions in the A/C signal using stored configuration values, and reports to a central location at a unit-dependant time after detecting an anomaly. The unit responds to commands from the central location and reports the recorded samples of the A/C power signal, as well as a contemporaneous value of the A/C power signal. The unit also receives and updates revised configuration values.

15 Claims, 59 Drawing Sheets

MAIN-1/3

MAIN-2/3

MAIN-3/3

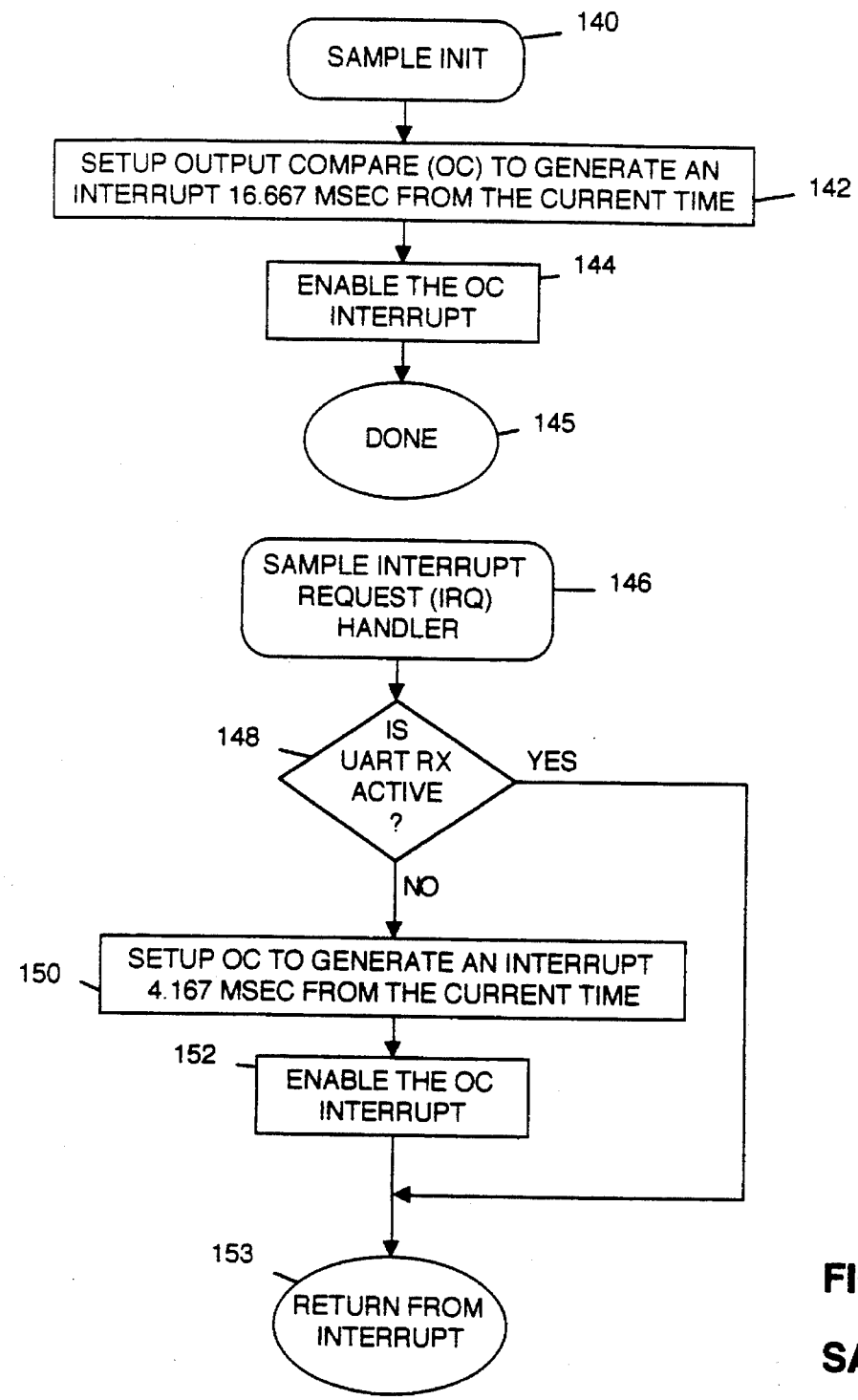

SAMPLE-2/2

FILTER-1/1

TRIGGER-1/3

TRIGGER-2/3

TRIGGER-3/3

REPORT-1/9

REPORT-2/9

REPORT-3/9

REPORT-4/9

REPORT-5/9

REPORT-6/9

REPORT-7/9

REPORT-8/9

REPORT-9/9

DIAL-1/4

DIAL-2/4

DIAL-3/4

DIAL-4/4

UART-1/9
TIMER-0/1

**UART-2/9
TIMER-0/1**

UART-3/9
TIMER-0/1

UART-4/9
TIMER-0/1

UART-5/9
TIMER-0/1

UART-6/9
TIMER-0/1

UART-7/9
TIMER-0/1

UART-8/9
TIMER-0/1

UART-9/9
TIMER-0/1

TIMER-1/1
UART-0/9

THE COMMAND STATES ARE:

- LOOKING
- READ PARAMETERS
- READ TERM SEARCH
- READ CRLF
- READ REPLY
- READ FINAL CRLF
- READ EE
- READ EE WAIT
- WRITE PARAMETERS
- WRITE EE
- TERM SEARCH
- WAIT Tx DONE

COMMAND-1/11

COMMAND-2/11

COMMAND-3/11

COMMAND-4/11

COMMAND-5/11

COMMAND-6/11

COMMAND-7/11

COMMAND-8/11

COMMAND-9/11

COMMAND-10/11

COMMAND-11/11

EEPROM-1/9

EEPROM-2/9

EEPROM-4/9

EEPROM-5/9

EEPROM-6/9

EEPROM-7/9

EEPROM-8/9

EEPROM-9/9

LOG-1/1

LED-1/1

RTC-1/1

POWER MONITOR UNIT

BACKGROUND OF THE INVENTION

1. Field of the Invention

This invention relates to devices and methods for monitoring power sources for specified conditions and automatically alerting a host of the condition.

2. Description of the Art

A need for a practical system for reporting status in an electric utility's service area has been recognized for some time, and various systems have been proposed for using the public telephone network for providing information to a central location. U.S. Pat. No. 3,098,123 suggested installing a mechanical auto-dialer in an electrical substation which called a control room and replayed pre-recorded verbal statements. More recently, U.S. Pat. No. 4,086,434 proposed automatic meter reading equipment using a microcontroller that has ancillary alarm reporting features.

Despite these efforts, no power monitoring apparatus has been put into widespread use that is economical enough to be installed throughout the lowest levels of the power distribution network (e.g. at the 117 VAC end-user locations, as opposed to substations) and that provides sufficient information to assist a utility in determining the extent of power distribution problems. Most electric utilities still rely on customers' telephone calls when power fails.

SUMMARY OF THE INVENTION

An object of the present invention is to provide an economical, practical power monitoring unit appropriate for use at end-user locations in a power distribution network.

Another object is to provide a power monitoring unit that, when replicated throughout a service area, will automatically report power anomalies through the public switch telephone network in an orderly and practical manner.

Another object is to provide a power monitoring unit that can be reconfigured from a central location after installation.

Another object is to provide a power monitoring unit that can store a history of power measurement for reporting to the central location after an anomaly.

A Power Monitor Unit (PMU) of the present invention is a self-contained device which monitors the 117 Volt AC power within the customer's home, samples and logs peak line voltages, and automatically notifies the electric utility in the event of abnormal power conditions via a built-in telephone interface and Modem. The PMU can identify and call the utility host for any of the following conditions: over-voltage, under-voltage, power transient, power failure. An internal Ni-Cad battery is provided to power the PMU for several hours after a total AC power loss. When replicated throughout a service area, each unit will report an anomaly after a 5 second delay. Those PMU units that fail to access the utility host, most likely because the host is busy, redial after a random delay. The delays of units are different so that all units responding to a common anomaly will report at staggered times to prevent saturating the public telephone network.

BRIEF DESCRIPTION OF THE DRAWINGS

FIGS. 2a–2c are flow-charts of the main program loop for

FIGS. 3a–3b are flow-charts of a routine for sampling analog voltages, including A/C line voltage, battery voltage and telephone voltage;

DETAILED DESCRIPTION OF THE PRESENTLY PREFERRED EXEMPLARY EMBODIMENTS

Figure 1A:
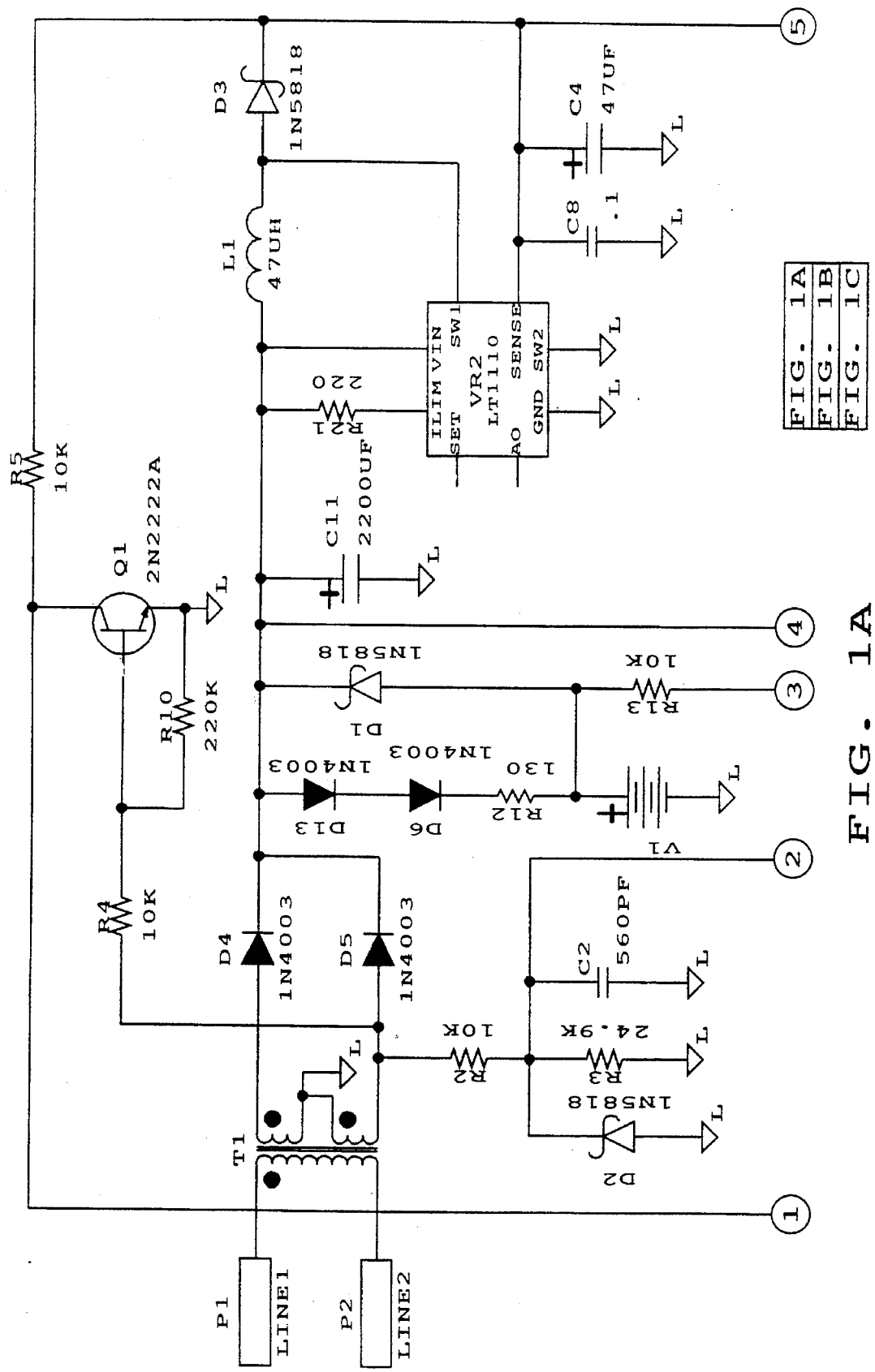
FIGS. 1a–1c is a schematic diagram of electronic circuitry for a power monitor unit in accordance with the present invention (PMU)
Figure 1B:
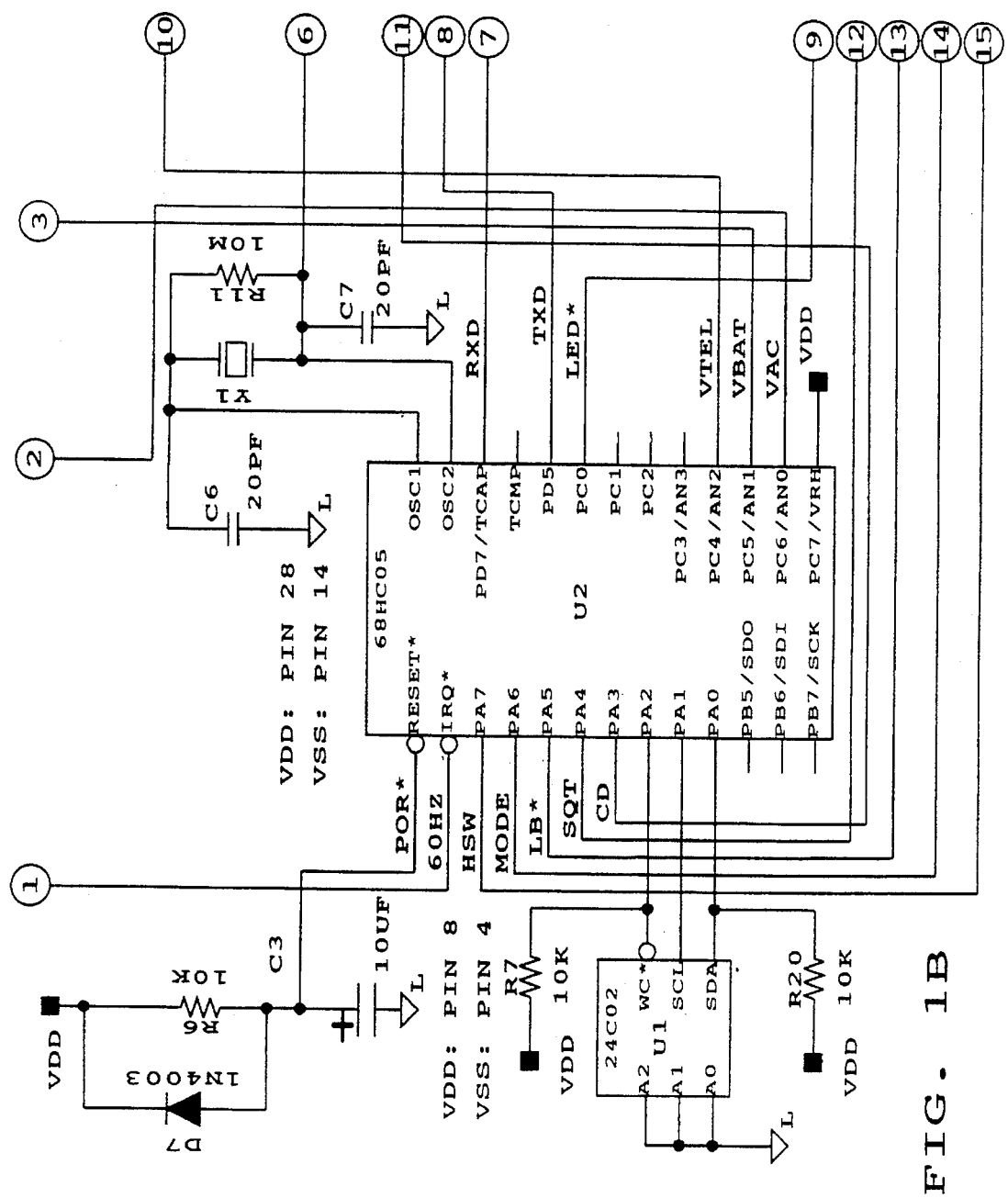
Figure 1C:
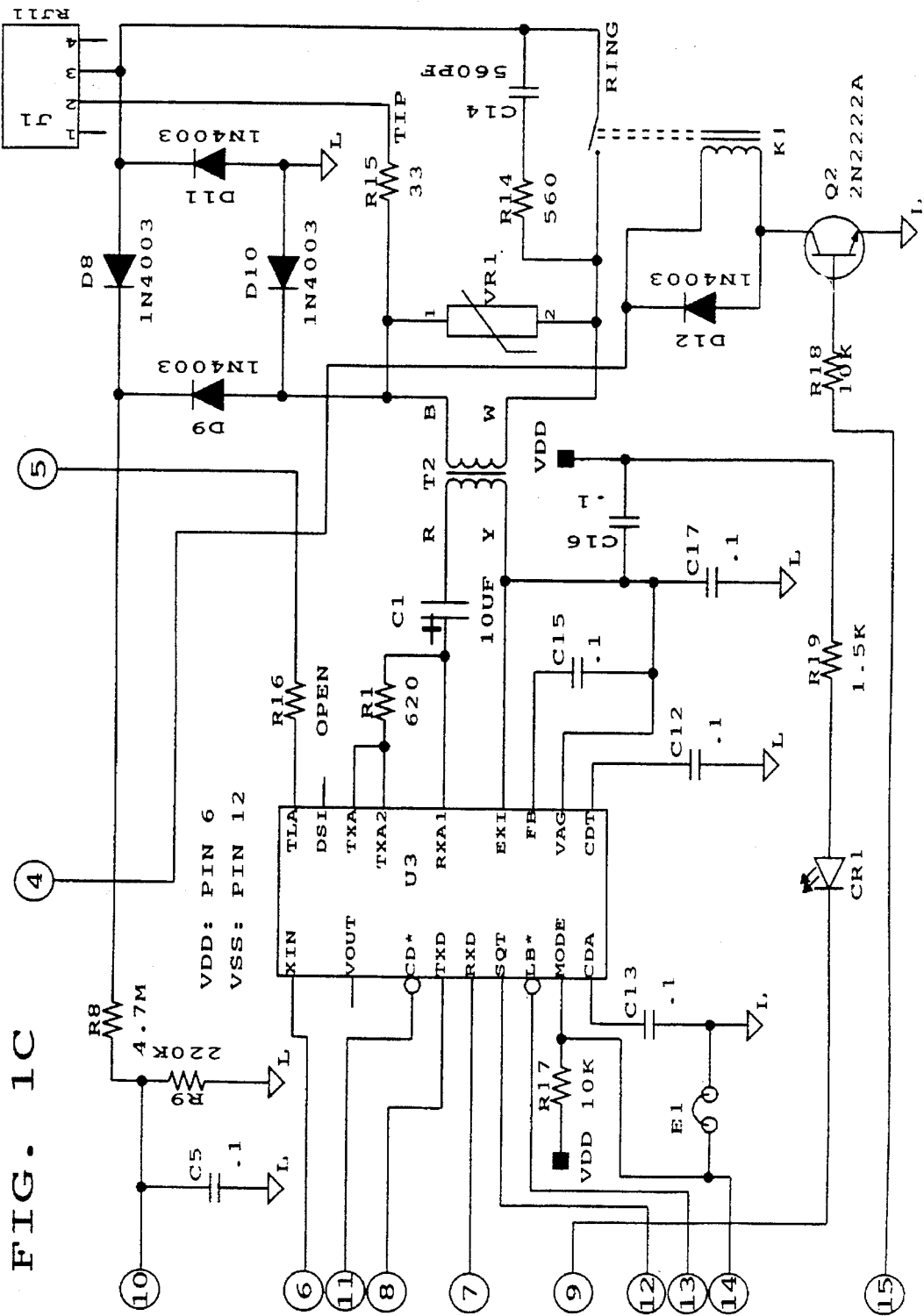

FIGS. 1a, 1b and 1c are is a schematic diagram of electronic circuitry for a power monitor unit in accordance with the present invention (PMU). The components and circuitry of the PMU are housed within a single plastic enclosure less than 2"×2"×4" (not shown). The enclosure contains an integral power connector P1 and telephone connector J1. The power connector P1 plugs directly into any 117 Volt AC wall outlet. Telephone connector J1 is a typical RJ-11 type and connects into a customer's phone service.

The PMU further has microcontroller U2 which has an Electrically Erasable Programmable Read Only Memory (EEPROM) U1. Each PMU is programmed with a unique Individual Serial Number (ISN). The ISN is used by the utility's host computer to identify which PMU is calling and reporting.

Operational characteristics, such as high and low voltage level trip points that signal an abnormal power condition, are field programmable into EEPROM U1 by the utility host. EEPROM U1 is also programmed with phone number(s) to be dialed so that the PMU can report to the utility host. If desired, a unique phone number can be used to report different abnormal power conditions.

To enhance AC power diagnostic capability, the PMU logs the AC voltage level at the integral power connector P1 over a period of time. This data in turn is reported to the utility host. The voltage levels are recorded at fixed time intervals into a circular buffer. Therefore, the data is always reported as relative from the current time.

The PMU initiates calls but does not receive them. When originally installed and at periodic times thereafter, the PMU will dial and report its operational status to the utility host. During this call the utility host will update the time and date within the PMU and schedule the next periodic routine call to the utility host. These periodic calls are of a short duration and are scheduled at different times for each PMU so that the utility host can handle routine calls at a constant level.

CIRCUITRY

The PMU draws power from either the AC line or from a Ni—Cad battery. Power conditioning is performed on the line voltage so that a steady 5 Volts will be supplied to the electronic components. AC Line voltage is received in the PMU through power connector P1 and reduced by transformer T1 to around 3 VAC. Transformed power is then rectified by diodes D4 and D5 and regulated to a 5V level by voltage regulator VR2. Capacitor C4 smooths the 5V line voltage during load transients. One leg of the transformed AC voltage is filtered to remove line noise (D2,R3,C2) and connected to an A/D input line of the microcontroller for sampling while the other leg is sensed for zero crossing as discussed more fully below.

During periods when AC power is available, the PMU charges a Ni—Cad battery V1 through resistor R12 and diodes D6, D13. During power failures, the Ni—Cad batter V1 powers the PMU through shottky diode D1. The voltage regulator VR2 steps up the battery voltage to 5V in conjunction with coil L1.

The PMU has an internal microcontroller U2 (Motorola 68HC05) with four I/O ports (A,B,C and D) and on-board programmable memory. When power is first applied to the PMU, a power-on-reset circuit (C3, R6, D7) holds the microcontroller U2 in a reset state until after VDD line voltages stabilizes.

The microcontroller has connections to control:

1) a light emitting diode CR1 using one line of I/O port C.

2) a telephone hook switch K1 using a line of port A (driven by transistor Q2); and 3) a modem chip U3 using four lines of port A (e.g., the modem U3 indicates that a connection has been made by raising the carrier detect line CD to a high level).

The microcontroller exchanges serial data with a Bell 103, 300 baud, FSK modem U3 using two lines of port D. The modem U3 and the microcontroller U2 share an oscillator circuit (Y1, C7, C6, R11) operating at 3.579 Mhz. The modem U3, in turn, connects to the public telephone network using a conventional, impedance-matched interface (T2, VR1, D8–D11, R14, R15, C14). Once connected, the microcontroller can exchange serial data with a host computer (not shown).

The PMU dials using relay K1 to make/break the hook connection. The microcontroller U2 drives the relay K1 using a transistor Q2 connected to a line of port PA7. The relay K1 draws power from rectified line voltage, rather than from the regulated Vdd line, to isolate Vdd from the relay-switching noise. A solid state device (not shown), can be used instead of the electro-mechanical relay, thereby eliminating transistor Q2, diode D12, resistor R14, and capacitor C14.

In addition to using its internal memory, microcontroller U2 can read and write serial data to EEPROM U1 using three lines of port A. The microcontroller U2 periodically logs line voltage so that utility host can extract the most recent measurements when the PMU is reporting. EEPROM U1 also saves all the configuration parameters. EEPROM U1 retains its values, even when there is no power to the PMU.

AC line voltage is sampled by microcontroller at delay of 90 degrees from the zero crossing of AC line voltage as discussed below. Sampling proceeds at a 60 hertz rate synchronized with the last detected zero cross of AC line voltage. An interrupt circuit (Q1, R4, RS, R10) detects the zero-crossing of the AC line voltage and generates a edge trigger for the interrupt input of the microcontroller U2. The base of transistor Q1 connects to one leg of the transformer T1, and the emitter connects to the center tap. The transistor Q1 turns "on" when voltage on the sensed leg crosses zero going positive relative to the center tap. The transistor, in turn, pulls the interrupt line to ground and generates a falling edge for the microcontroller interrupt. After an interrupt, microcontroller U2 waits for a period equal to a 90 degree phase of the A/C line and then samples the peak A/C voltage.

The PMU has a LED (CR1) to indicate status. When the LED is not illuminated, the PMU is not receiving power. Steady illumination indicates that the PMU is receiving power, measuring the line voltage, and logging the line voltage periodically. A slow flash indicates that microcontroller U2 has a pending report. A quick flash indicates dialing and/or reporting.

SOFTWARE

The PMU operates with a combination of interrupt-driven actions and scheduled actions. As discussed above, hardware generates an interrupt at the zero-crossing of the A/C line voltage, and voltage sampling takes place ¼ phase later when voltage is expected to peak. Other actions take place at scheduled intervals, such as logging measurements.

Figure 2A:
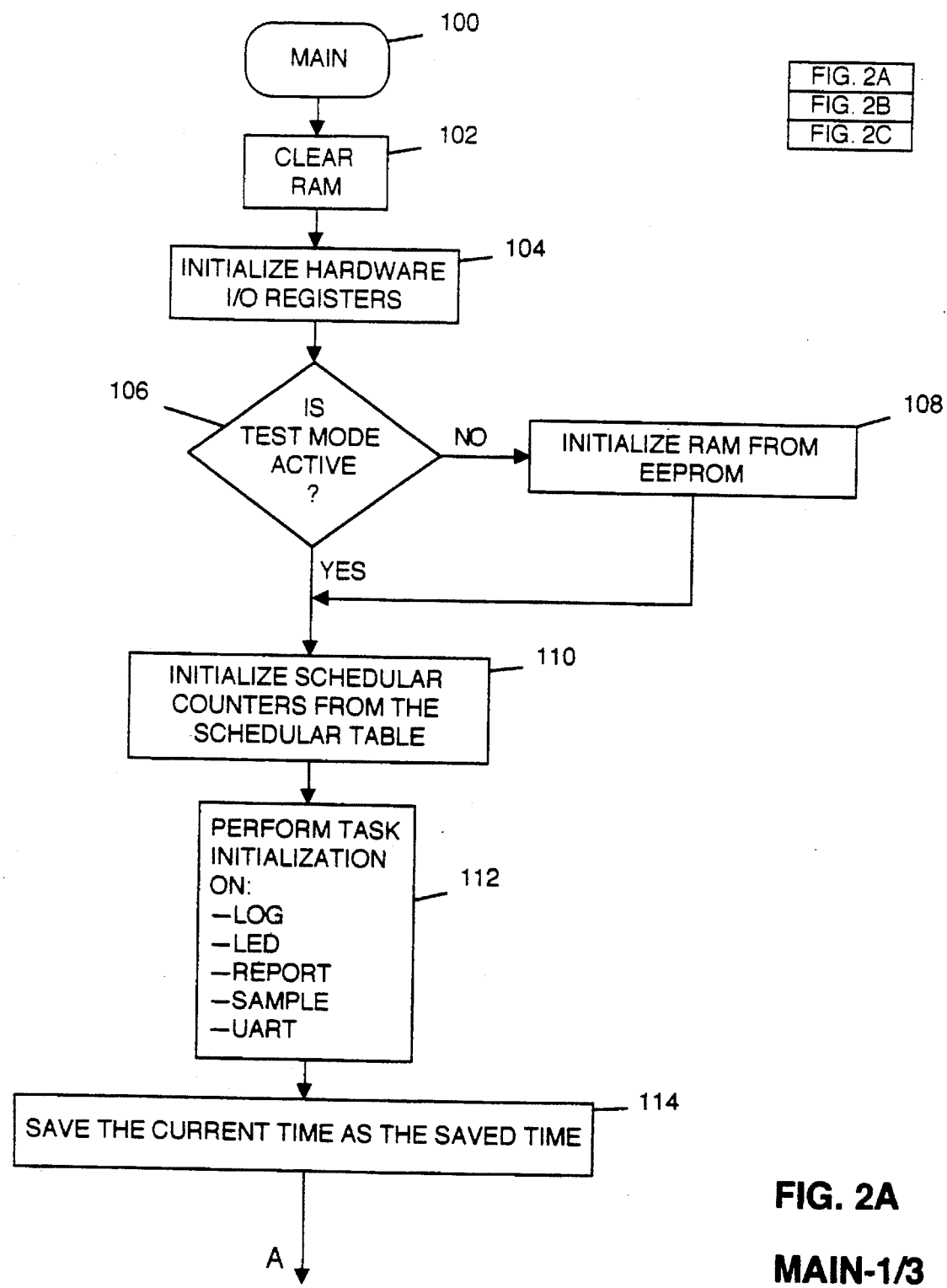
Figure 2B:
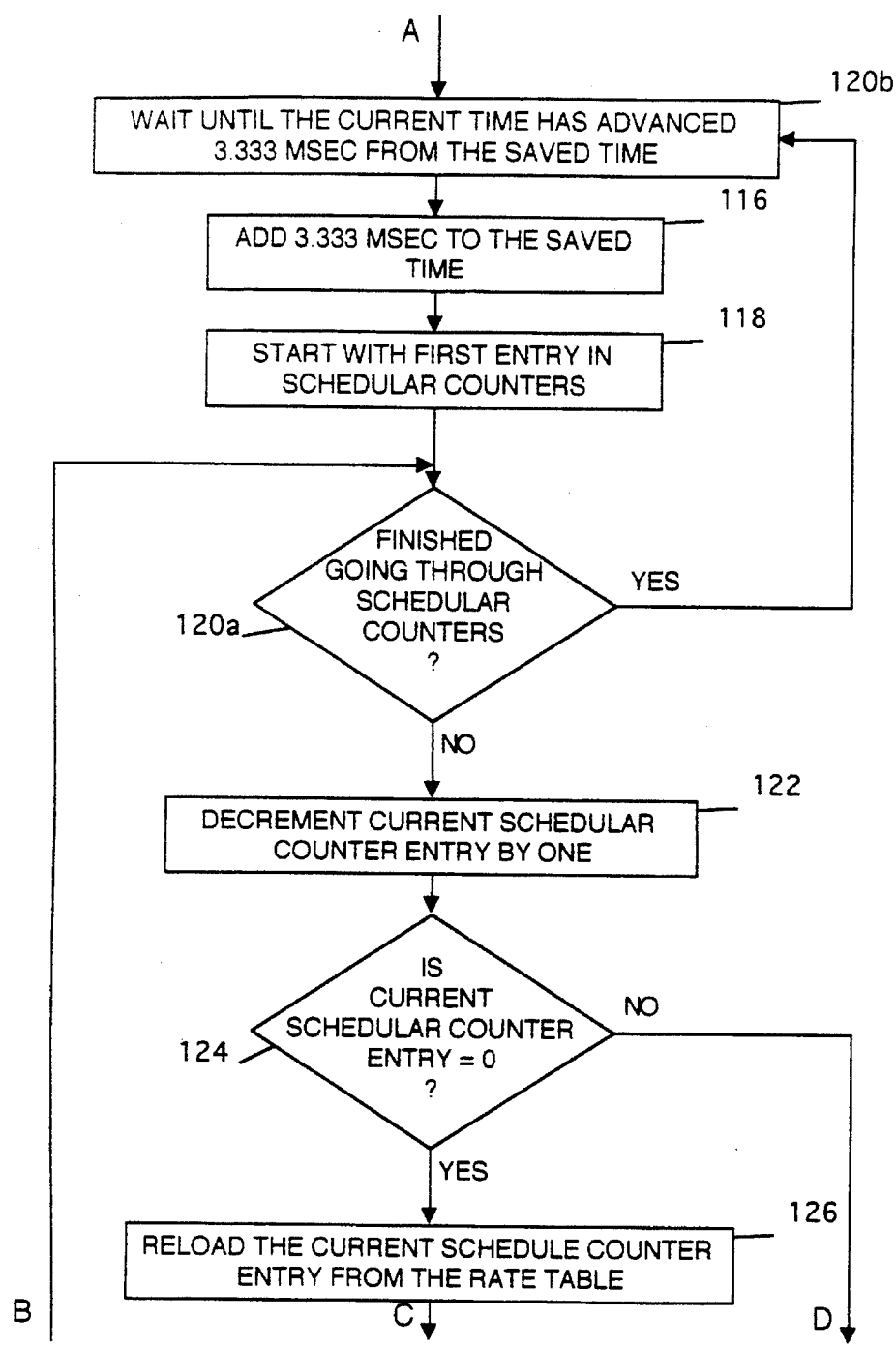
Figure 2C:
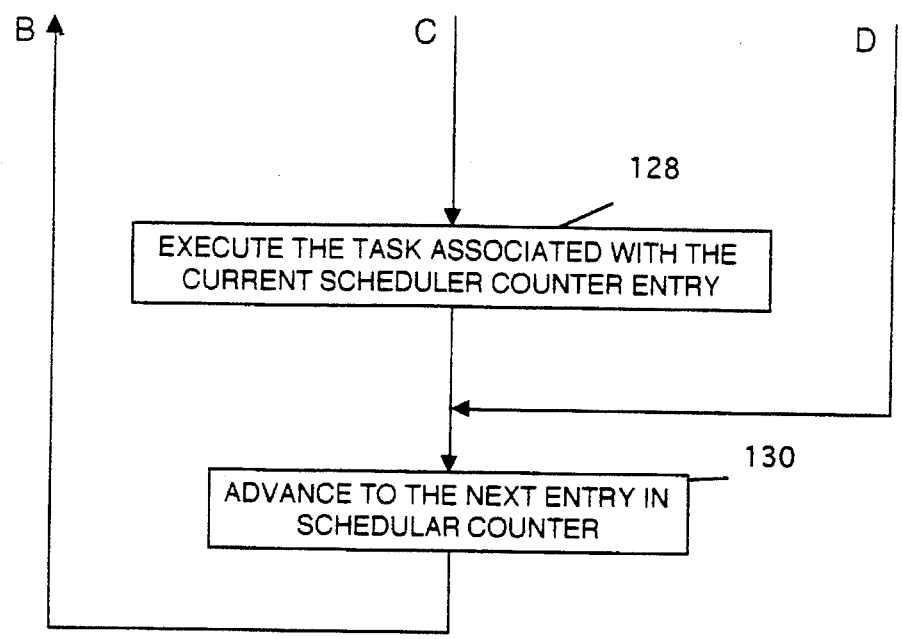

FIGS. 2a–2c are flow-charts of the main program loop for a PMU. When the PMU begins 100 operating, the main program clears RAM 102 and initialize the microcontroller's Input/Output registers 104.

Then, it is determined if "test mode" is active 106. The "test mode" is used by the PMU to support manufacturing tests and initialization. The "test mode" bypasses RAM initialization from EEPROM 108 U1 and switches modem U3 from originate mode to answer mode. If "test mode" is active, RAM is not initialized from EEPROM U1.

After test mode is examined, scheduler counters are initialized 110 from values in a scheduler phase table. Tasks are initialized 112, as discussed below for individual tasks. Current time is then saved 114, and advanced in intervals of 3,333 msec 116. Beginning with the first counter 118 and until completing the last counter 120a, 120b, 130, the main program then sequentially decrements the various scheduler counters 122 and, if a counter has counted the requisite interval 124, resets the counter 126 and performs the tasks associated with the appropriate counter 128. After the tasks are complete, time is advanced by another 3.333 msec 116.

In this way, scheduled events are executed at appropriate intervals. When a zero crossing causes an interrupt, the program branches to set a hardware timer which, in turn, causes another interrupt to occur after a ¼ phase delay for the A/C line voltage. At this time, the microcontroller samples the A/C line voltage and returns to its regular routine. Those individual routines are described more fully below.

Figure 3B:
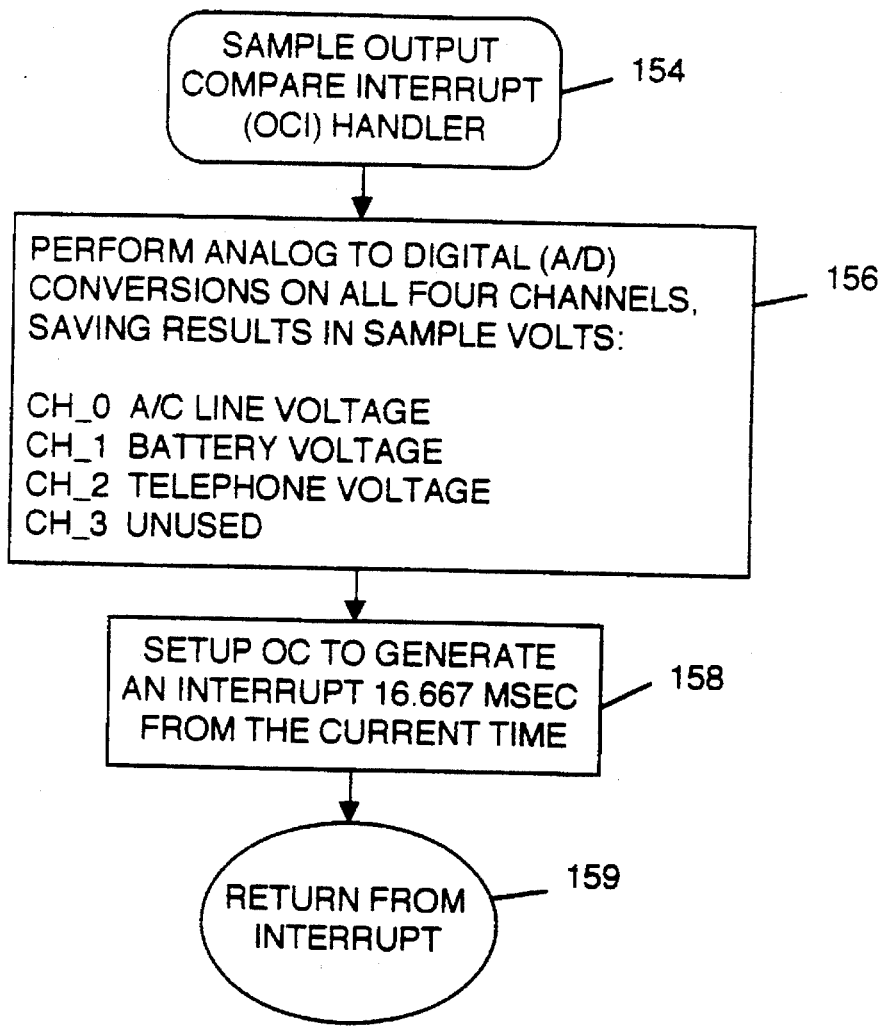

FIGS. 3a–3b are flow-charts of a SAMPLE routine for sampling analog voltages, including A/C line voltage, battery voltage and telephone voltage. The sample is synchronized with the zero-crossing of the AC line voltage with a delay equal to 90 degrees in order to sample the peak line voltage.

When MAIN initializes tasks, SAMPLE is initialized 140 by setting an internal microcontroller timer with a value 142, output compare (OC), so that the timer will generate an interrupt at 16.667 msec from current time. This is the period of the A/c zero-crossing. The OC interrupt is also enabled 144.

Whenever the zero-crossing interrupt occurs, subroutine SAMPLE_IRQ_HANDLER 146 resets the timer 150 to generate an interrupt after 4.167 msec from current time—the time equal to a 90 degree phase shift of AC line voltage. The OC interrupt is enabled 152. (This operation is bypassed if the PMU is communicating with the utility host, e.g. after a failure has already been detected 148).

When the 90 degree delay interrupt occurs, SUBROUTINE SAMPLE_OCI_HANDLER 154 performs the analog-to-digital conversion of the AC line voltage, battery voltage, and telephone voltage 156. When complete, OC is reset 158 to generate an interrupt after 16.667 msec (i.e. at the next peak voltage time). PMU should, however, receive an interrupt from the AC zero-crossing before the 16.667 time period expires. If an interrupt is not received, the timer will expire and the failure will be detected.

If there is no zero-crossing, as when power has failed completely, the sampling proceeds at a 60 hertz rate synchronized with the last detected zero-crossing until the line voltage is restored. When line voltage is restored, microcontroller U2 resynchronizes with the hardware interrupt.

Figure 4:
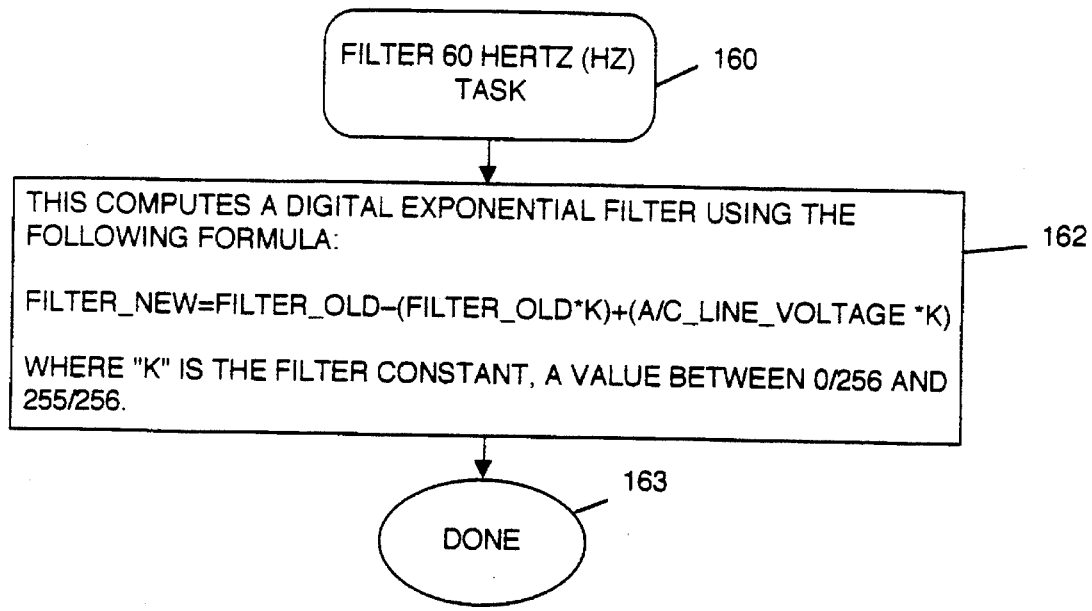
FIG. 4 is a flow-chart of a routine for filtering sampled A/C line voltage.

FIG. 4 is a flow-chart of a routine for filtering sampled A/C line voltage 160. Each cycle, the PMU calculates a filtered voltage value using an exponential filter 162. Filter voltage is determined by the following formula:

$$\text{Filter\_new} = \text{Filter\_old} - (\text{Filter\_old}*K) + (\text{Line}*K)$$

where K is the filter constant, a fixed-point value between 255/256 and 0/256. Filter constant K is field programmable from the utility host.

The PMU monitors both the instantaneous (peak) voltage and the filter voltage to determine whether a report needs to be sent to the utility host. Before a report is sent, the instantaneous voltage and filter voltage must be "unsteady" for a period of time. A voltage is "unsteady" if the difference between instantaneous voltage and filter voltage is outside the tolerance range for a period of time set by the requirements of the utility host.

If the instantaneous voltage transitions from outside a designated trigger window to inside a designated trigger window, or transitions from one trigger window to another trigger window, a report is triggered. The PMU can also detect other AC anomalies by monitoring the filter voltage and determining if it falls into any of four anomaly ranges. The ranges are all field programmable depending on the requirements of the utility host.

Figure 5A:
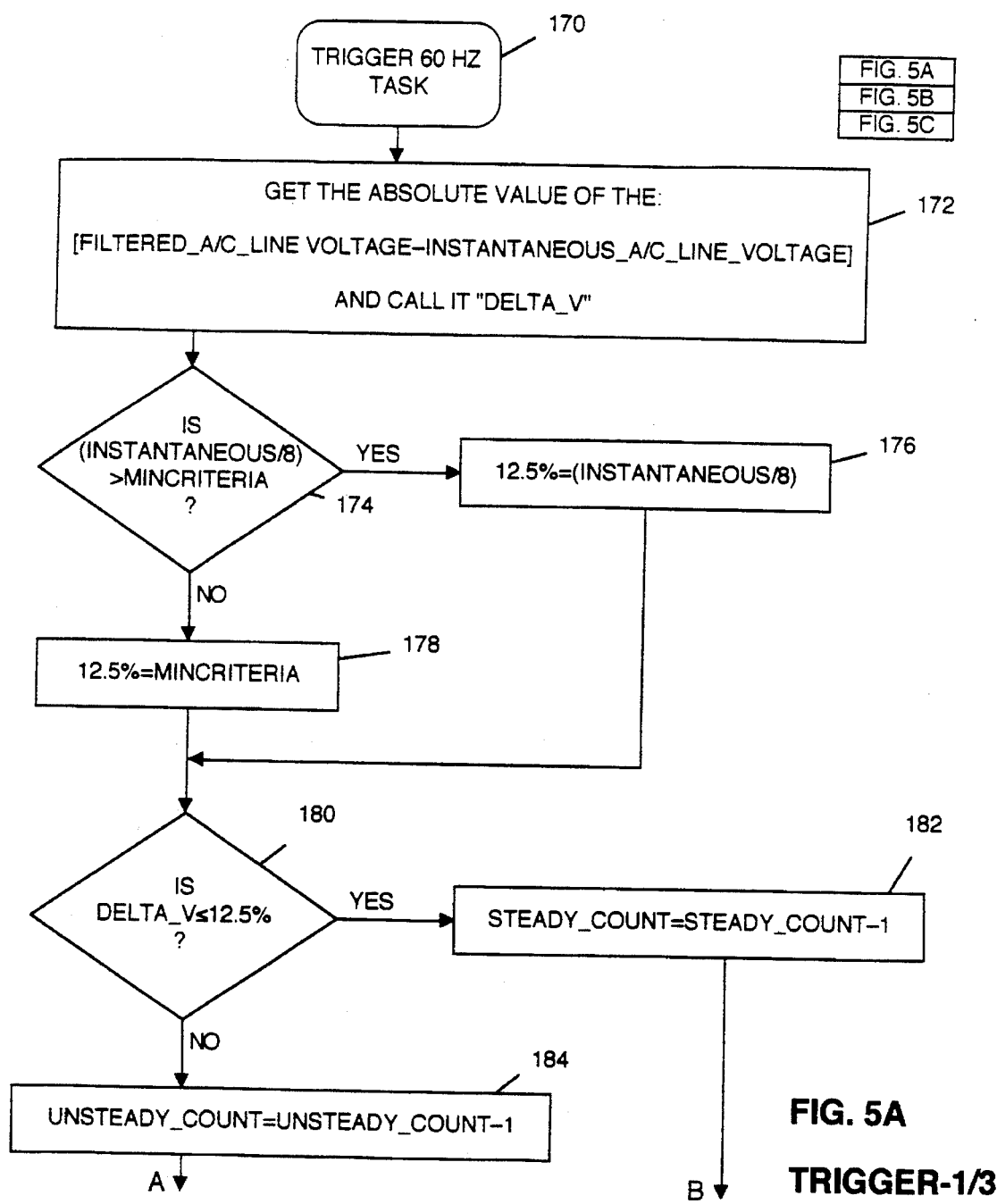
FIGS. 5a–5c are flow-charts of a routine triggering an alarm according to sampled A/C line voltage.
Figure 5B:
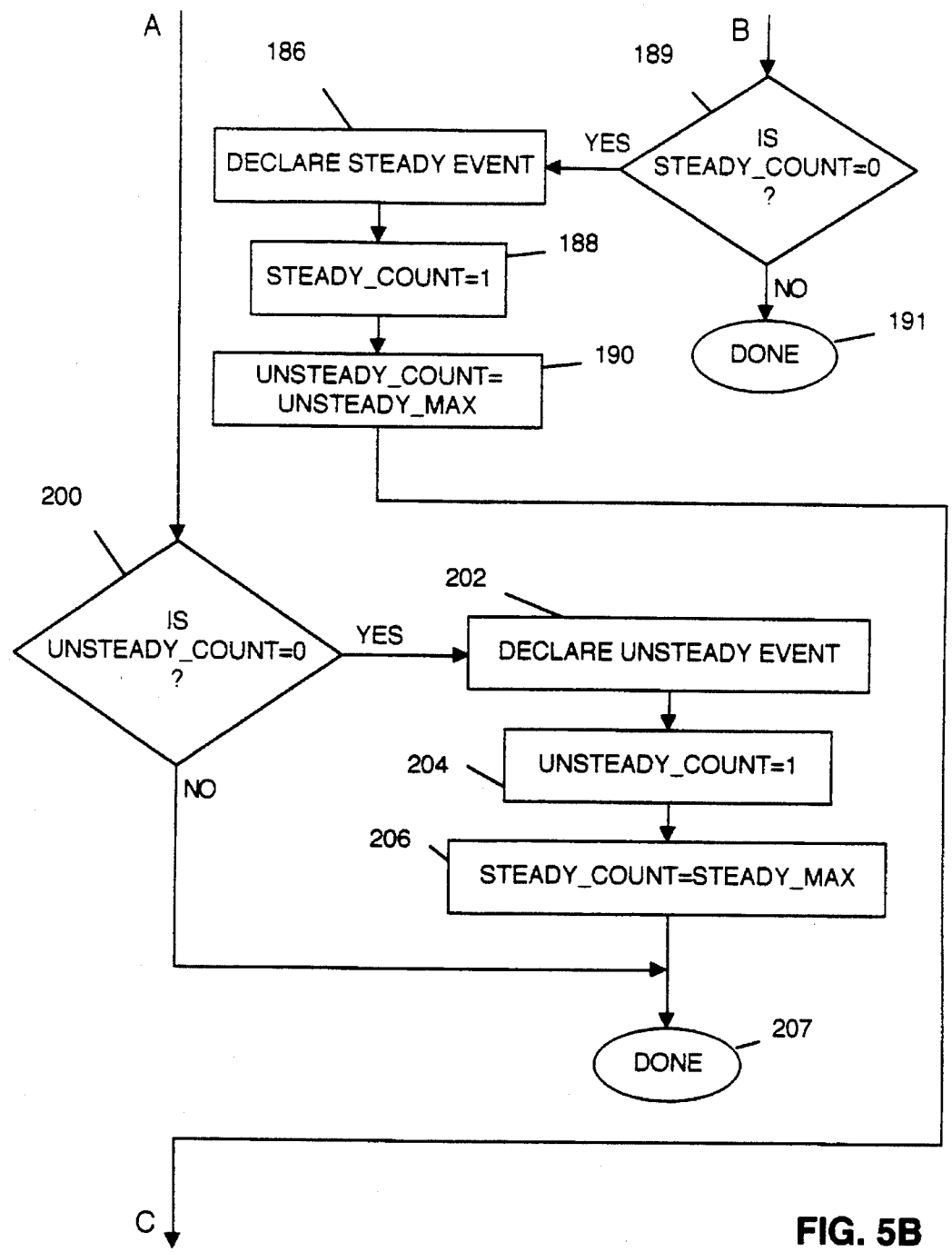
Figure 5C:
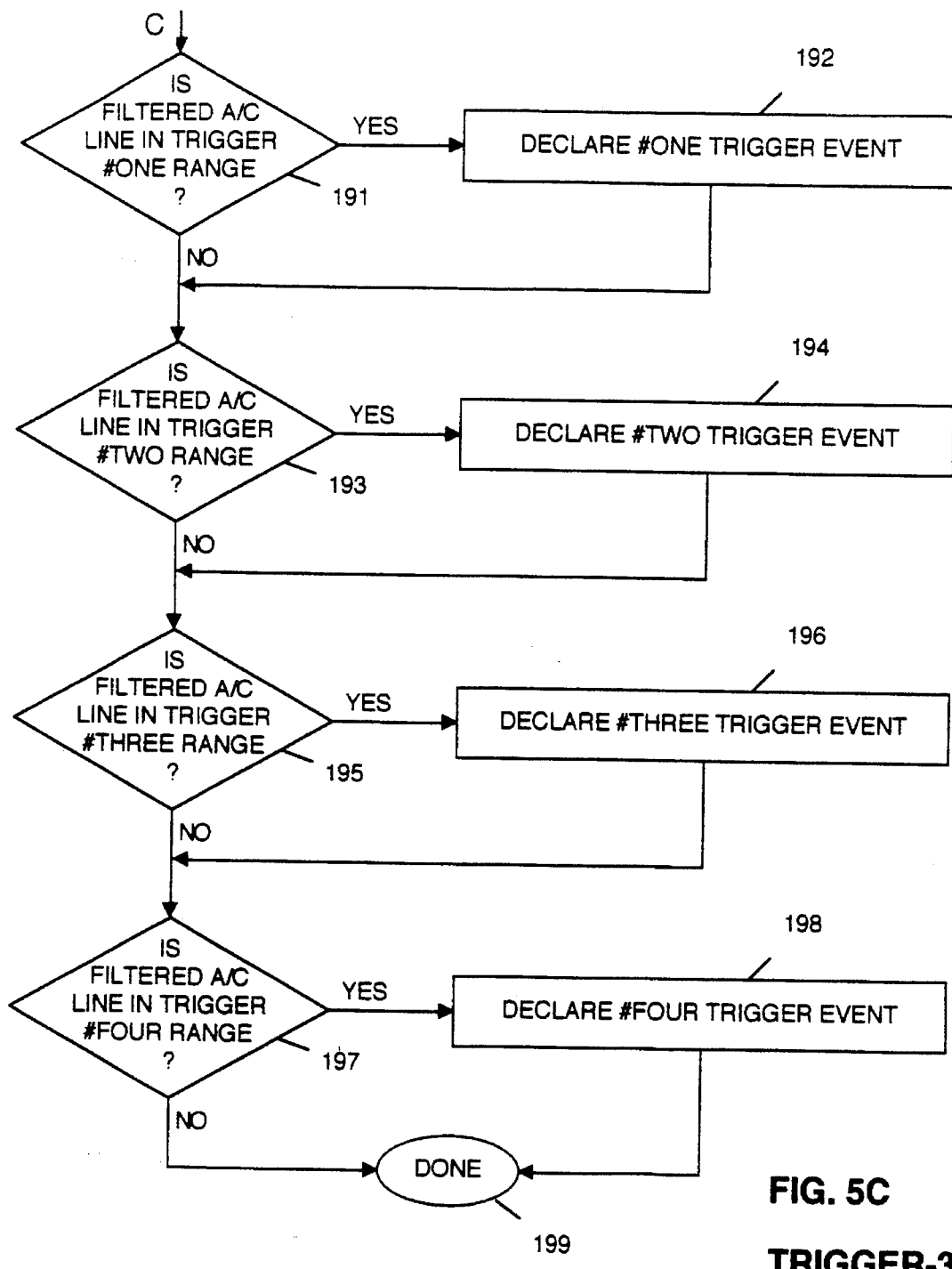
Figure 6A:
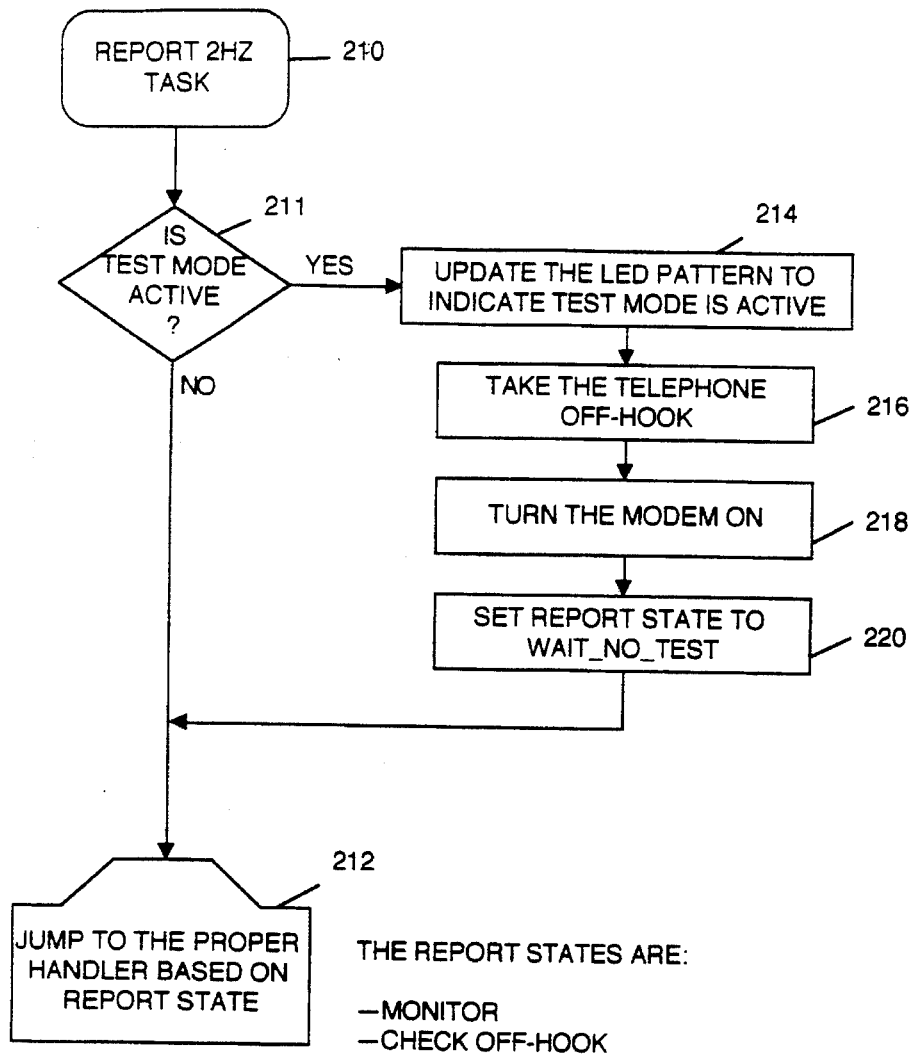
FIGS. 6a–6i are flow-charts of a routine for reporting.
Figure 6B:
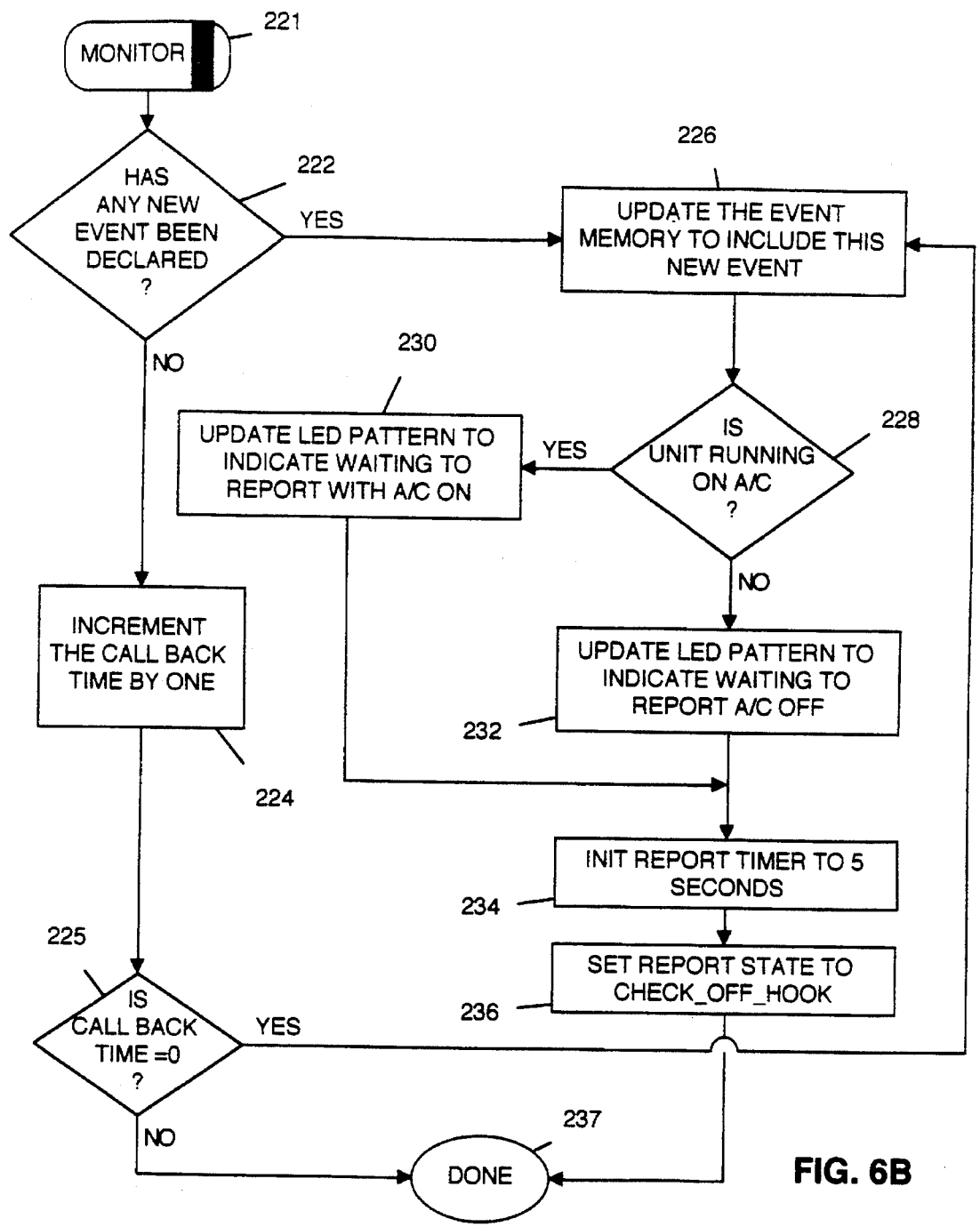
Figure 6C:
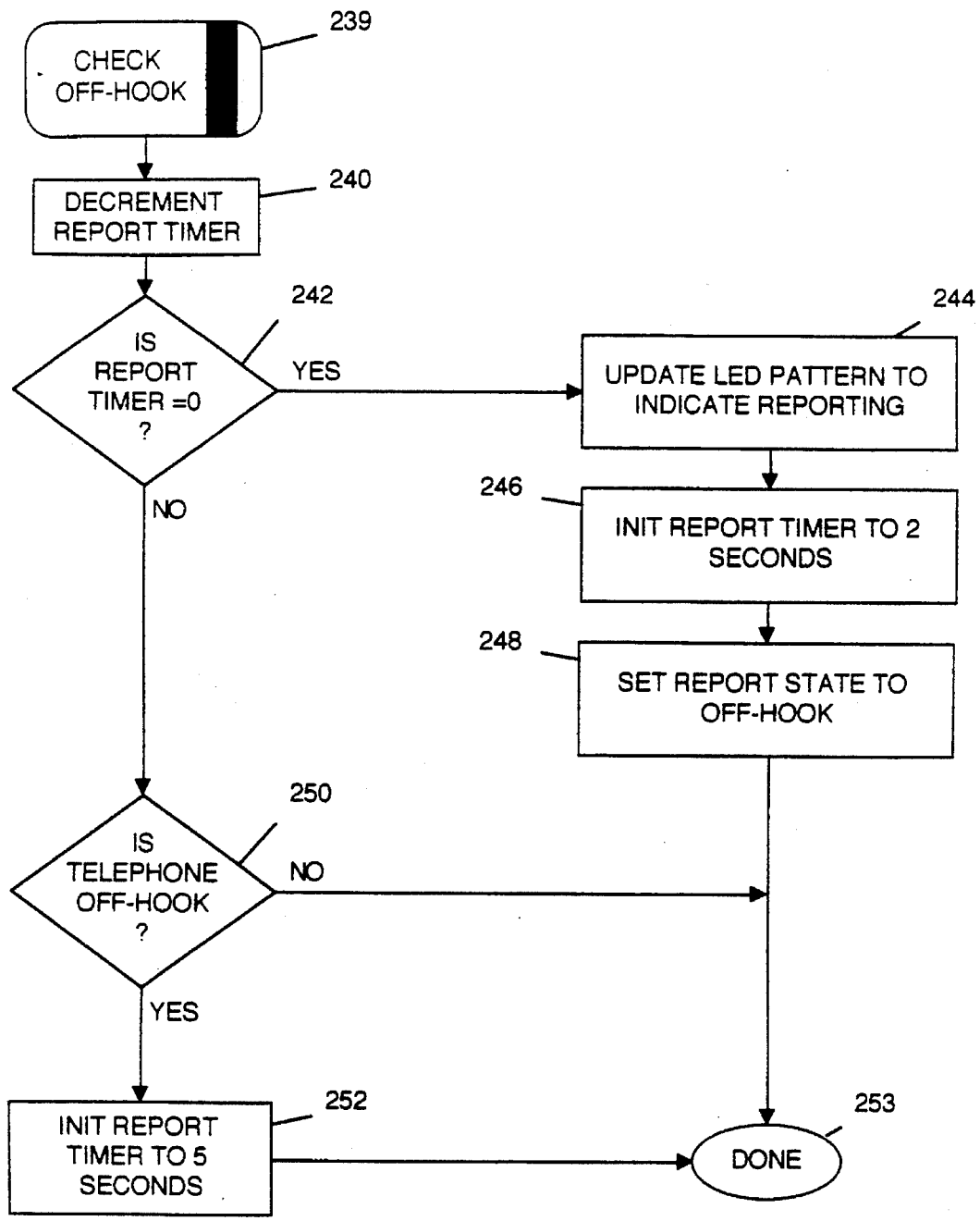
Figure 6D:
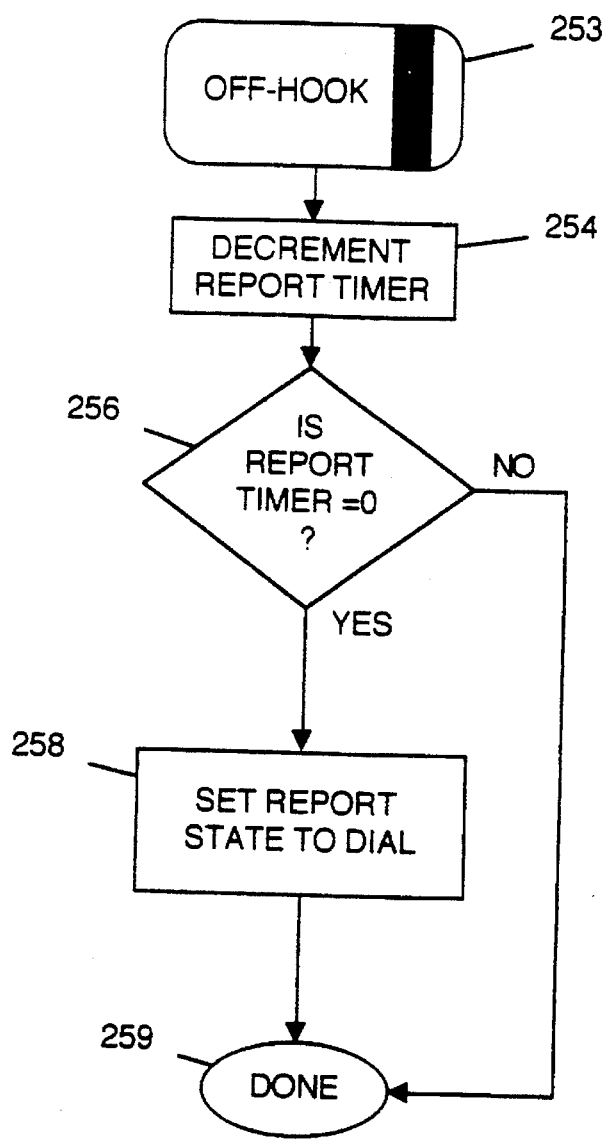
Figure 6E:
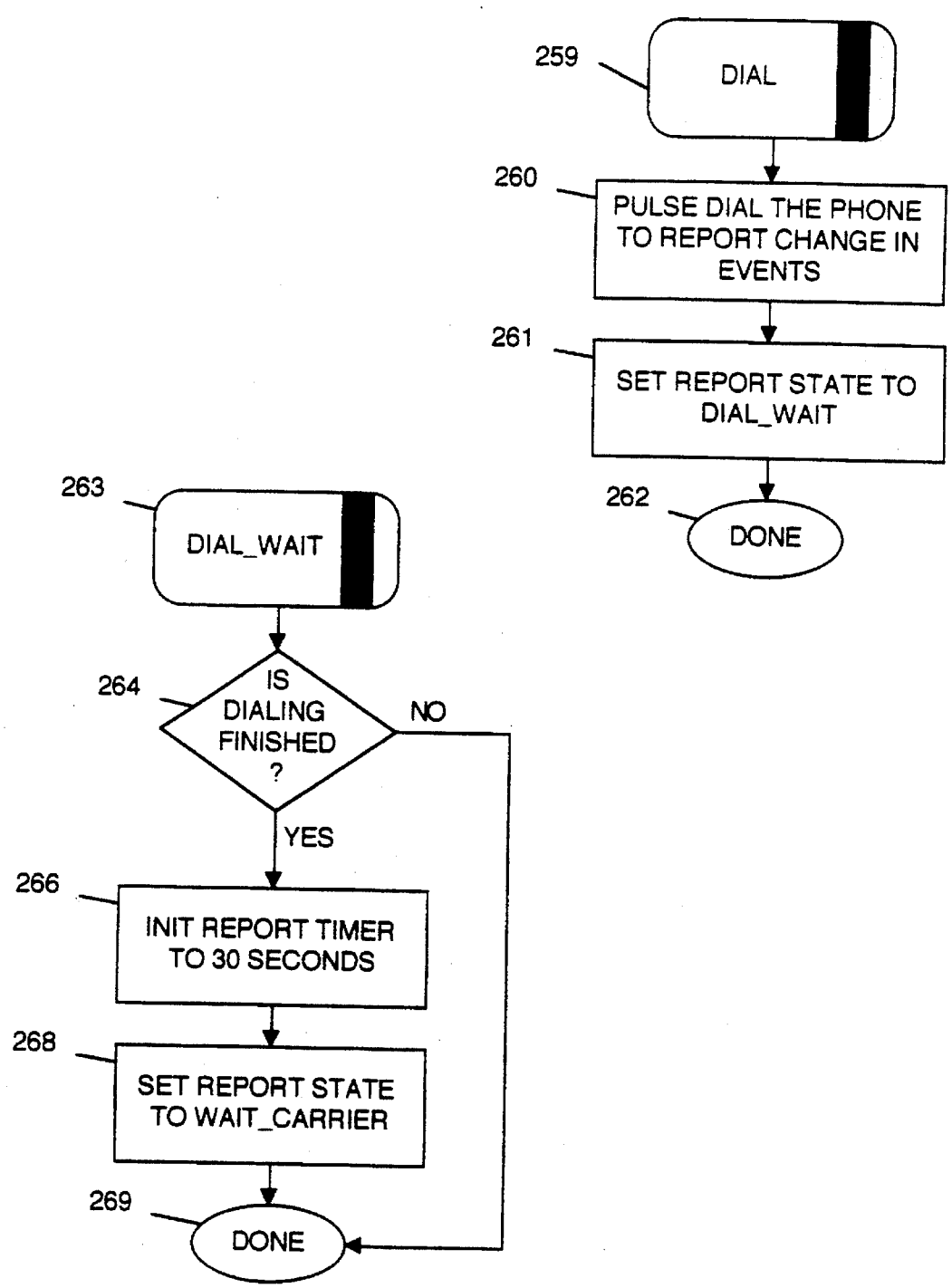
Figure 6F:
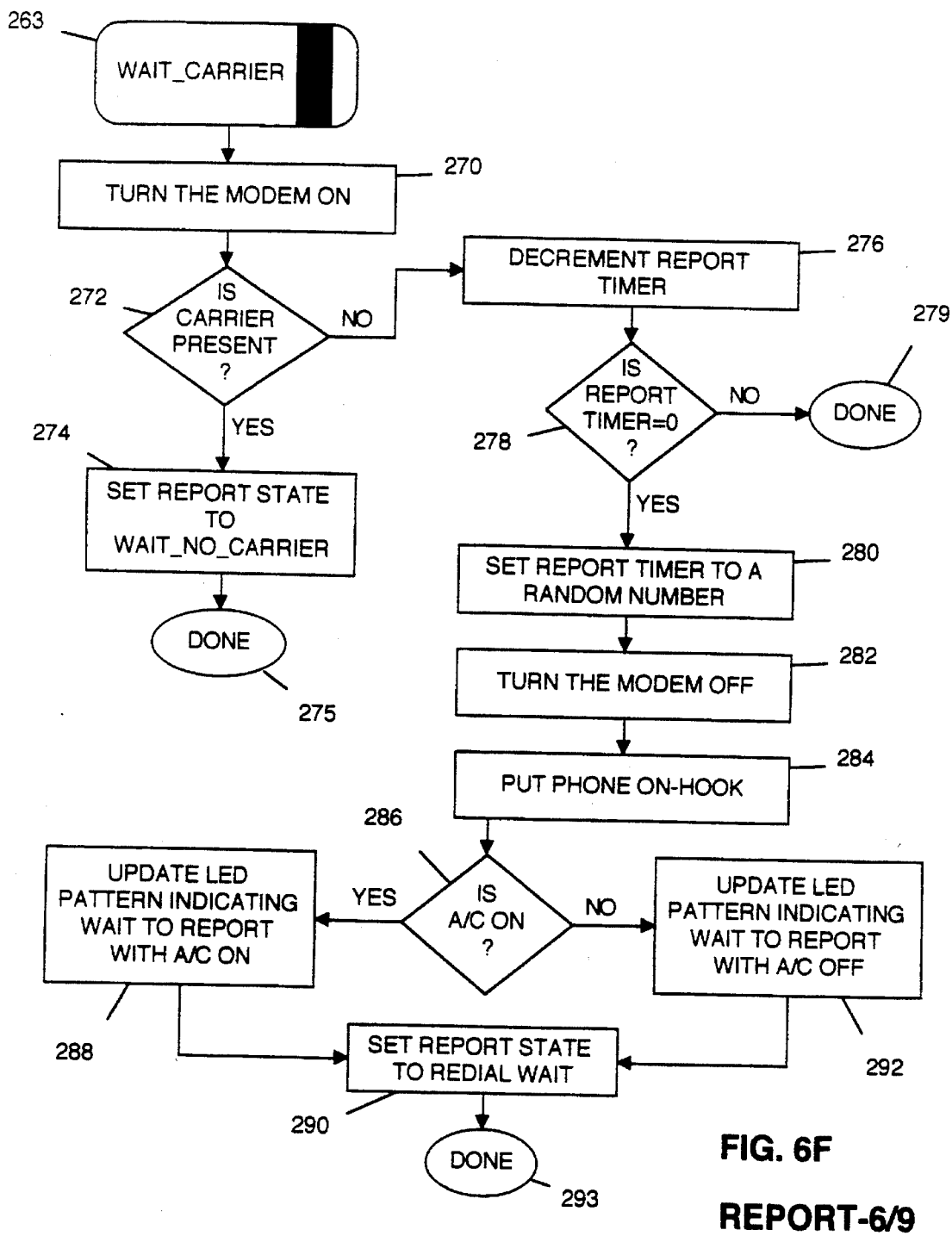
Figure 6G:
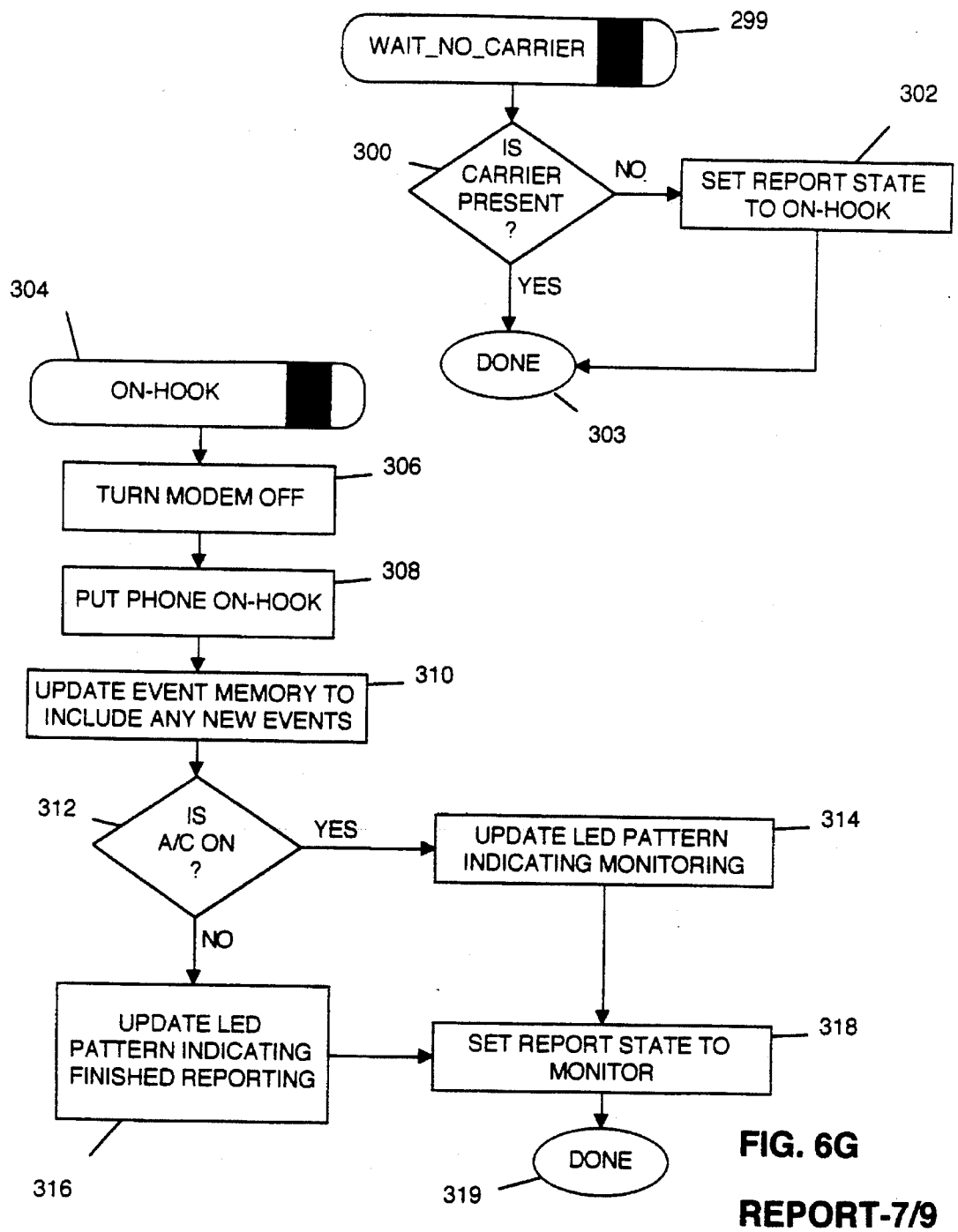
Figure 6H:
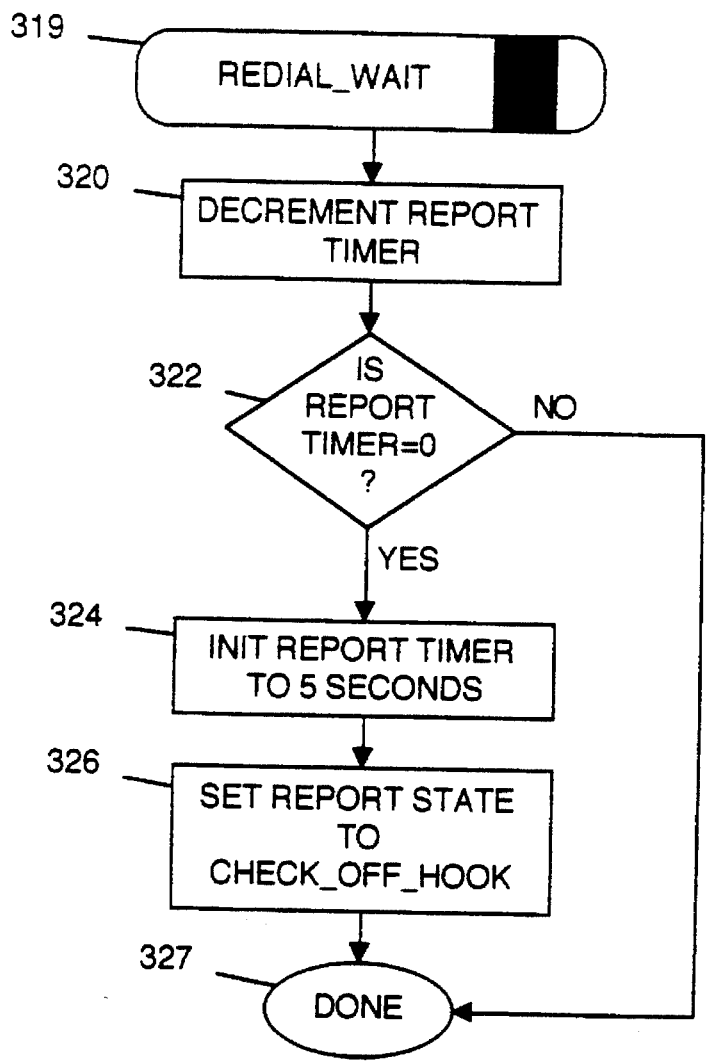
Figure 6I:
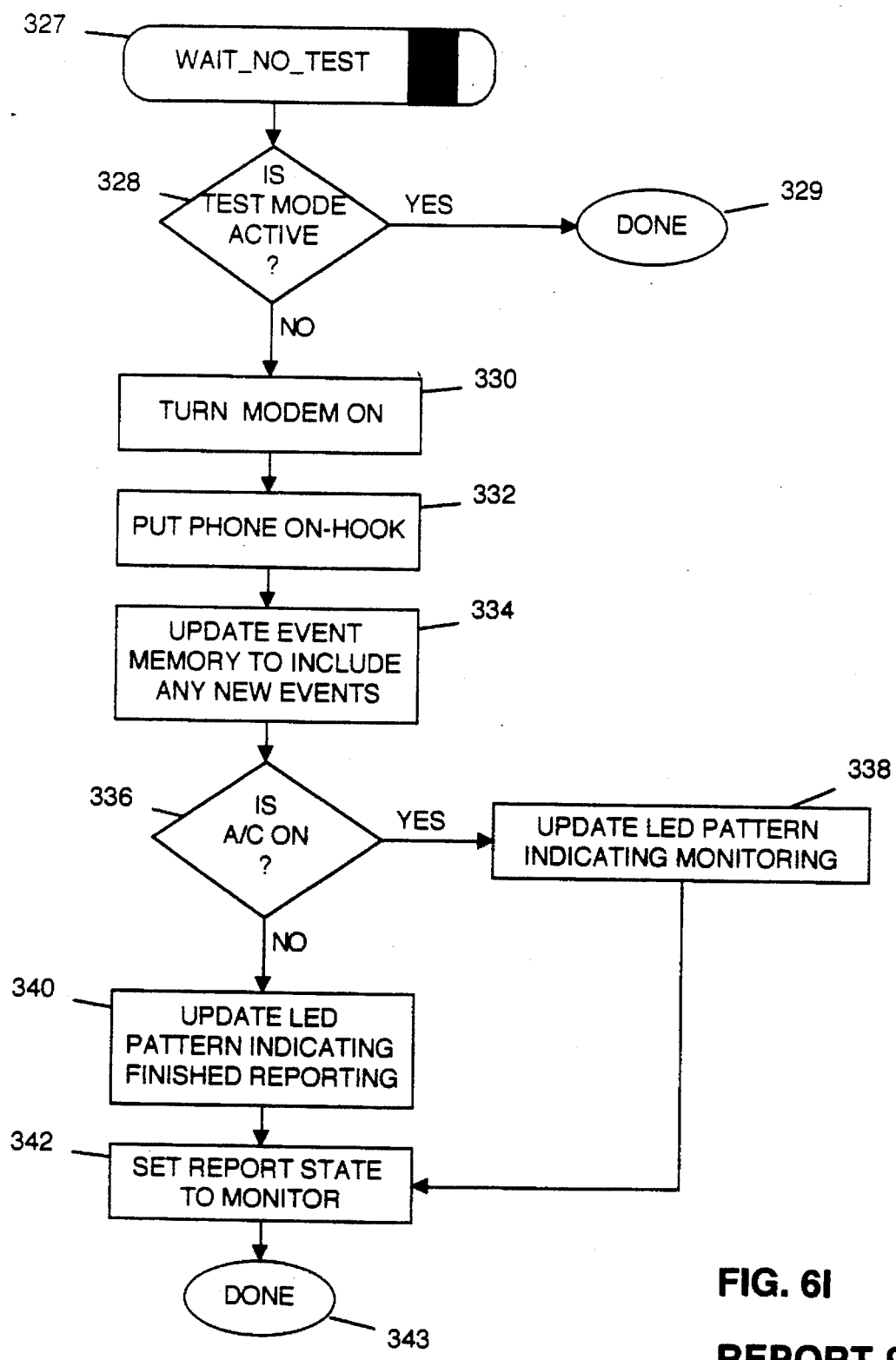
Figure 7A:
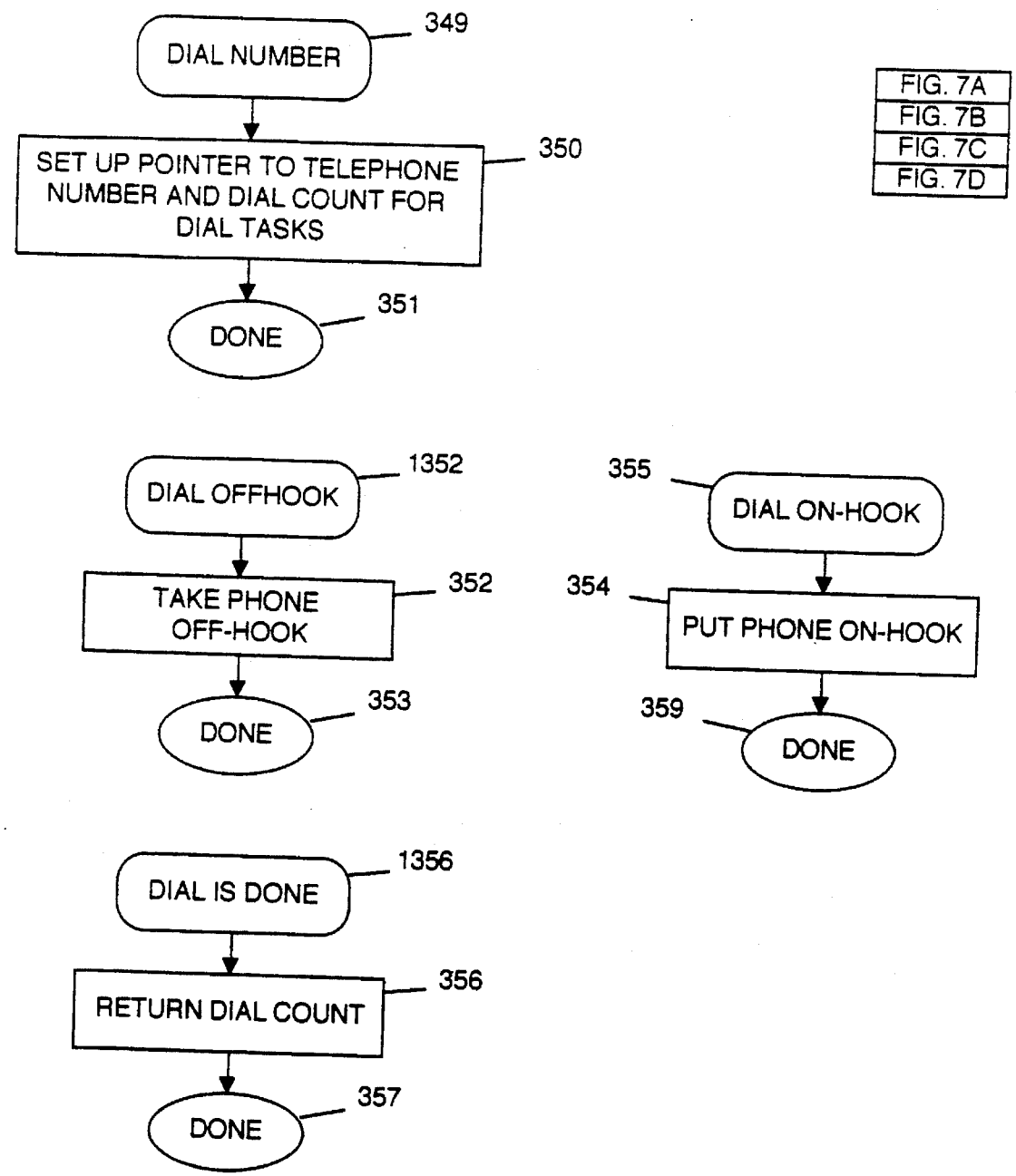
FIGS. 7a–7d are flow-charts of a routine for pulse dialing public switch telephone line.
Figure 7B:
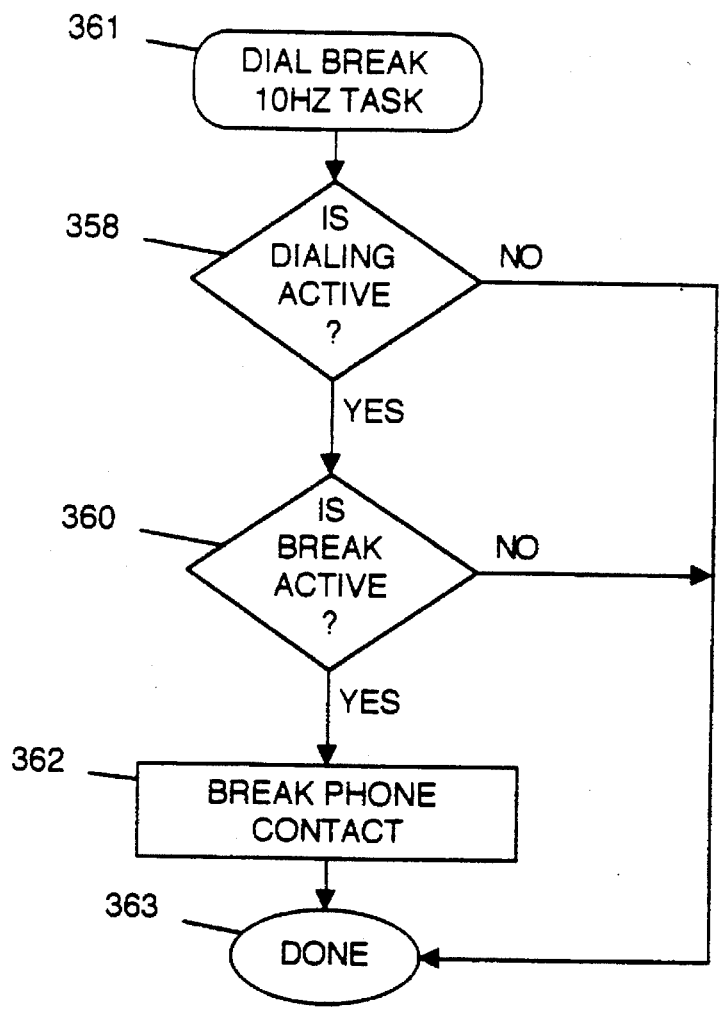
Figure 7C:
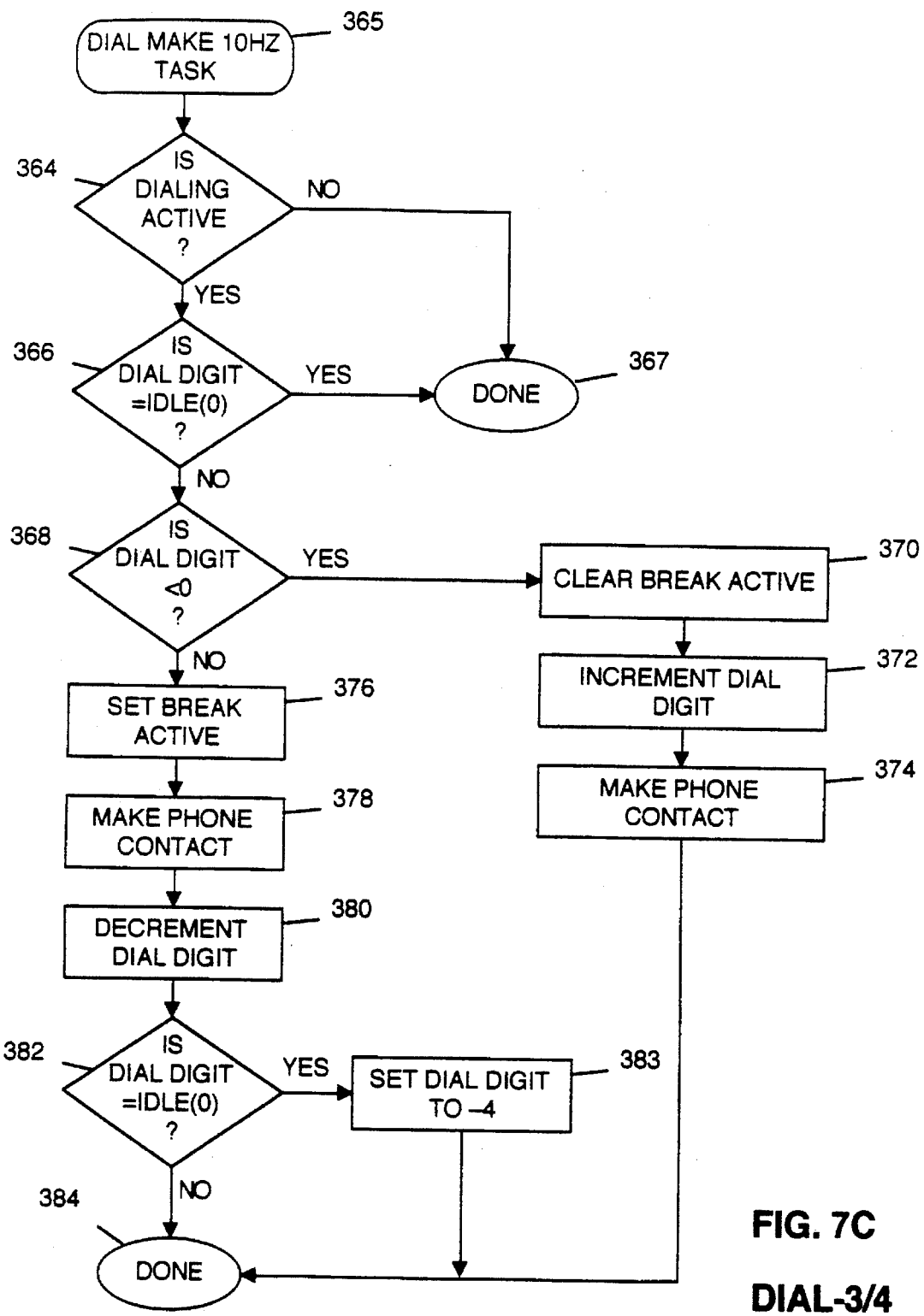
Figure 7D:
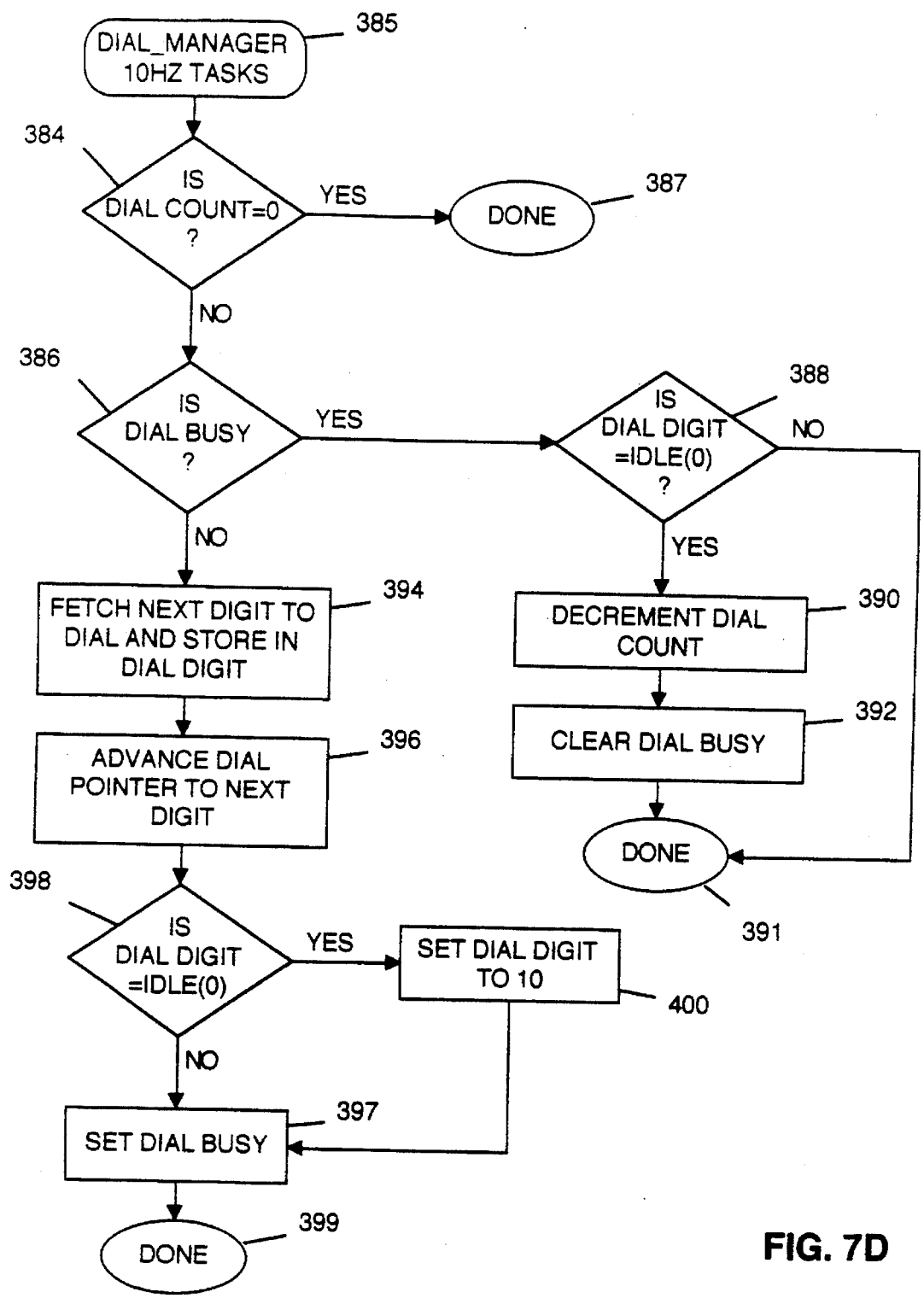

FIGS. 5a–5c are flow-charts of a routine triggering an alarm according to sampled A/C line voltage. Once each 60 Hertz cycle, routine TRIGGER 170 determines if a report needs to be sent to the utility host. Values "min criteria," "steady max," "unsteady max" and "triggers" (1 through 4) are all set by the utility host to certain values to determine whether the voltage is stable, unstable; or certain anomalies exist in AC line voltage respectively.

TRIGGER starts by calculating value Delta-V which is the absolute difference between filtered voltage and instantaneous voltage 172. Instantaneous voltage is divided by 8 and compared to min criteria 174. If instantaneous voltage divided by eight is greater than min criteria, then 12.5% value is set to instantaneous voltage divided by eight in step 176. However if instantaneous voltage divided by eight is less than or equal to min criteria 12.5% value is set to min criteria in step 178.

Delta-V is then compared to 12.5% value 180. If Delta-V is less than or equal to 12.5% value, steady count is decreased by one 182. When steady count is zero, a steady event is declared 186 (steady count is set to one 188 and unsteady count is set to unsteady count max 190). If steady count is equal to zero 189, TRIGGER is complete.

After a steady event is declared, TRIGGER compares the filtered voltage to trigger ranges one through four in decision blocks 191, 193, 195, 197. If the filter voltage is within any of these ranges, trigger event one, two, three or four is declared in respective steps 192, 194, 196, 198.

If Delta-V is greater than 12.5% value in step 180, unsteady count is decreased by one 184. When unsteady count is equal to zero in decision block 200, an unsteady event is declared 202, unsteady count is set to one 204 and steady count is set to steady count max 206.

The PMU will report to the host computer when the measured voltage triggers a reporting condition. The PMU keeps track of "base anomalies" (ones already reported) and generates a new report when current anomalies differ from the base ones. The PMU will also generate a routine report periodically, even if no anomalous condition has been detected. A report callback timer can be set so that PMU can report back to the utility host at a given time. When the PMU reports back to the utility host, it can send the log of instantaneous voltages, send a contemporaneous voltage measurement, receive parameter changes, etc.

In general, both types of reports follow the same procedure. Microcontroller U2 monitors the telephone line to determine if the telephone line is in use. If it is in use, the reporting action will wait until the telephone line is not in use. Once the telephone line is available, the phone will be dialed by the pulse dialer. The phone number is supplied by EEPROM. (While the PMU has control of the line, other devices on the line may not then place calls.)

After the phone is dialed the PMU will wait for the utility host to answer. If the host does not answer, the reporting action will wait a random amount of time and try again. The random time is chosen so that there will not be repeated collisions of the PMUs calling when a common power problem occurs. The random time may be a function of the last several digits of the unit's serial number.

Once carrier detect appears, the modem sends and receives all necessary data between PMU and the utility host. When the utility host has completed its routine, carrier detect will fall, and microcontroller U2 will turn off the modem and reinstate the phone line to on-hook.

FIGS. 6a–6i are flow-charts of a routine for reporting. Routine REPORT runs at a 2 Hertz rate 210. If test mode is active 211, the PMU updates it LED pattern 214, takes the telephone off hook 216, turns the modem on 218, and sets a REPORT STATE flag to WAIT_NO_TEST 220.

If test mode is not active, routine REPORT jumps to the correct handler based on the REPORT STATE 212. The report states are: monitor, check off-hook, off-hook, dial, dial_wait, wait_carrier, wait_no_carrier, on-hook, redial_wait, and wait_no_test. The PMU advances through each state generally as discussed above.

Report state MONITOR (FIG. 6B) determines if a new event has been declared 222. If no new event has been declared, the call-back time is incremented by one 224. Call-back time is a negative number set by the utility host. When call-back time is equal to zero 225, a new event is declared as the utility host expects the unit to call back and report at a given time. If an event is declared for call-back or any other reason, the event memory is updated to include this event 226. The monitor routine then checks to determine if AC line voltage is running 228. If AC line voltage is on, the LED pattern indicates that a report is waiting to be sent with AC on 230. If AC line voltage is off, the LED pattern indicates that a report is waiting to be sent with AC off 232. The "init_report_timer" is set to 5 seconds 234, and REPORT STATE is set to check_off_hook 236. Subroutine CHECK OFF-HOOK (FIG. 6c) starts by decreasing a report timer 240. If the report timer is zero 242, LED pattern is updated to indicated the PMU is reporting 244, init-report-timer is set to 2 seconds 246, and REPORT STATE is set to off-hook 248. If report-timer is not zero after report-timer has be decreased, the telephone is checked to see if it is off-hook 250. If it is not off-hook, subroutine CHECK_OFF_HOOK is complete. If telephone is off-hook, the init-report-timer is set to 5 seconds 252 and then the subroutine is complete.

Subroutine OFFHOOK (FIG. 6d) begins by decreasing report-timer 254. If report-timer is not zero 256, subroutine OFFHOOK is complete. If report-timer is zero, report-state is set to dial 258 and then the subroutine is complete.

Subroutine DIAL_PULSE (FIG. 6e) dials the phone 260 so that the change in events can be reported, and the REPORT STATE is set to dial_wait 262 (see below).

Subroutine DIAL_WAIT checks to see if dialing is finished 264. If dialing is finished, the subroutine is complete. Otherwise, init-report-timer is set to 30 seconds 266, and the REPORT STATE is set to wait carrier 268.

Subroutine WAIT_CARRIER (FIG. 6f) starts by turning the modem on 270. Then the subroutine checks to see if carrier is present 272. If carrier is present, REPORT STATE is set to wait_no_carrier 274. If carrier is not present, report-timer is decreased 276. If report-timer is not zero 278, WAIT_CARRIER is done. On the other hand, if report-timer is zero, report-timer is set to a random number 280 between one hundred twenty and two hundred fifty six so that the PMU will try again later to get carrier detect. The modem is turned off 282, and the phone is put on-hook 284.

After the phone is on-hook, AC line voltage is checked again 286. If AC line voltage is on, LED pattern is updated 288 to indicate that PMU is waiting to report with AC on. If AC is off, LED pattern indicates the PMU is waiting to report with AC off 292. After LED status changes, the REPORT STATE is set to redial_wait and wait_carrier is complete.

Subroutine WAIT_NO_CARRIER (FIG. 6g) also begins by checking to see if carrier is present 300. If no carrier is detected, set-report flag is set to on-hook 302, and the subroutine is complete. If carrier is present, the subroutine does nothing else.

Subroutine ON-HOOK begins by turning the modem off 306, putting the phone on-hook 308, and updating the event memory 310 to include any new events. Then AC line voltage is checked 312. If AC is on, LED pattern is updated to indicate that PMU is monitoring 314. If AC is off, LED pattern is updated to indicate that PMU has finished reporting 316. After the LED has been updated, REPORT STATE is set back to monitor 318.

Subroutine REDIAL_WAIT (FIG. 6h) starts by decreasing report-timer 320. If report-timer is not zero 322, the subroutine is complete. If report-timer is zero, report-timer is set to five seconds 324 and the REPORT STATE is set to check_off_hook 326.

Subroutine WAIT_NO_TEST begins by checking the test mode 328. If test mode is active, the subroutine is complete. When test mode is not active, the modem is turned off 330, the phone is put on-hook 332, and the event memory is updated to include any new events 334. After the event memory is updated, AC line voltage is checked 336. If AC is on, LED pattern is updated to indicate that PMU is monitoring line voltage 338. If AC is off, LED pattern is updated to indicate the PMU has finished reporting 340. After LED pattern is updated, REPORT STATE is set back to monitor 342.

The PMU makes telephone calls by pulse dialing. The phone number is stored in the EEPROM. For each digit, an equivalent number of pulses are sent. Once connection is made to the utility host, the PMU turns on the Bell 103 Modem.

FIGS. 7a–7d are flow-charts of a routine for pulse dialing a public switch telephone line. Routine DIAL NUMBER (FIG. 7a) sends the telephone number to mechanical relay in order to pulse dial the utility host. DIAL NUMBER begins by setting the EEPROM pointer to the memory locations of the telephone number and the dial counter 350. Subroutines DIAL_OFF_HOOK and DIAL_ON_HOOK take the phone off-hook 352 and put the phone on-hook 354 respectively. The first 60% of a pulse must be off (i.e. contact open or break), and the next 40% is on (i.e. contact closed or made). Subroutine DIAL IS DONE returns a dial count 356.

Subroutine DIAL_BREAK (FIG. 7b) is a 10 Hertz task that opens the contact for 60% of the pulse time. Subroutine DIAL MAKE (FIG. 7b–7c) is another 10 Hertz subroutine that makes the contact for 40% of the pulse time. Subroutines DIAL_BREAK and DIAL_MAKE pulse the mechanical relay the number of times for the digit being dialed by counting down for the number in the digit. When the digit is completed, the dial counter is set to negative 4 so that a period of time is generated between digits. Subroutine DIAL MAKE (FIG. 7b–7c) is another 10 Hertz subroutine that makes the contact for 40% of the pulse time.

The subroutine DIAL BREAK checks whether dialing is active 358 and whether break is active 360. If both are true, the phone contact is broken 362. Otherwise, the subroutine ends.

The subroutine DIAL MAKE first checks whether dialing is active 364, and then checks whether the dial digit is idle (zero) 366. If dialing is not active, or if dial digit is idle, the subroutine ends. If dial digit is active and dial digit is not idle, the dial digit is checked 378. If the dial digit is less than zero, a break-active flag is cleared 370, dial digit is incremented 372, and the phone contact is made 374. Otherwise, a break-active flag is set 376, the phone contact is made 378, and the dial digit is decremented 380. Then, dial digit is compared to idle (zero) 382. If idle, dial digit is set to minus four before the subroutine ends 383.

Subroutine DIAL_MANAGER (FIG. 7d) is a 10 Hertz routine that sets the dial digit to be dialed by DIAL_BREAK and DIAL_MAKE. Each digit produces that number of pulses for which dial manager has set. When the period of time has expired between digits, DIAL_MANAGER accesses the next number to be dialed.

The DIAL_MANAGER subroutine begins by checking the dial count. If dial count is zero, the subroutine ends, otherwise, the subroutine checks whether dial is busy 386. If dial is busy, the subroutine checks whether the dial digit is idle (zero) 388. If not idle, the subroutine ends. If idle, the dial count is decremented and the dial busy flag is cleared 392 before the subroutine ends.

If, however, dial is not busy 386, then the subroutine fetches the next digit to dial 394 and advances the dial pointer to the next digit 396. Then, the subroutine checks the dial digit. If not zero, the subroutine sets the dial busy flag; otherwise, the subroutine sets the dial digit to ten 400 before setting the dial busy flag to busy 397.

Once a phone link has been established with a host computer, the PMU exchanges information as eight-bit bytes preceded with a start character and followed by a stop character. The link is serial, and the PMU performs the serial-to-parallel conversion in software (similar to the hardware function of a UART—Universal Asynchronous Receiver/Transmitter)

Figure 8A:
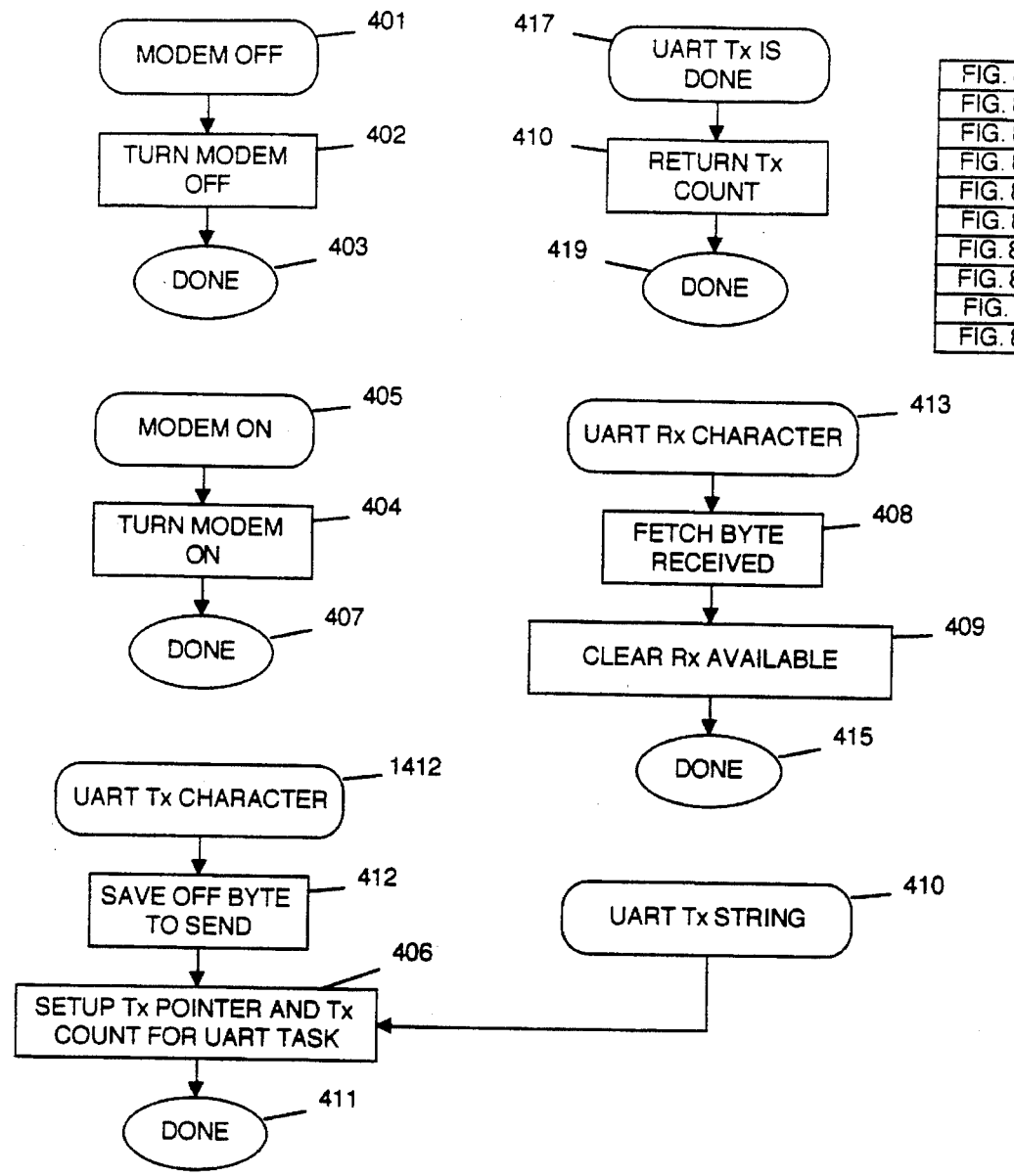
FIGS. 8a–8j are flow-charts of a routine directing a modem communication link with a host computer; computer.

FIGS. 8a-8j are flow-charts of a routine directing a modem communication link with a host computer. FIG. 8a shows call routines for the following functions: turning the modem on 404, turning the modem off 402, setting up an address and character count for a transmission 406, receiving a character 408 and clearing a Rx available flag 409, transmitting a character 412 and completion f character transmission 410.

Figure 8B:
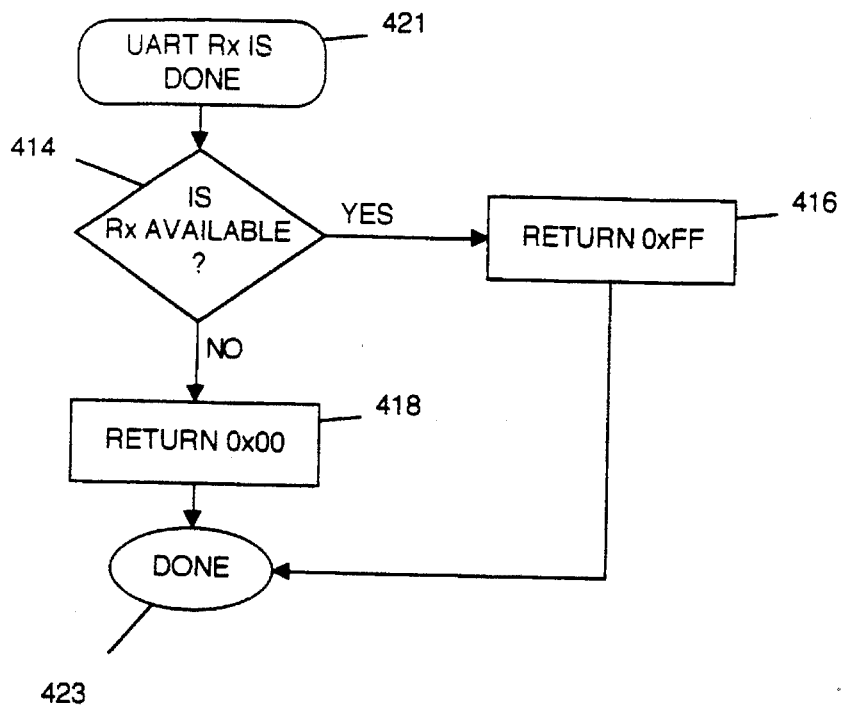
Figure 8B:
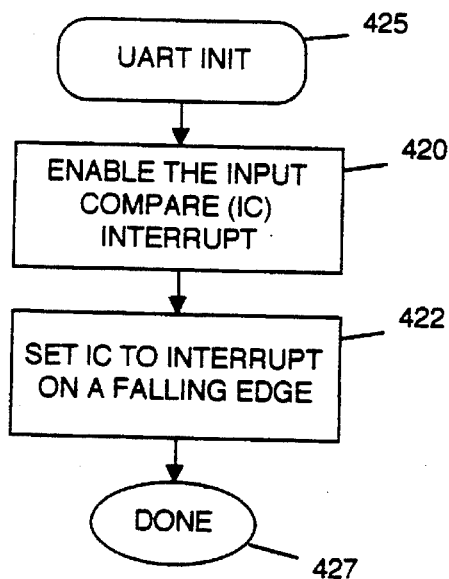

FIG. 8b shows call routines for initialization and completion of a character reception. Completion of character reception involves a check of whether a receive character is available. If so, the subroutine returns a first hex address 416, if not the subroutine returns a second hex address 418. Initialization involves enabling an input compare interrupt 420 to interrupt on a falling edge 422.

Figure 8C:
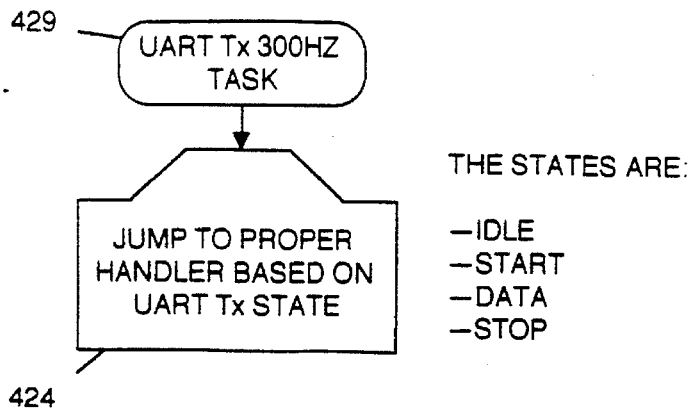
Figure 8C:
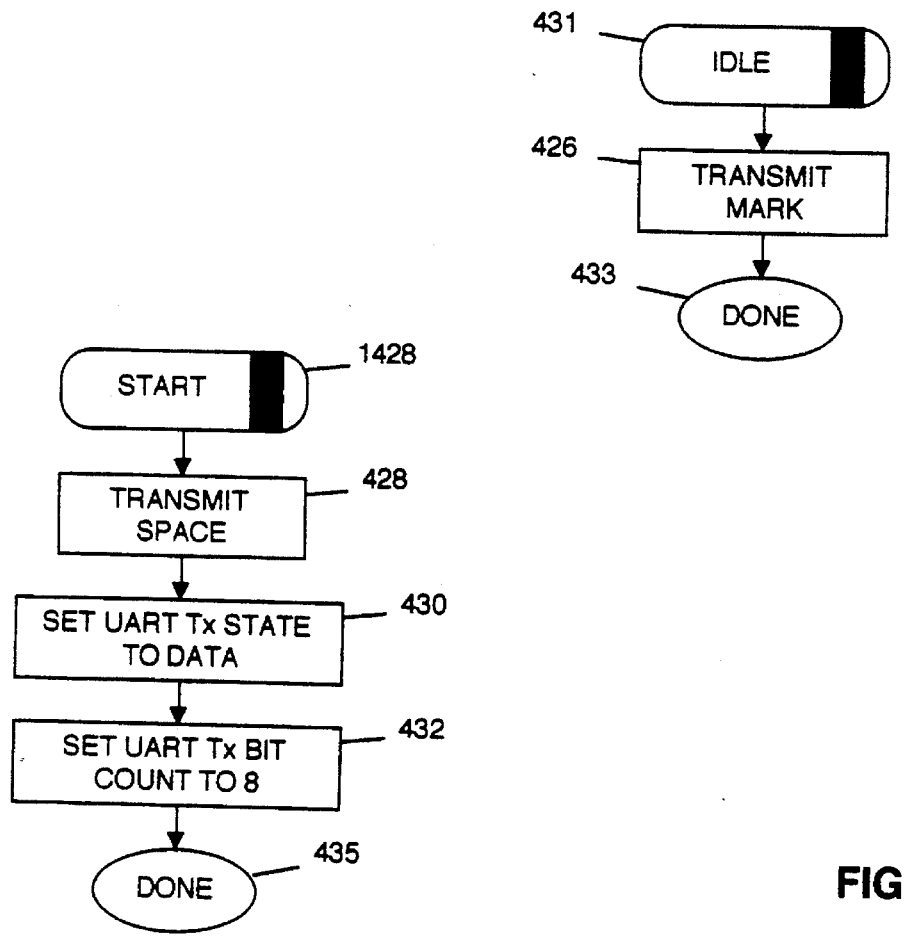

Subroutine UART_TX (FIG. 8c) transmits a character by proceeding through three states: sending a start bit ("Start"), sending data ("Data"), and sending a stop bit ("Stop"). When not transmitting, the UART function is in an idle state ("Idle"). As shown in FIG. 8c, the PMU microcontroller services the UART function 300 times per second and advances a subroutine for the appropriate state each service interval 424. The IDLE subroutine transmits a mark 426. The START subroutine transmits a space (start bit) 428, sets a counter to eight 432 (eight bits to be transmitted) and advances to the "Data" state 430.

Figure 8D:
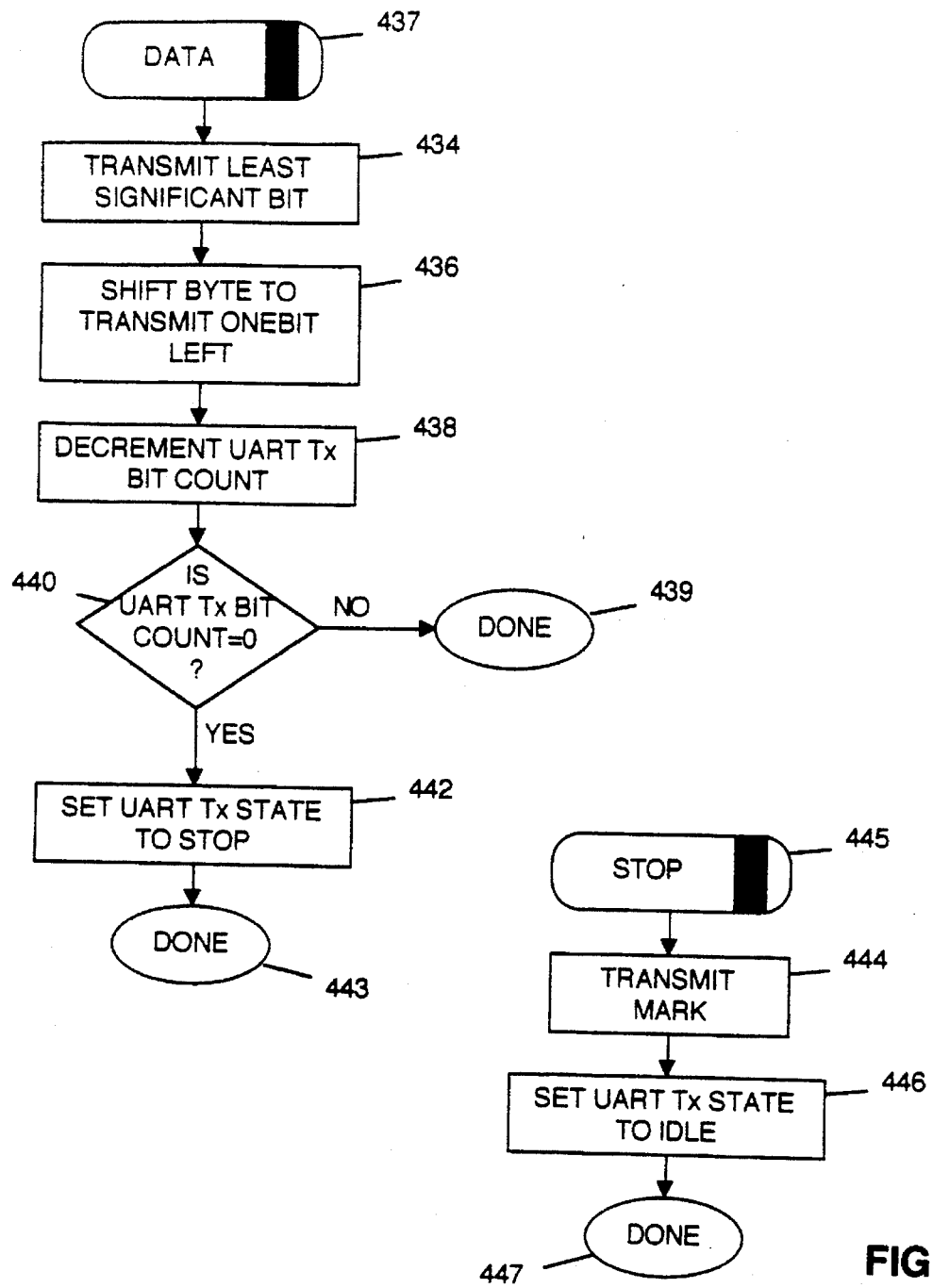

As shown in FIG. 8d, the DATA subroutine sequentially transmits bits, beginning with the least significant bit 434, shifting to the left 436, and decrementing the counter each time 438. When the count reaches zero 440. The UART advances to the "Stop" state 442 after the eighth bit has been sent. The "STOP" subroutine transmits a mark (stop bit) 444 and advances the UART to the "Idle" state 446.

Figure 8E:
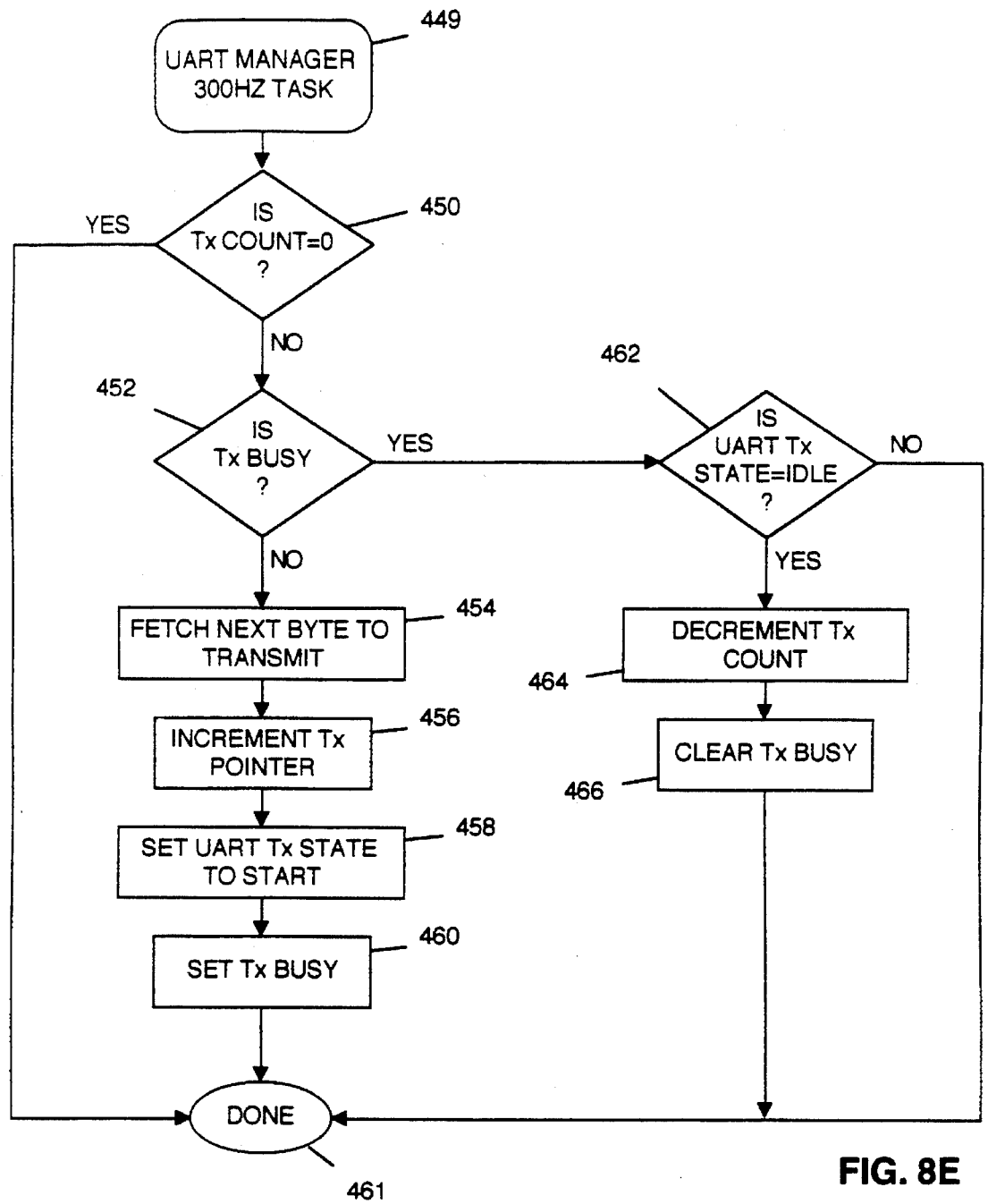

Subroutine UART_MANAGER sends multi-character messages as shown in FIG. 8e. UART_MANAGER is a 300 hz task which repeatedly calls UART_TX and decrements a count (Tx_Count) until all characters have been sent. The subroutine checks whether Tx_Count has decremented to zero 450 and the loop ends when Tx_Count reaches zero. While the count is not zero, the subroutine checks whether the Tx busy flag is set 450. When not busy, the subroutine fetches the next byte for transmission 454, increments the Tx pointer 456, sets the UART to the START state 458 and sets the TX busy flag 460. When busy, the subroutine checks whether the UART state is IDLE. If idle, the subroutine decrements the Tx count 464 and clears the Tx busy flag 466; otherwise, the subroutine is done. Once UART_TX begins cycling through its Start, Data, and Stop states, UART_MANAGER takes no action until an entire character has been sent.

Data reception proceeds through a series of states (Start, Data and Done) triggered by a hardware interrupt. The microcontroller has an "input capture" (IC) function which selectively monitors the receive data line from the modem for either a rising edge or a falling edge and generates an interrupt when the selected transition occurs.

Figure 8F:
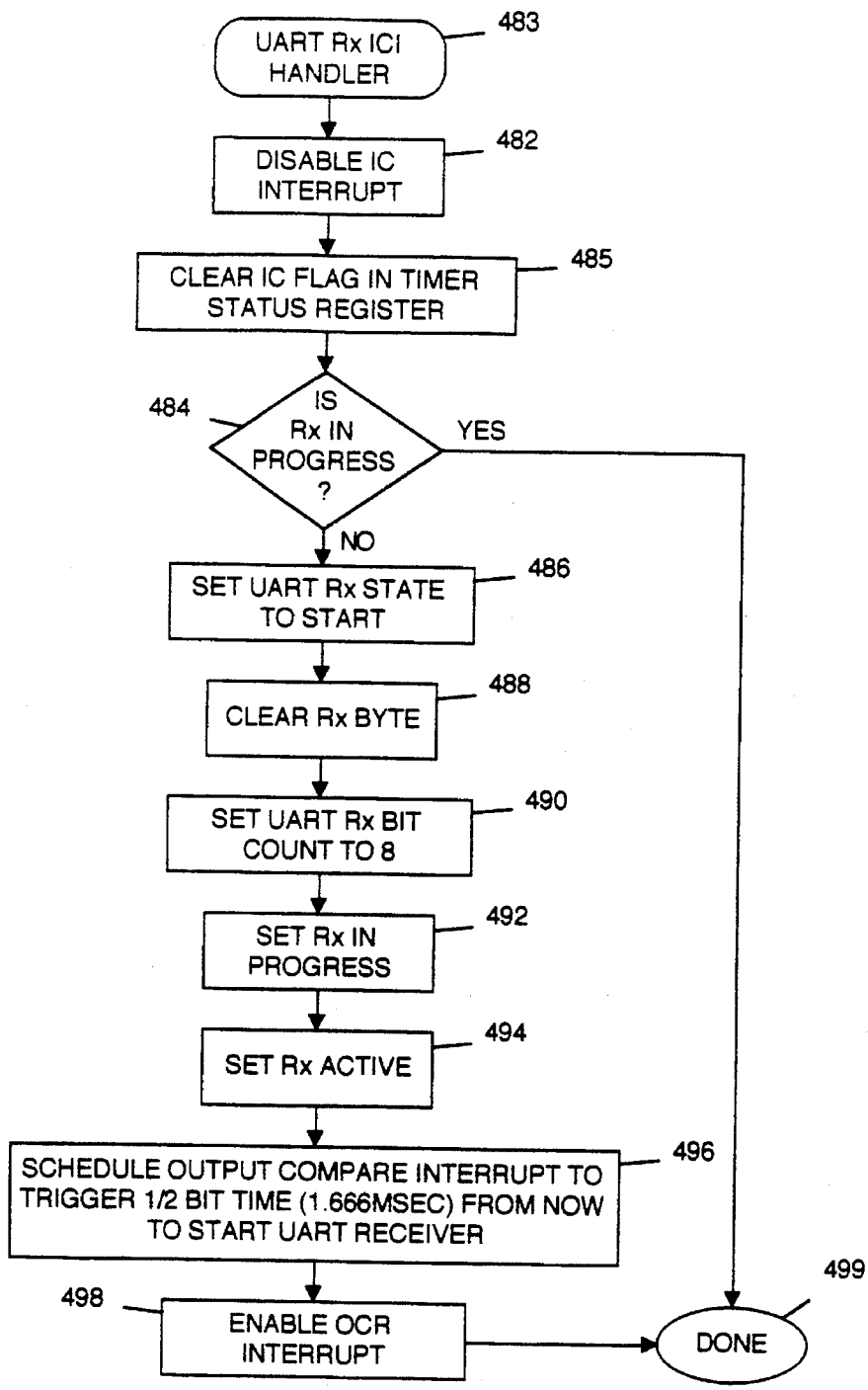
Figure 8G:
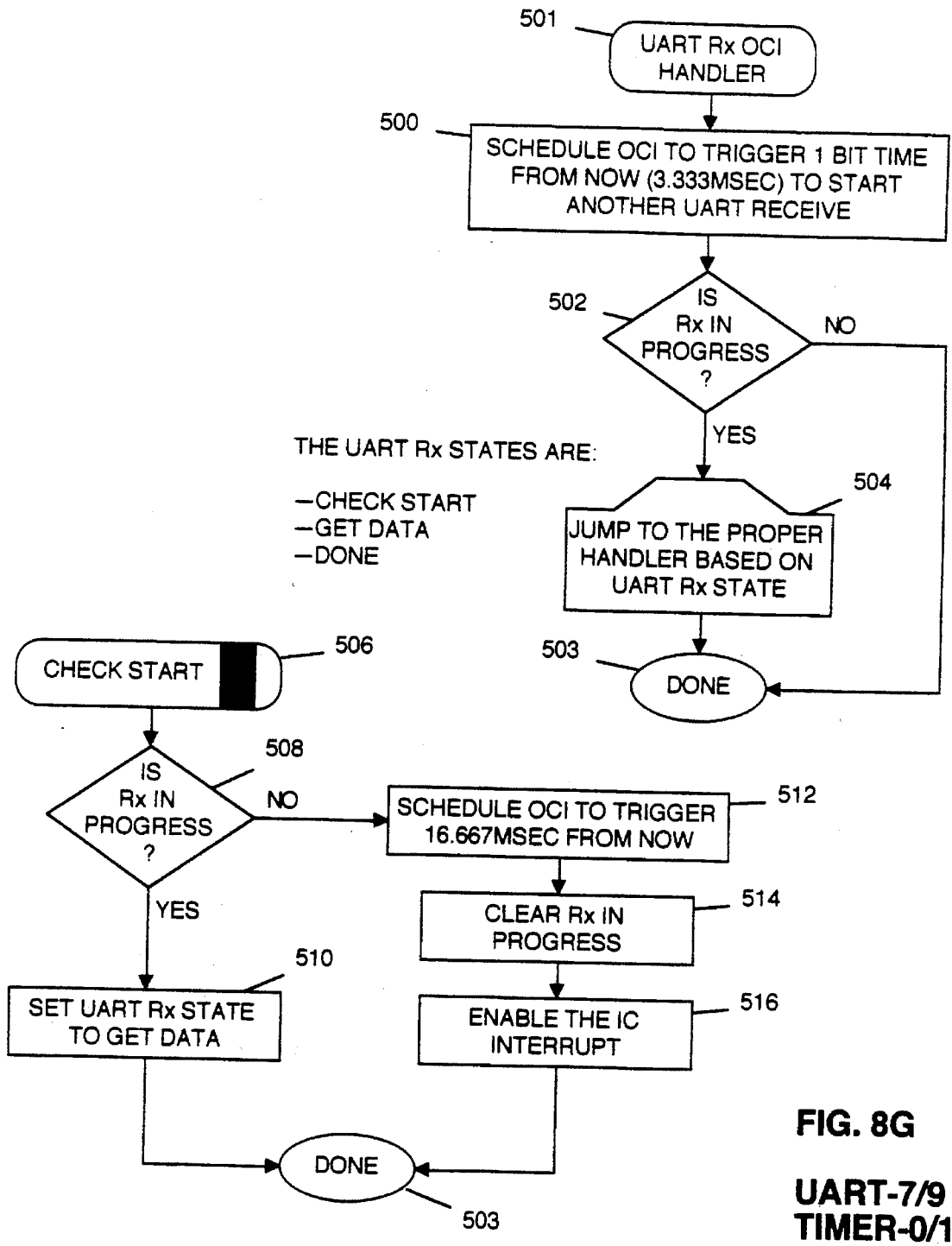
Figure 8H:
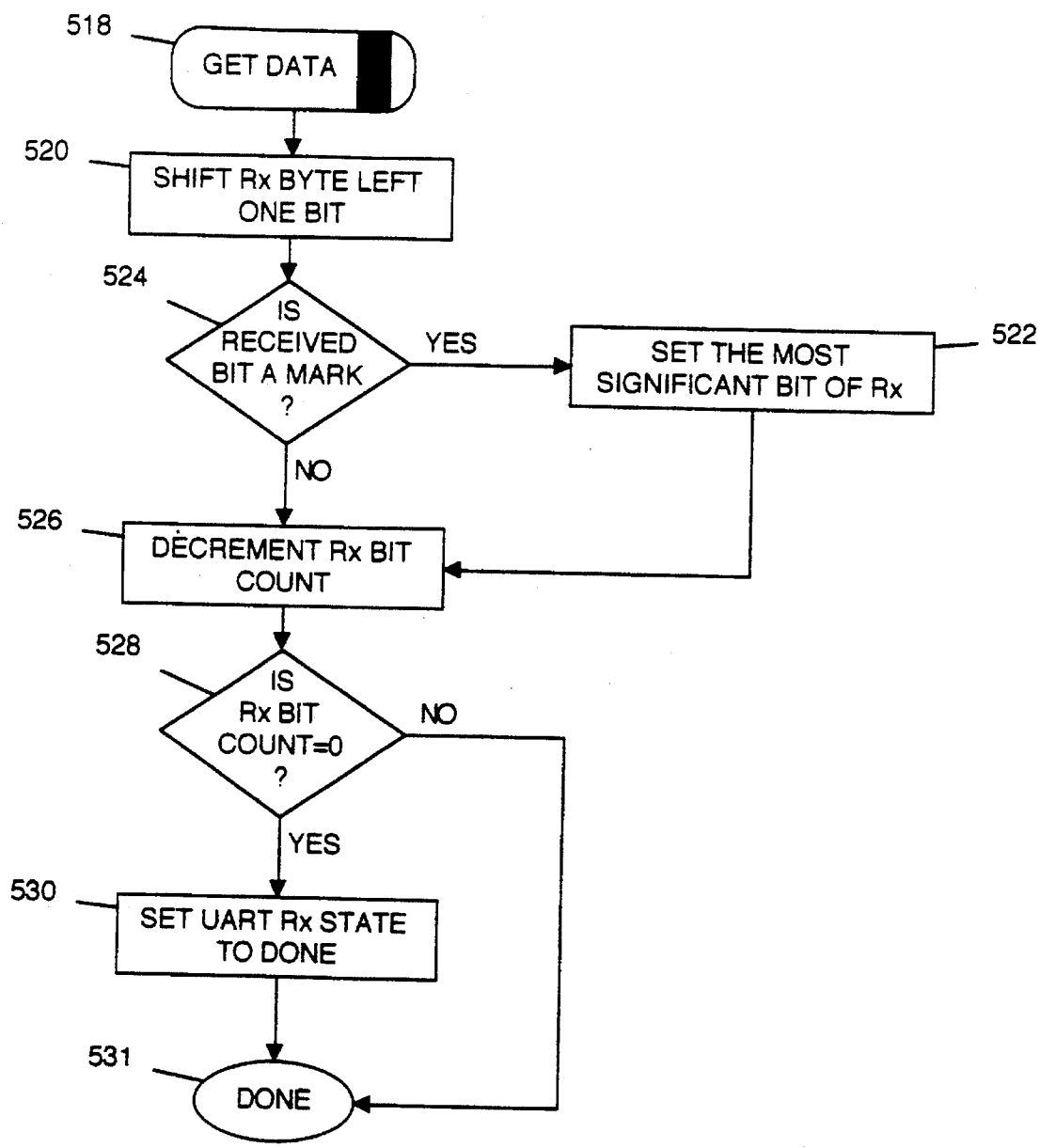
Figure 8I:
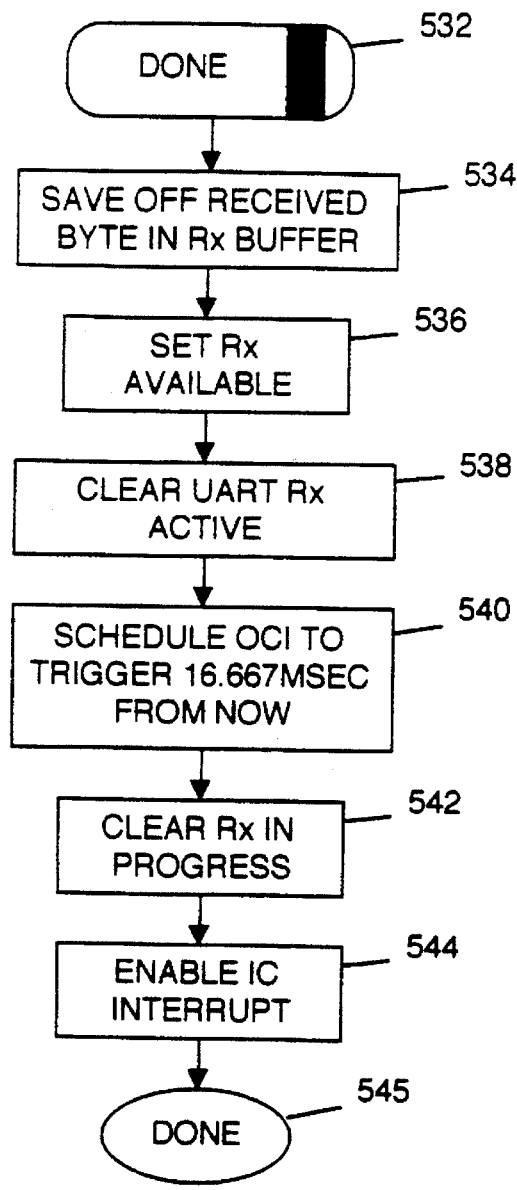
Figure 8J:
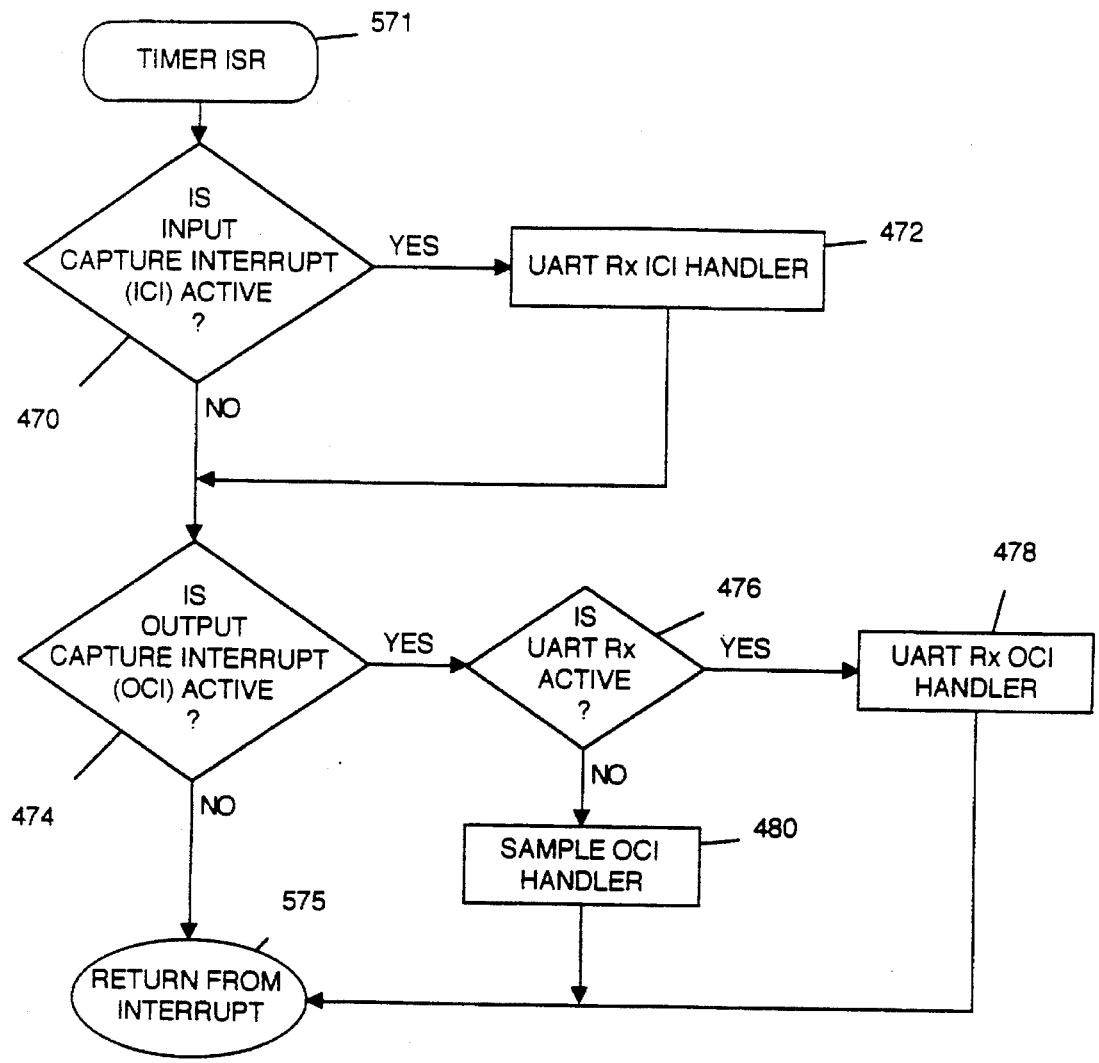

When the IC interrupt takes place, the TIMER_ISR subroutine executes as shown in FIG. 8j. The subroutine makes a threshold check of an input compare flag (input capture interrupt active) and, if active, calls the UART_RX_ICI_HANDLER subroutine 472 (FIG. 8F) Regardless of the check on the interrupt active flag, an output compare flag (output capture interrupt active) is checked 474. When not active, the subroutine ends. When active, the subroutine checks the UART Rx active flag. When the flag is active, the subroutine calls the UART_Rx_OCI_HANDLER routine (FIG. 8g) 478.

The UART_RX_ICI_HANDLER subroutine is shown in FIG. 8F. When called, the IC interrupt is disabled 482, and the IC flag is cleared 485. A check is made whether a receive operation is in progress 484. If so, the subroutine ends. If not, the UART Rx state is set to Start 486, and the Rx byte is cleared 488. Then, a counter is set to eight 490 (for the number of bit to be received), Rx progress and Rx active flags are set 492,494, and a timed interrupt (Output Compare Interrupt—OCI) is scheduled to take place after a ½ bit time delay 496 (to synchronize with the arriving data bits). The OCR interrupt is enabled 498, and the subroutine ends.

Each time the OCI interrupt takes place, subroutine UART_RX_OCI_HANDLER executes (as shown in FIG. 8g) which in turn calls a subroutine for the appropriate state. The UART_RX_OCI_HANDLER first schedules the Output Compare interrupt to take place after one-half bit time 500, and then checks whether Rx is in progress 502. If no Rx is in progress, the subroutine ends; otherwise, the subroutine branches depending on the UART Rx state 504.

In the start state 506, subroutine CHECK_START determines if the start bit is a space 508. If it is a space, the state is changed to GET_DATA 510. However, if it is not a space, then: an OC interrupt is scheduled to go off after 16.667 msec 512; the Rx in progress is cleared 514; and an IC interrupt is enabled 516.

In the Data state 518, subroutine GET_DATA shifts the previously received bits 520, appends the currently received bit (sets the most significant bit of the Rx byte 522 when the received bit is a mark 524), and decrements a counter 526 (from 8 to 0). When the last bit of a character has been received 528, the state advances to "Done" 530 and the subroutine ends.

In the Done state, subroutine DONE closes out the character-reception actions by: saving the character 534, resetting flags 536,538,542, resetting the output compare interrupt 540, and enabling the IC interrupt 544.

The UART function and the A/C sampling function use timed interrupts (bit-time sampling for the UART, 90 degree phase delay from the zero crossing for the A/C sampling function). The PMU temporarily suspends A/C sampling when the UART function is active, and returns to A/C sampling otherwise.

The PMU communicates with the utility host using a command handler that implements commands sent by the utility host. This command handler has sufficient capability for the host to extract all the useful information from the PMU as well as reconfigure the PMU remotely. The "R" command allows the host to read RAM and EEPROM. The "W" command allows the host to write into RAM and EEPROM. The "K" command performs a software reset, i.e. kills what has been going on. The "S" command puts PMU to sleep to conserve power. Note that the PMU can be reconfigured remotely by the utility host so that the PMU can be adjusted to suit its environment by adjusting parameters like trigger windows and filter constants.

FIGS. 9a–9k are flow-charts of a routine implementing a command language with a host computer. Routine COMMAND (FIG. 9a) is a 60 Hertz task that jumps to the correct handler depending on the command state 550. The states are: looking, read parameters, read term search, read CRLF, read reply, read final CRLF, read EE, read EE wait, write parameter, write EE, term search, and wait Tx done. Within these command state routines are subroutines which will now be explained. These routines may be called from more than one command state.

Subroutine READ_DATA (FIG. 9b) begins by checking to see if UART Rx is done 552. If it is done, the subroutine is complete. If not, READ_DATA gets the command byte that was received 554, and transmits it back 556, echoing the command to the host. If the byte is a ^C 558, then the sequence "Z"<CR><LF> is transmitted 560, the command state is set to Wait_Tx_Done 562, and the subroutine is completed. Otherwise the byte is examined 564 to determine if it is a space or a tab before the subroutine is complete. If the byte is not a space or a tab, return byte is received 566 and the subroutine is complete.

Subroutine READ_PARAMETERS begins by reading data 568. If no data is present 570, the subroutine is complete. If data is present, the data is examined 572 to see if it is a <LF> or <CR>. If one of these characters is received, then the sequence "Z" <CR><LF> 574 is transmitted and the command state is set to Wait_Tx_Done before the subroutine is complete 576. On the other hand, if another character is received, it is first converted to its :Lower case 578. Then the byte is examined to determine if it is neither "0" to "9" nor "A" to "F" 580. If this is the case, "H"<CR>LF> is transmitted 582, the command-state is set to Wait$_{13}$ Tx_Done 576, and the subroutine is complete. If it is not the case, the byte is converted from Hex character to binary character and stored 584. Then, the pointer is advanced to the next location 586 and the subroutine is complete.

Subroutine SPACE (FIG. 9d) appends a space onto the end of the reply string 588.

Subroutine CRLF (FIG. 9d) appends a <CR>LF> onto the end of the reply string 590.

Subroutine BIN-TO-HEX (FIG. 9d) converts a binary byte into two hex digits and appends this onto the end of the reply string 592.

Subroutine CALC_CKSUM (FIG. 9d) calculates the read checksum of the data read form memory 594.

Figure 9A:
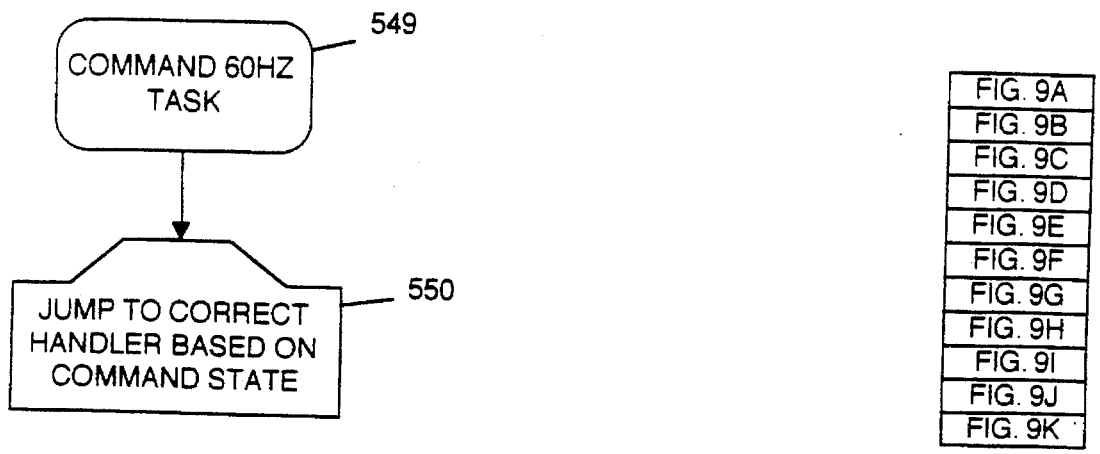
FIGS. 9a–9k are flow-charts of a routine implementing a command language with a host computer.
Figure 9B:
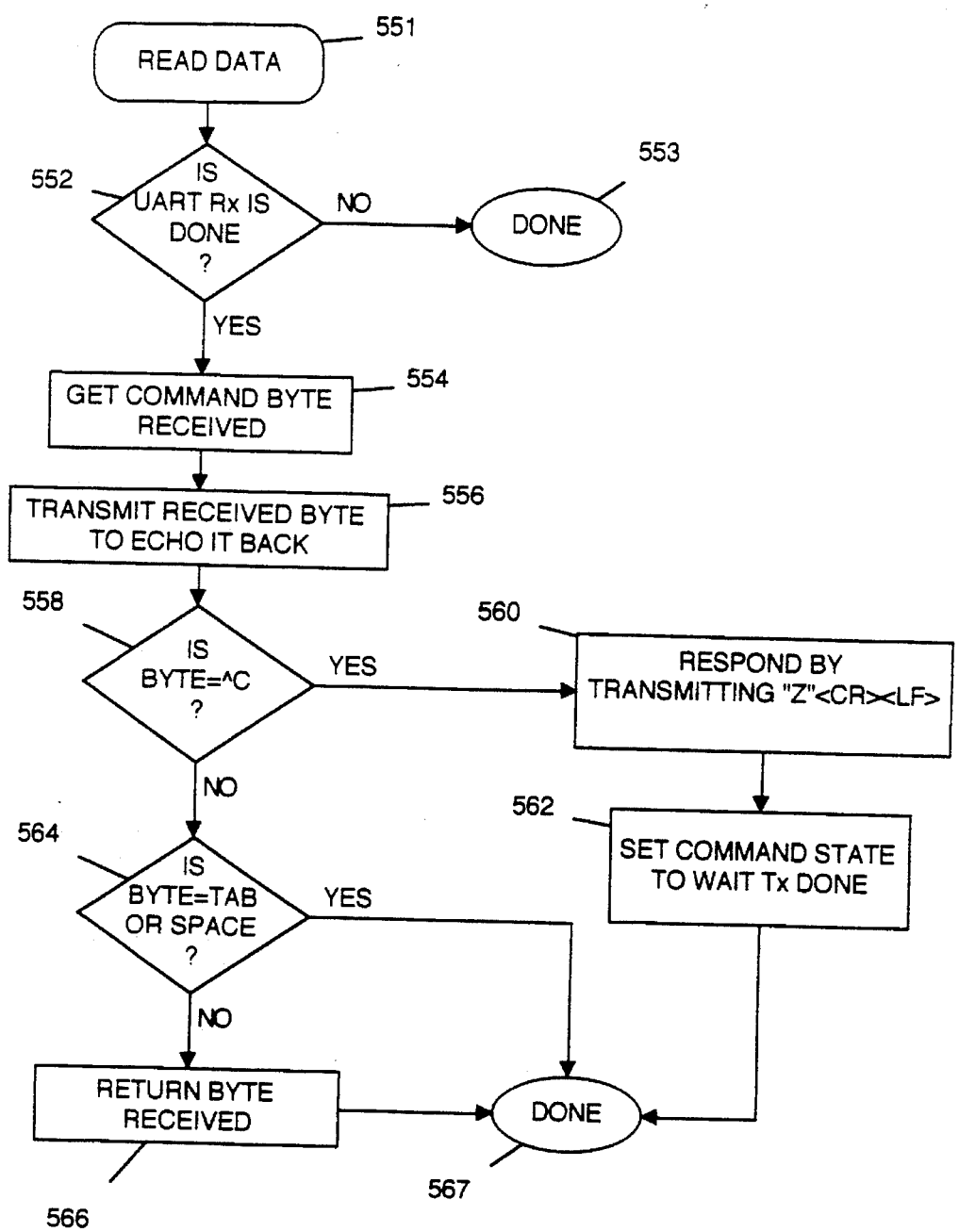
Figure 9C:
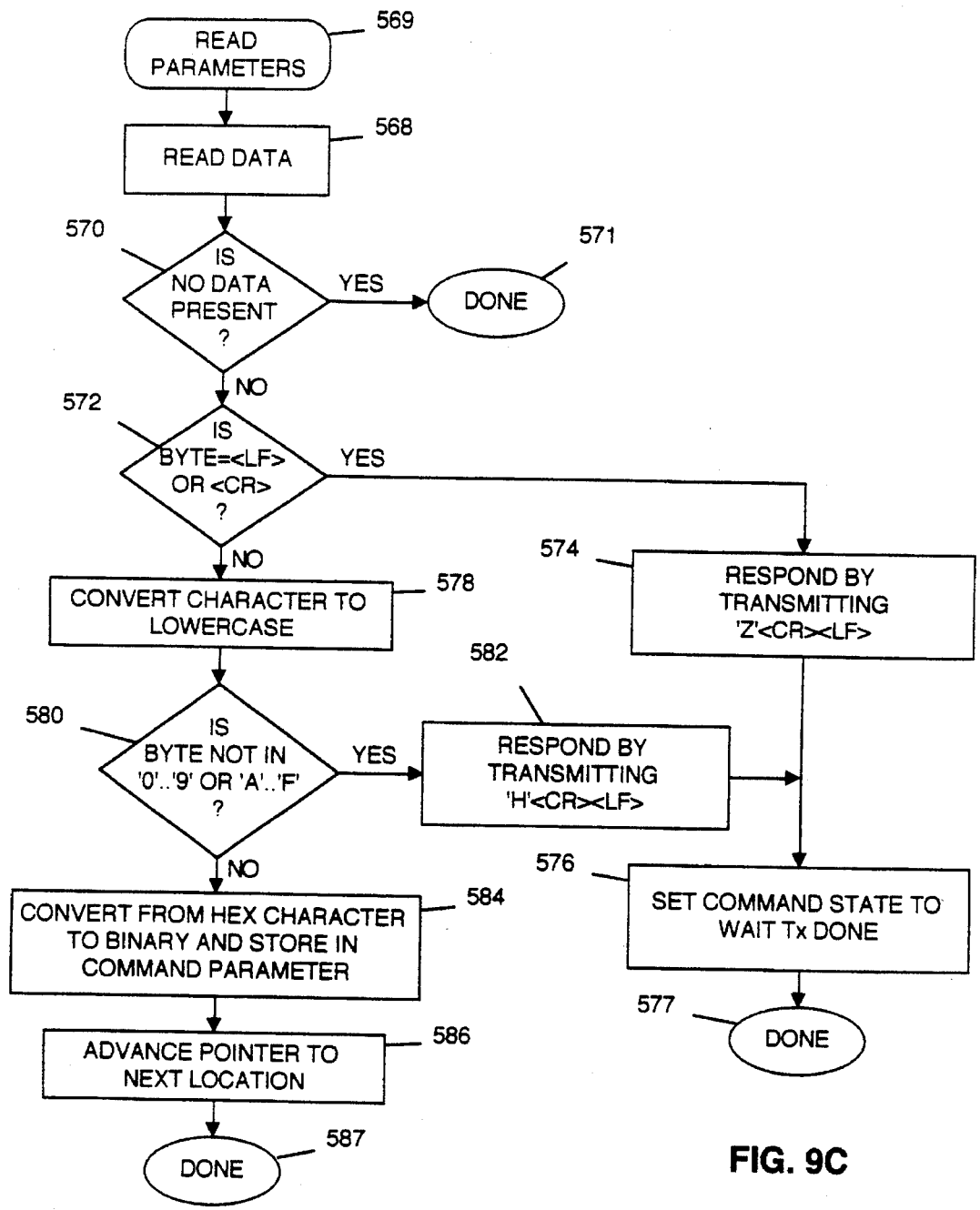
Figure 9D:
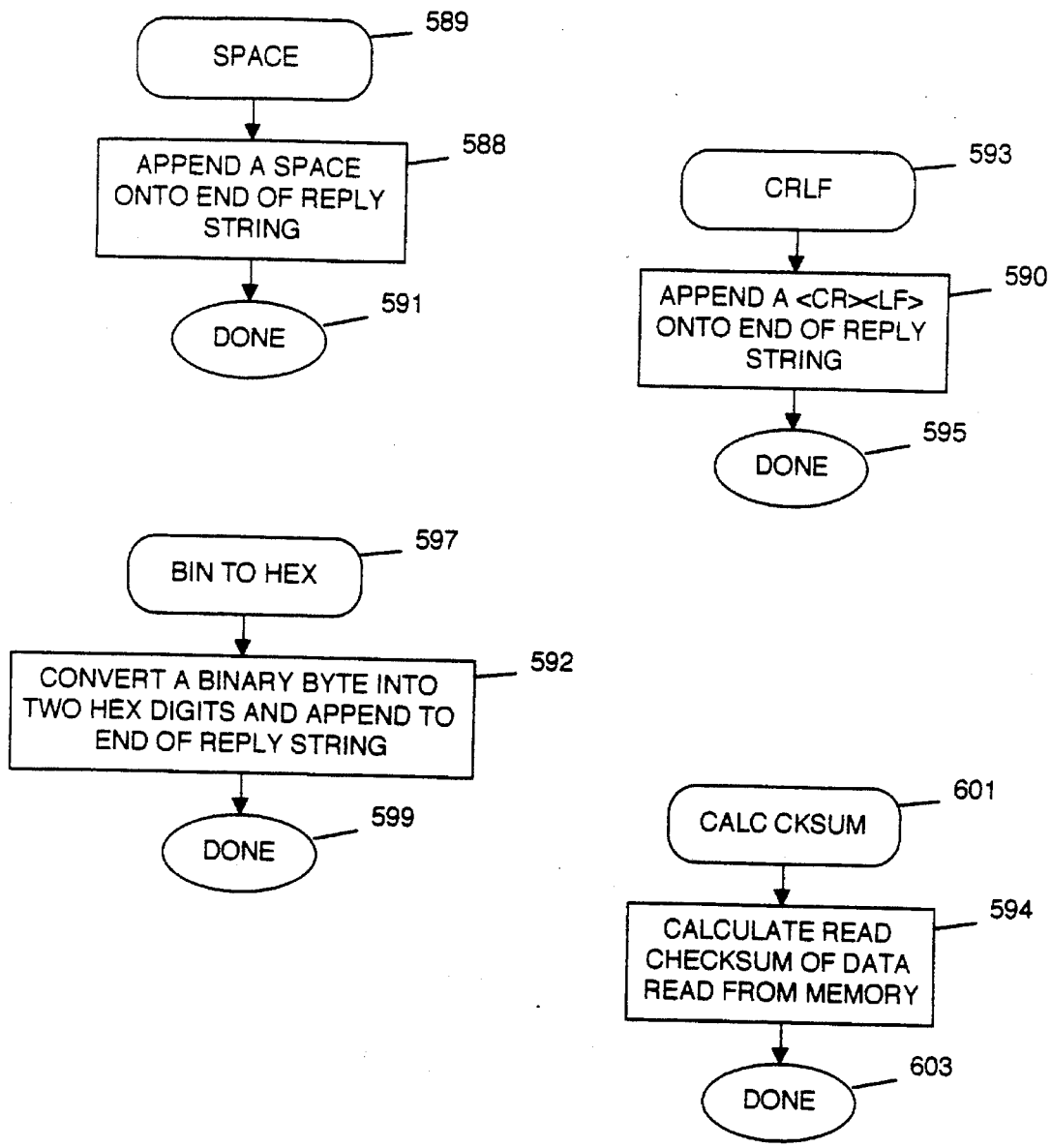
Figure 9E:
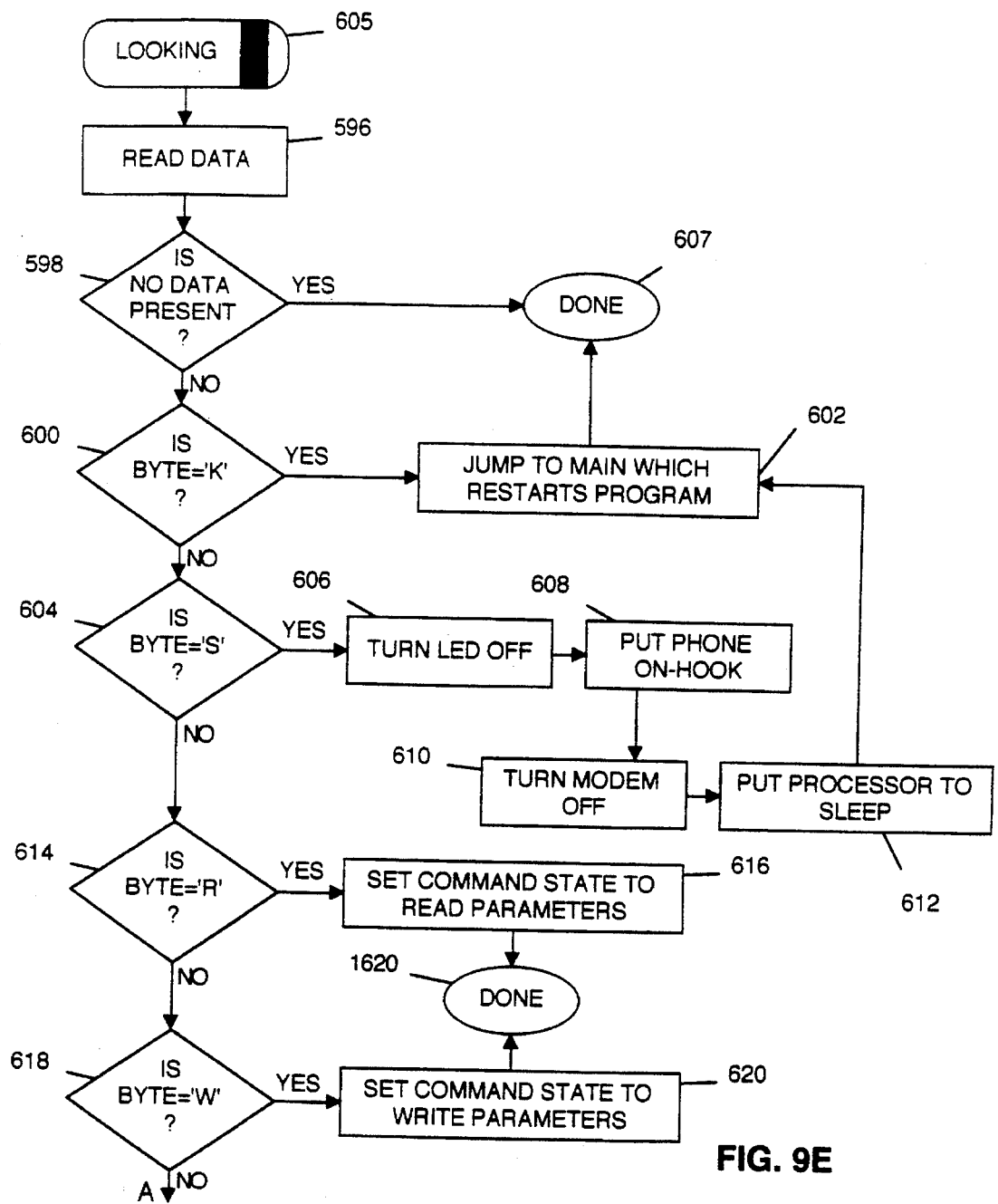
Figure 9F:
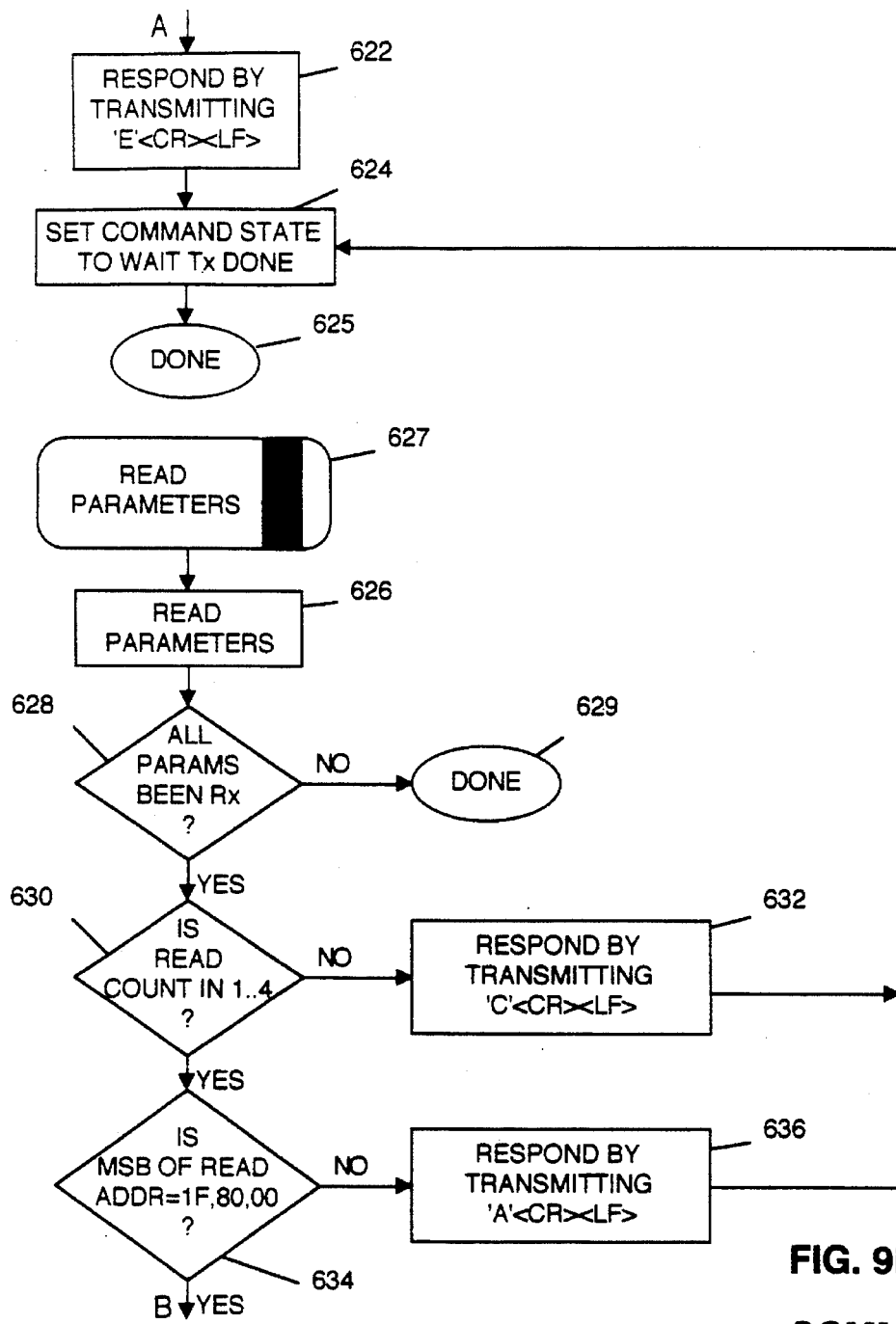
Figure 9G:
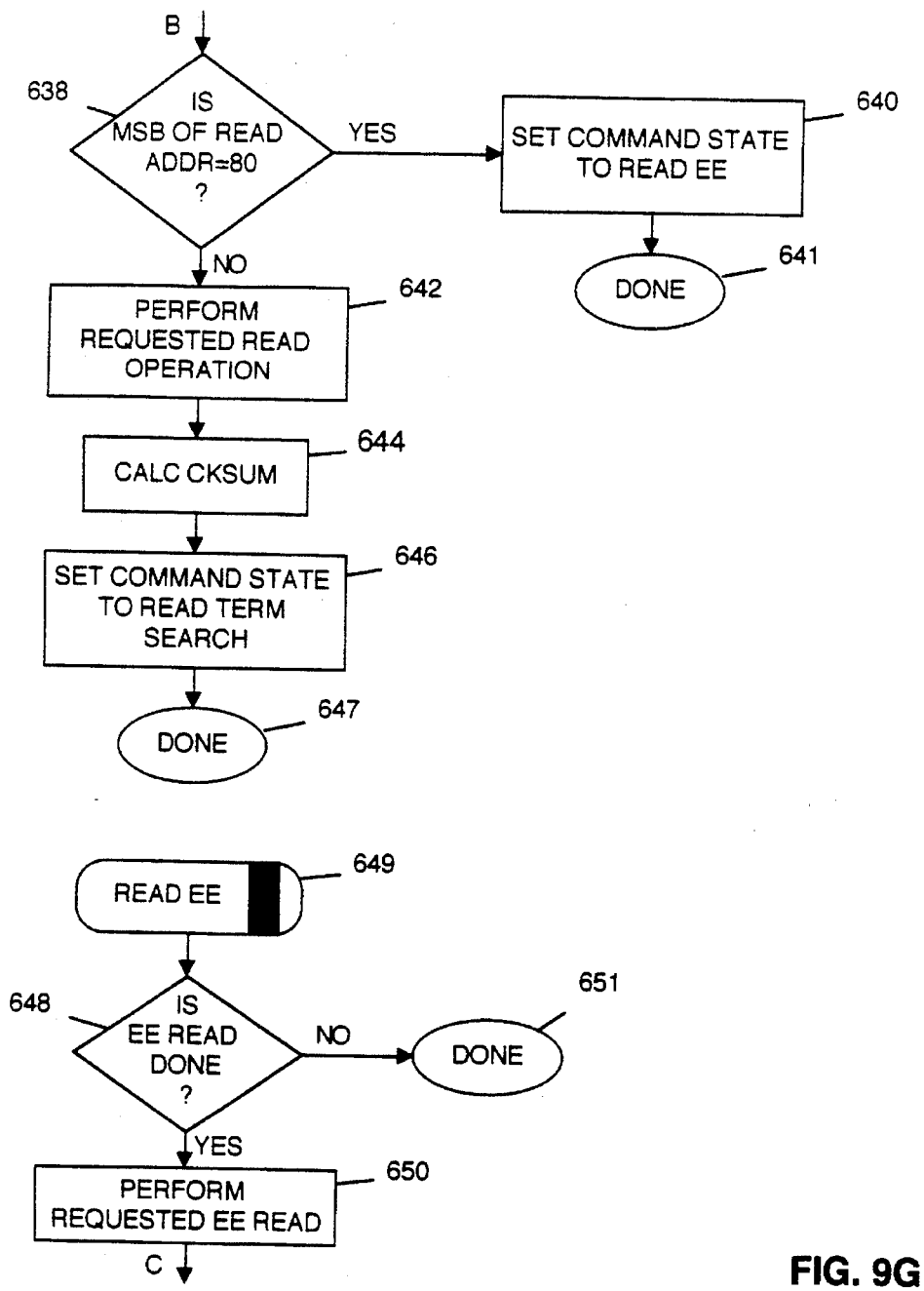
Figure 9H:
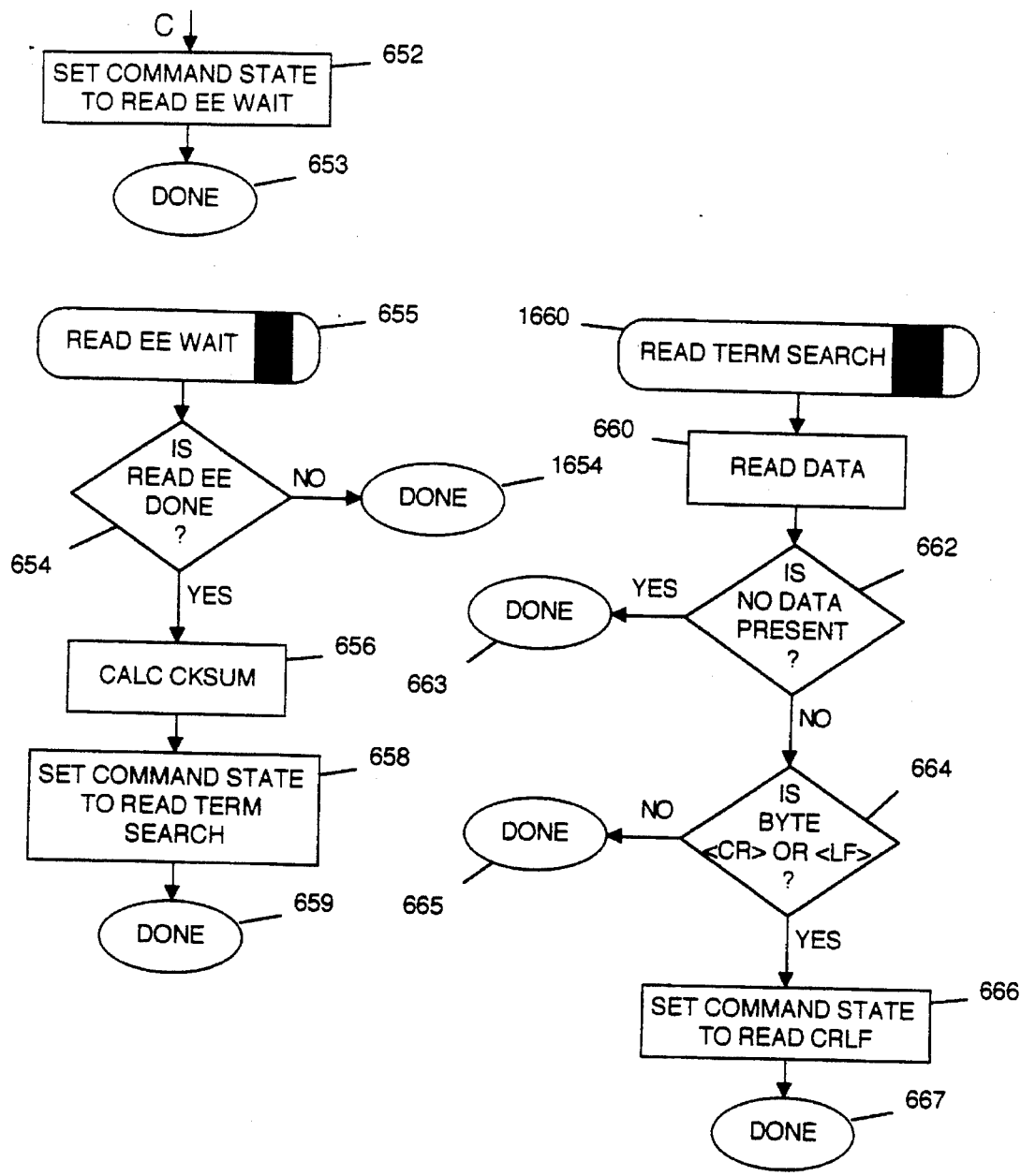
Figure 9I:
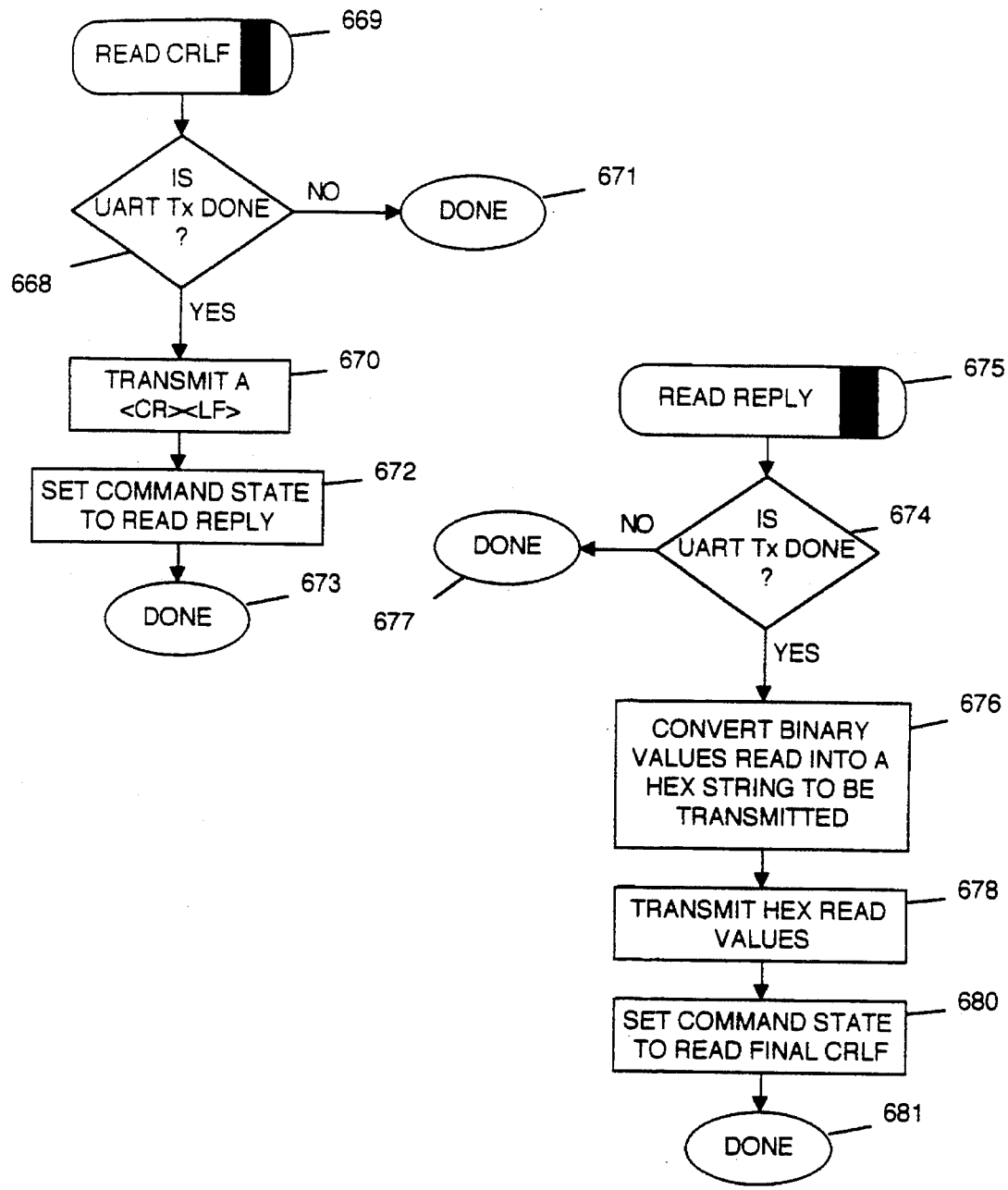
Figure 9J:
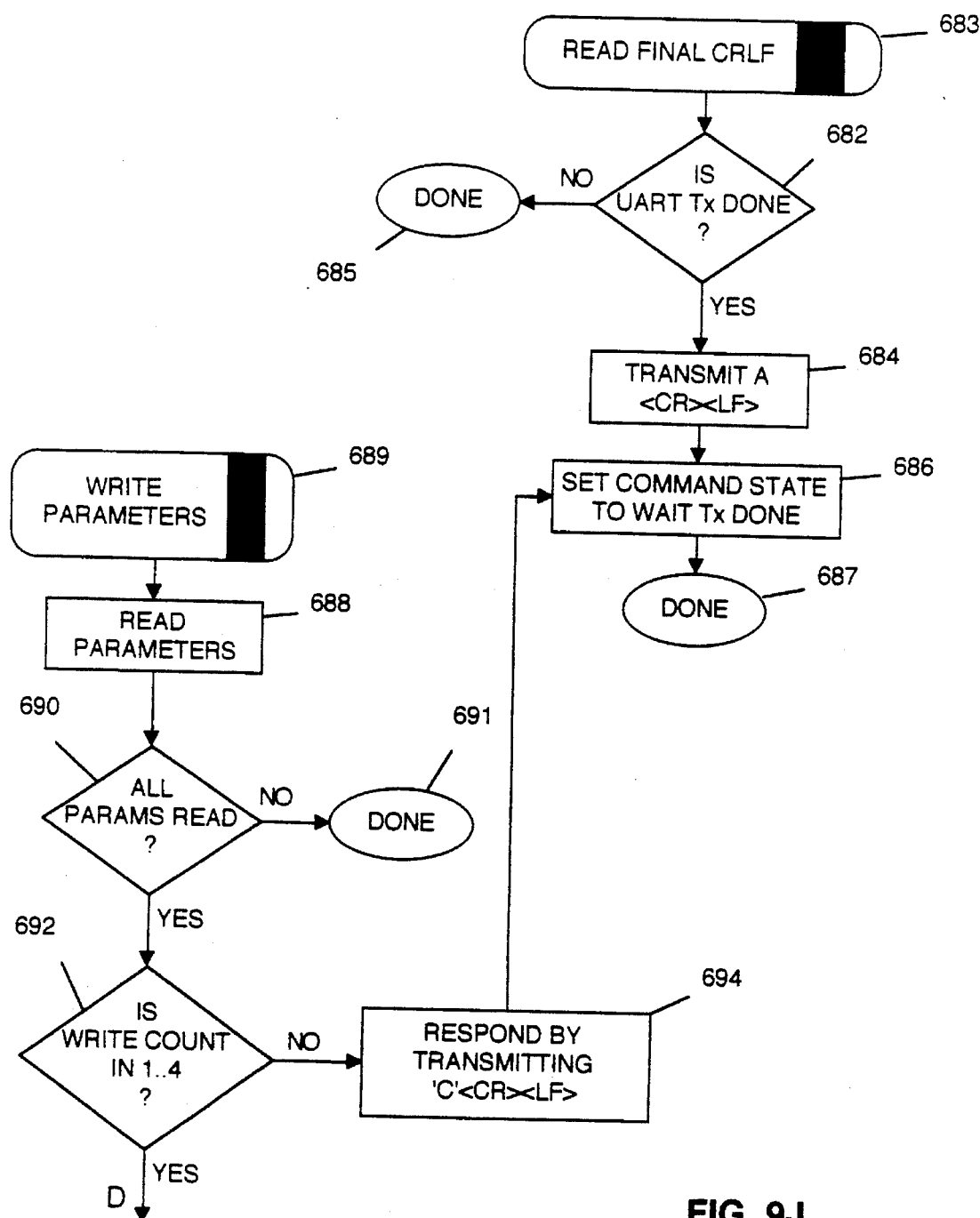
Figure 9K:
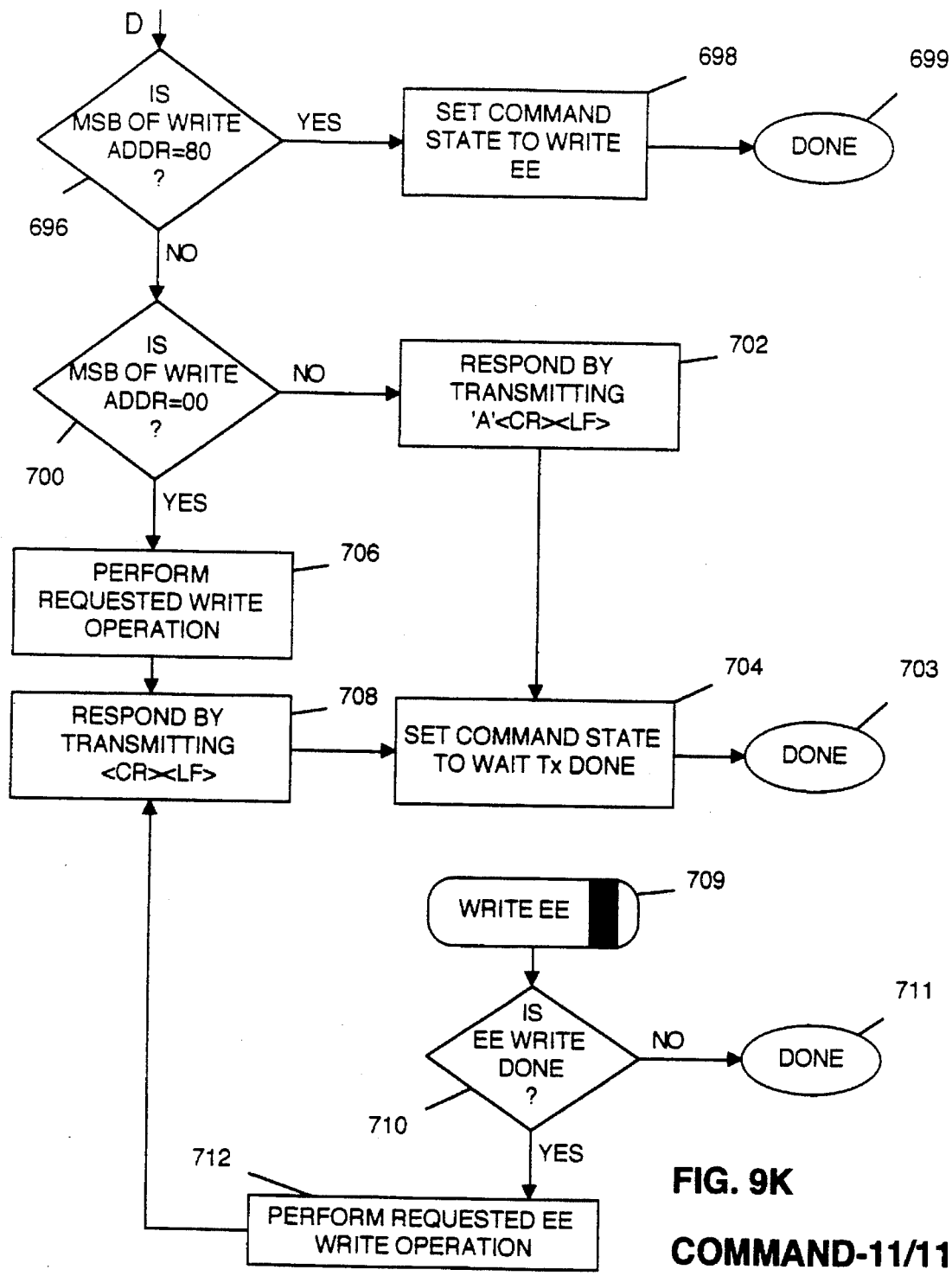

Command state LOOKING begins by performing Read_Data (FIG. 9b). If no data is present 598, the command state is complete. However, if data is present, LOOKING proceeds to examine the data 600. If a "K" is received, the program jumps 602 to the MAIN program loop and the microcontroler restarts. If "S" is received 604, the PMU enters a "sleep" mode by: turning off the LED 606; putting the phone line on-hook 608; turning off the modem 610 and placing the processor in its sleep mode 612. Finally the program is sent to the MAIN program loop to be restarted. If "R" is received 614, the command state is set to Read_Parameters 616. If "W" is received 618, the command state is set to Write_Parameters 620. If none of these letters is received, LOOKING responds by transmitting the sequence "E" <CR> <LF> (for error) 622 to the utility host, and the command state is set to Wait_Tx_Done 624.

Command state Read_Parameters begins by performing subroutine READ_PARAMETERS 626. Then the command state checks to see if all the parameters have been read 628. If not the command state is complete. If so the read count is examined 630 to see if it is between one and four. If not, then the sequence "C" <CR> <LF> is transmitted 632, and command-state Wait_Tx_Done is set 624. If read count is between one and four, the MSB of the read address is checked 634 to see if it is equal to 1F,80,00. If not, then the sequence "A" <CR> <LF> is transmitted 636, and command-state Wait_Tx_Done is set 624. If the MSB is equal to 1F,80,00 and MSB of read address is equal to 80 638, then command state is set to Read_EE 640. Otherwise the requested read operation is performed 642. After performing the read operation, subroutine CALC_CKSUM is performed 644, and the command state is set to Read Term Search 646.

Command state Read_EE (FIG. 9g) begins by checking to see if routine EE_READ is done 648. If EE_READ is not done, the command state is complete. Otherwise, Read_EE performs the requested EE Read 650 and sets the command state to Read_EE_Wait 652 before being completed.

Command state Read_EE_Wait (FIG. 9h) begins by checking to see if state Read_EE is done 654. If not done, Read_EE_Wait is complete. Otherwise, subroutine CALC_CKSUM is performed 656, and the command state Read_Term_Search is set 658.

Command state Read_Term_Search (FIG. 9h) begins by performing subroutine READ_DATA 660. If no data is present, the command state is complete. Otherwise, the byte is examined 662. If the byte is not <CR> or <LF> 664, the command state is complete. But, if these characters are present, the command state Read_CRLF is set 666.

Command state Read_CRLF (FIG. 9i) begins by determining if UART Tx is done 668. If not, the command state is complete. If it is done, then the sequence <CR> <LF> is transmitted 670, and command state Read_Reply is set 672.

Command state Read_Reply (FIG. 9i) begins by examining if UART Tx is done 674. If not, the command state is complete. If it is done, the binary values are read into a hex string 676 and transmitted 678. Finally the command state is set to Read_Final_CRLF 680.

Command state Read_Final_CRLF (FIG. 9j) begins by checking to see if UART Tx is done 682. If not, the command state is complete. If it is done, the sequence <CR><LF> is transmitted 684, and the command state is set to Wait_Tx_Done 686.

Command state Write_Parameters (FIG. 9j) begins by performing subroutine READ_PARAMETERS 688. Then the command state checks to see if all the parameters have been received 690. If they have not been received, the command state is complete. If all the parameters have been received, then the write count is checked 692. If the write count is not between one and four, the sequence "C" <CR> <LF> is transmitted 694. Otherwise the MSB of the write address is examined 696. If MSB equals "80", then the set command is set to Write_EE 698 and the command state is complete. If the MSB does not equal "00" 700, then the sequence "A" <CR> <LF> is transmitted 702 and the command state is set to Wait_Tx_done 704 before the command state is completed. Otherwise, the requested write operation is performed 706, and the sequence "." <CR> <LF> is transmitted 708 before the command state is set to Wait_Tx_Done 704. Command state Write_EE (FIG. 9k) begins by checking to see if routine EE_WRITE is complete 710. If it is not, then the command state is complete. If it is, the requested write operation is performed 712, the sequence "." <CR> <LF> is transmitted 708, and the command state is set to Wait_Tx_Done 704.

The PMU also monitors a test input from the utility host. If test input is active, the unit immediately answers the phone and responds to the information from utility host. This feature is used during manufacturing operation to test the unit and to initialize its configuration parameters.

Figure 10A:
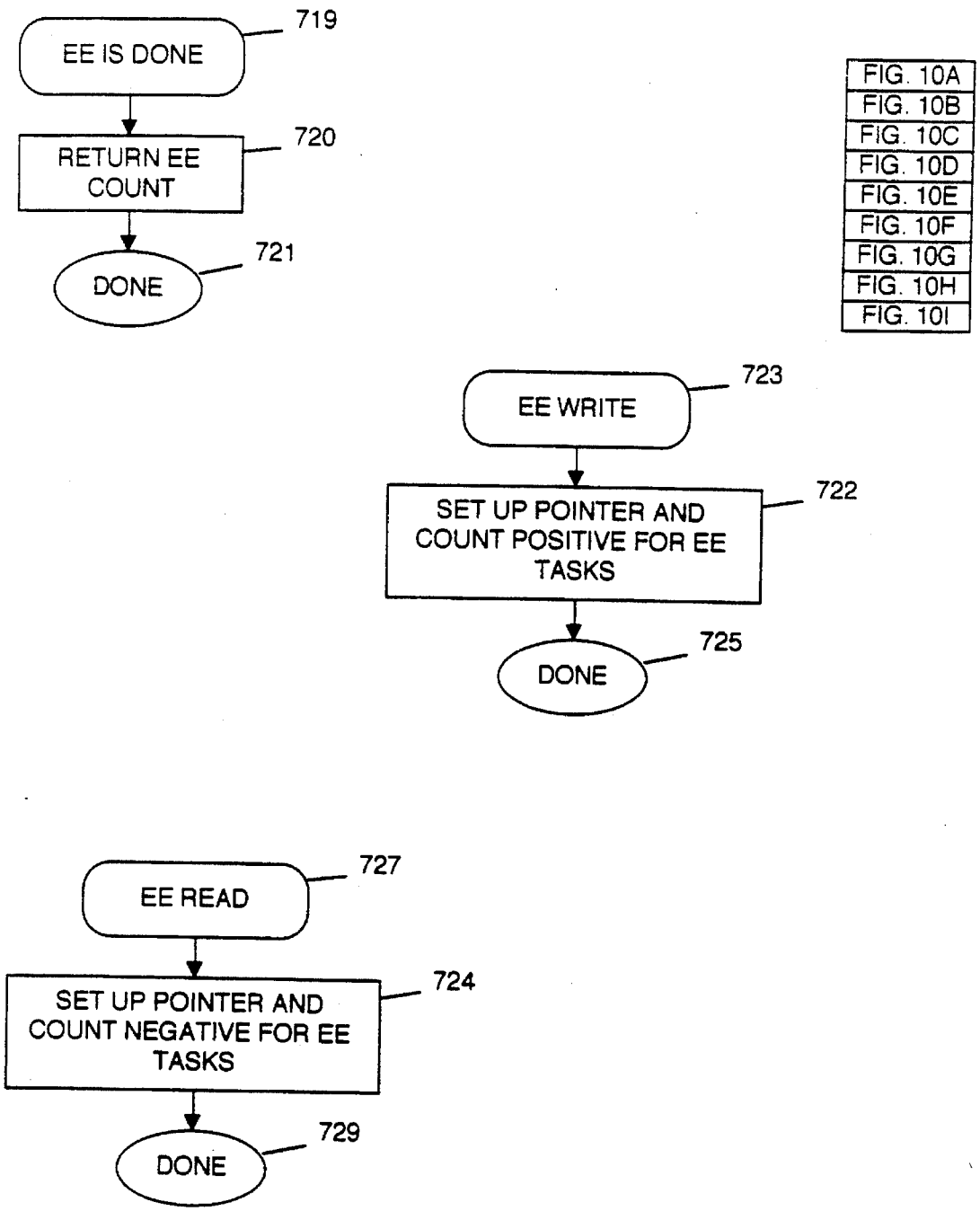
FIGS. 10a–10i are flow-charts of a routine directing reading and writing of an EEPROM.

The PMU has an EEPROM for storing phone numbers, the instantaneous voltage log and other values. The microcontroller reads and writes to the EEPROM through a serial data line. The software sequence for reading or writing to the EEPROM is to call Subroutine EE_IS_DONE (FIG. 10a) until it returns a count of zero 720. When the count is zero, reading from and writing to the EEPROM can be performed. EE_READ and EE_WRITE (FIG. 10a) are called with the appropriate parameters, which will start the user's read/write cycle. EE_READ sets the pointer and counts a negative count 722 so the other EE tasks can be performed. EE_WRITE sets the pointer and counts a positive count 724 so that other EE tasks can be performed. The read/write parameter must not be changed until the read/write cycle has been completed. The user can then call EE_Is_Done to monitor the progress of the read/write cycle. When the count goes to zero, the read or write cycle is complete.

Figure 10B:
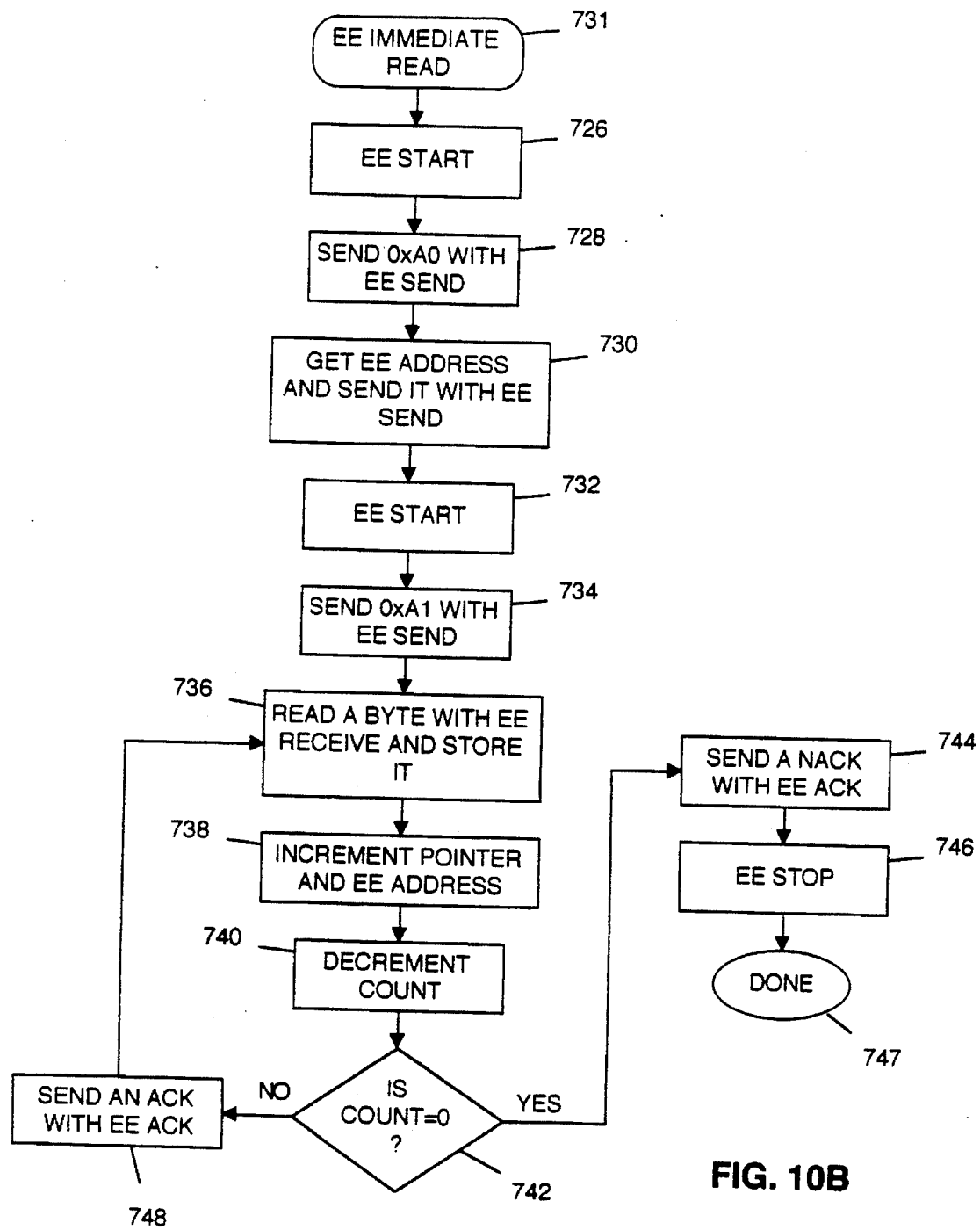
Figure 10C:
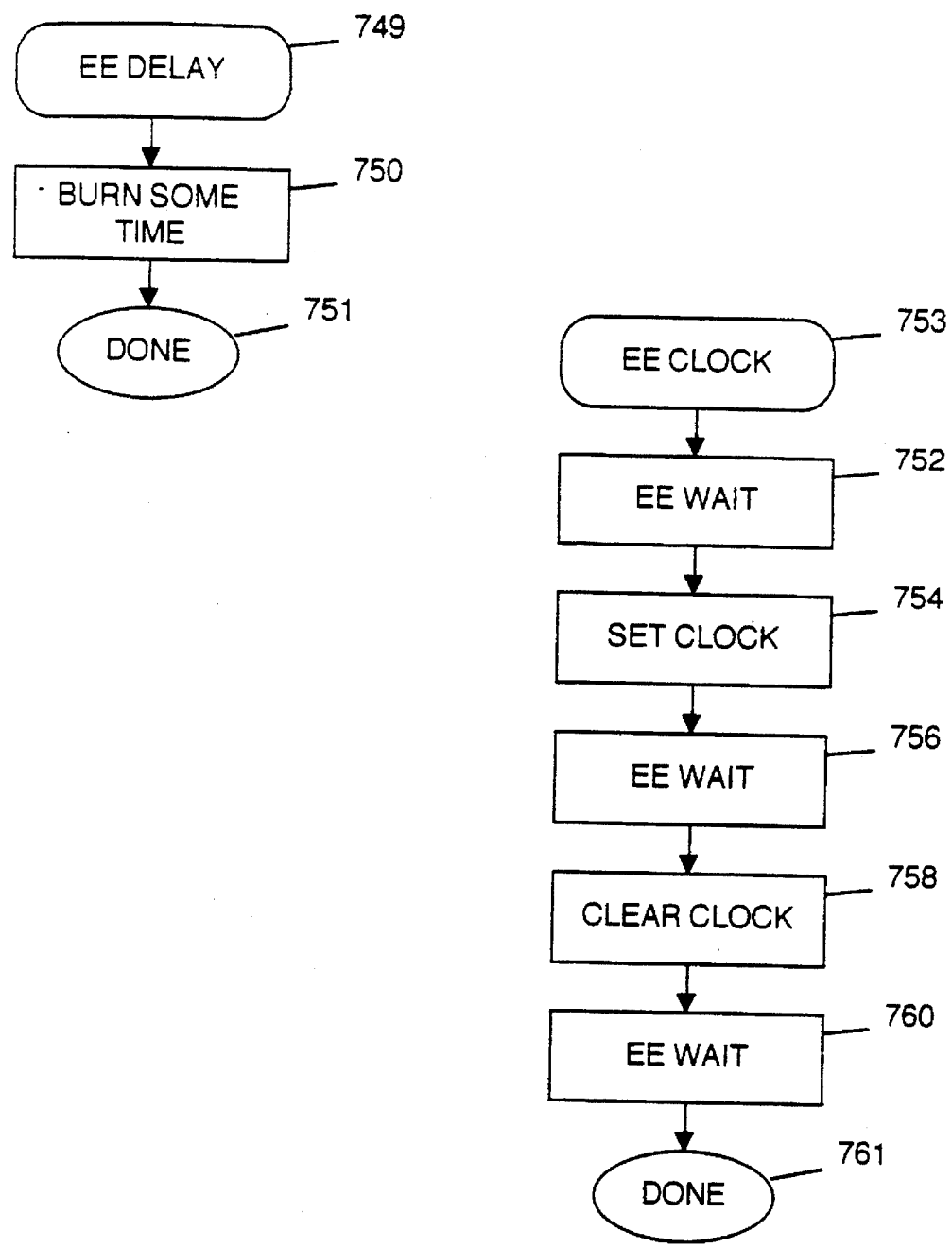
Figure 10D:
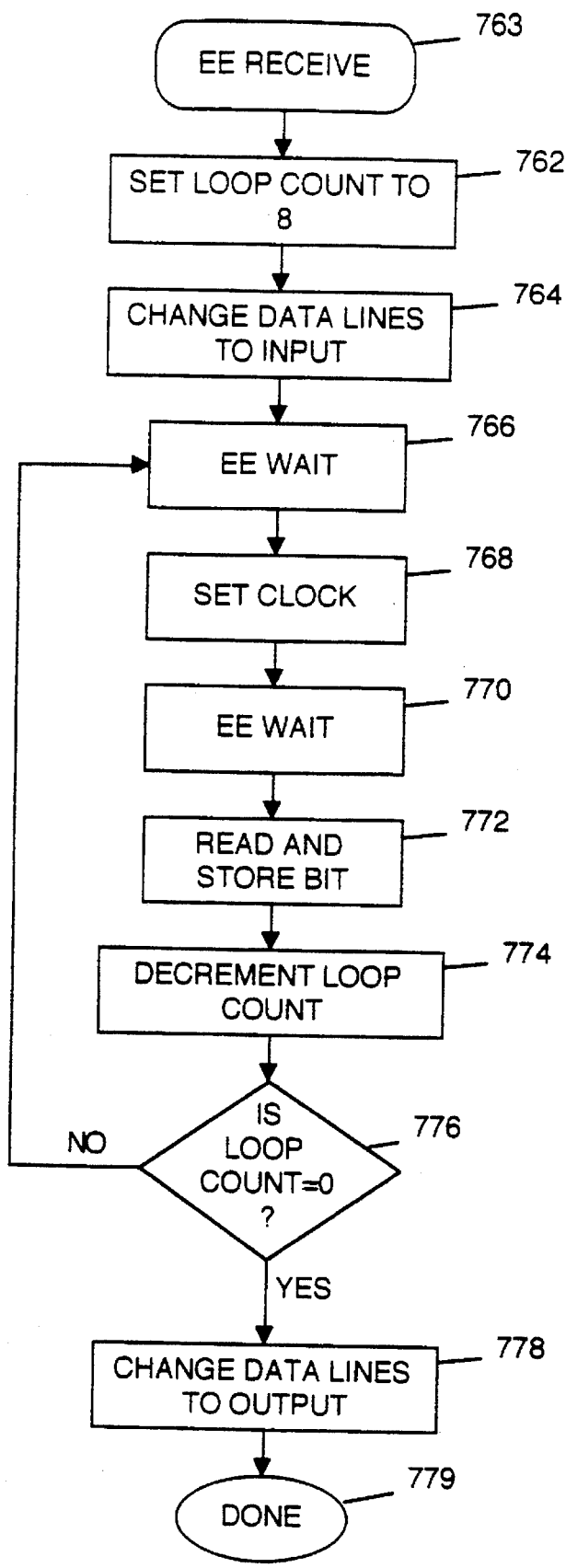
Figure 10E:
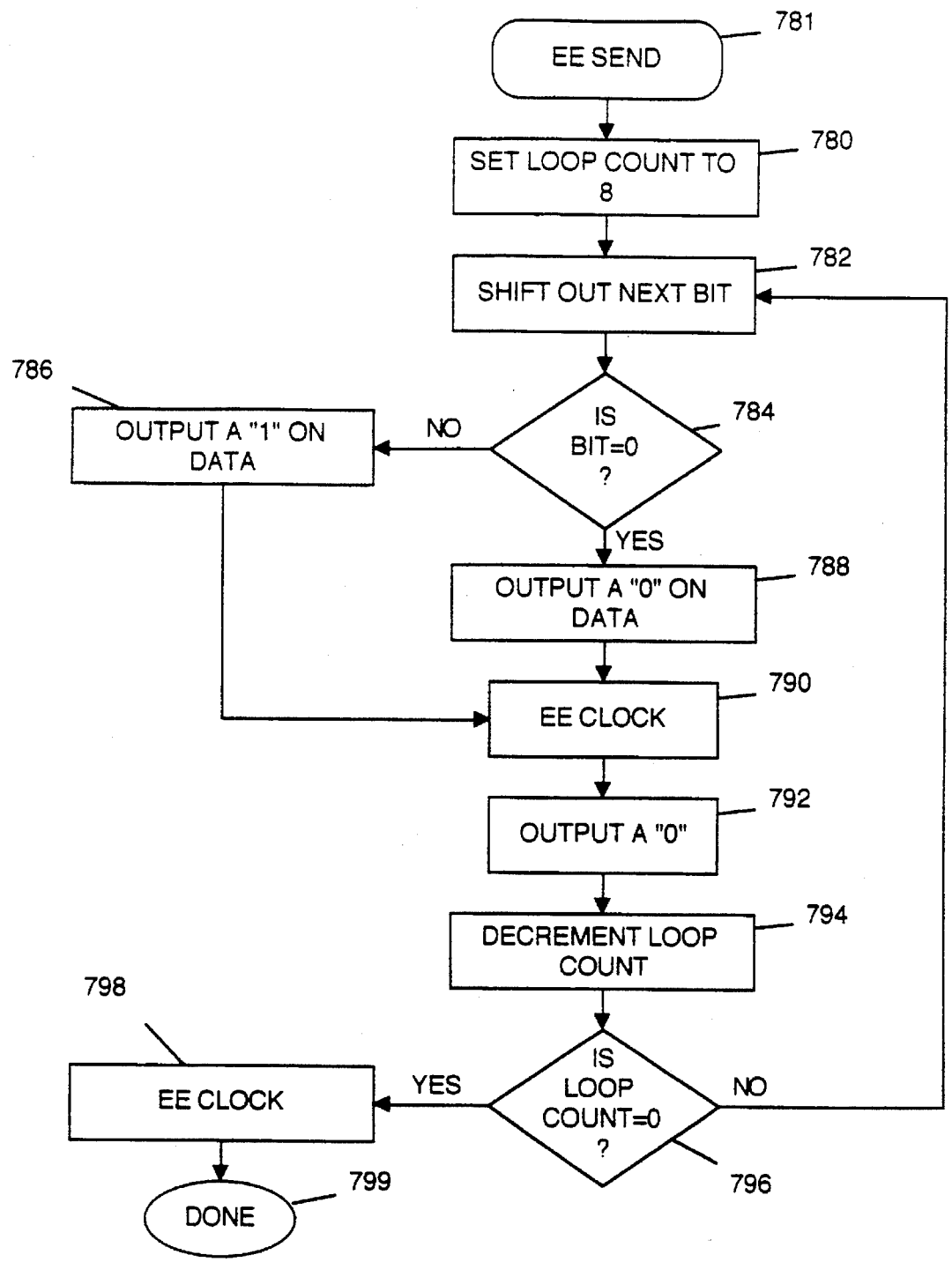
Figure 10F:
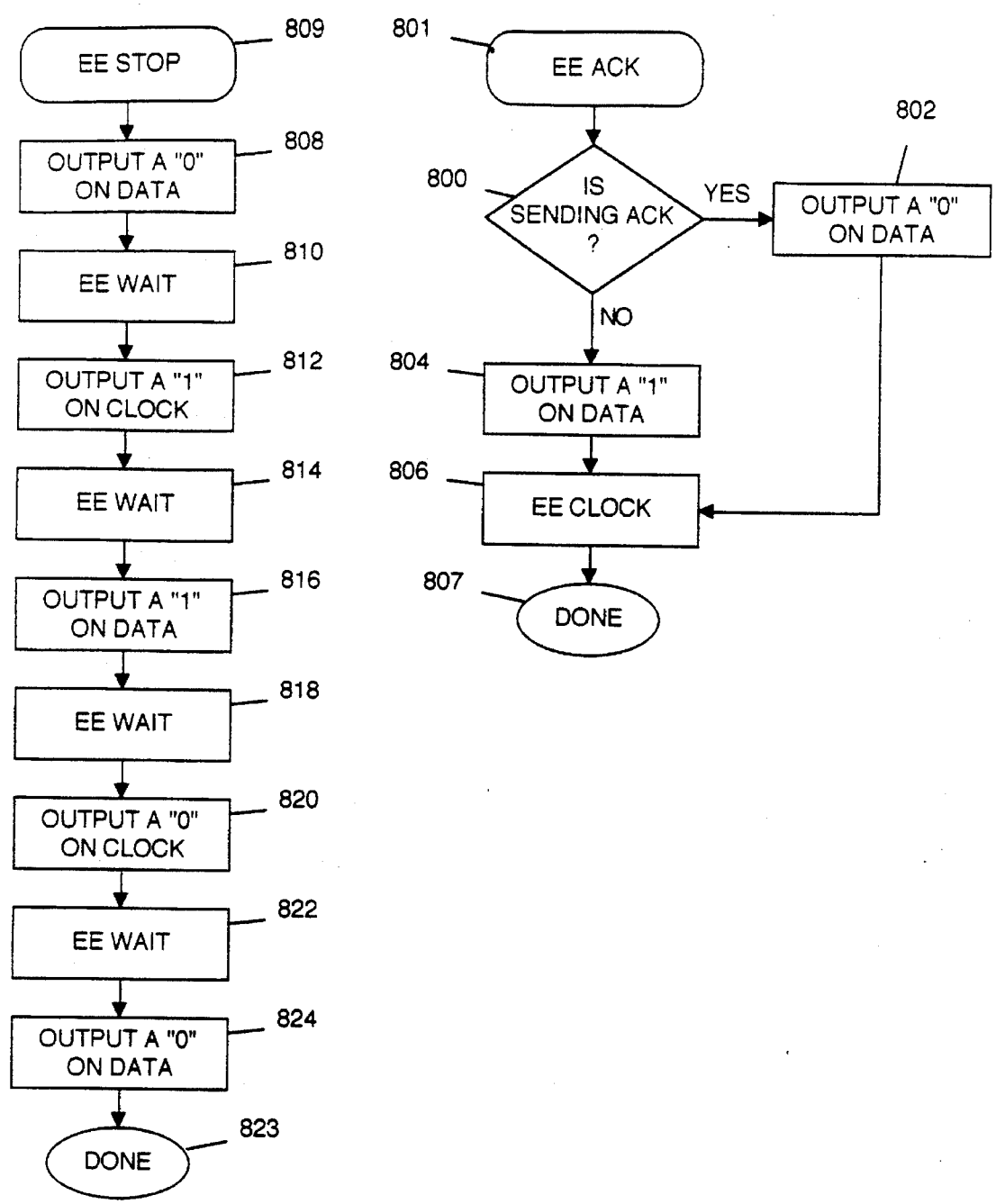
Figure 10G:
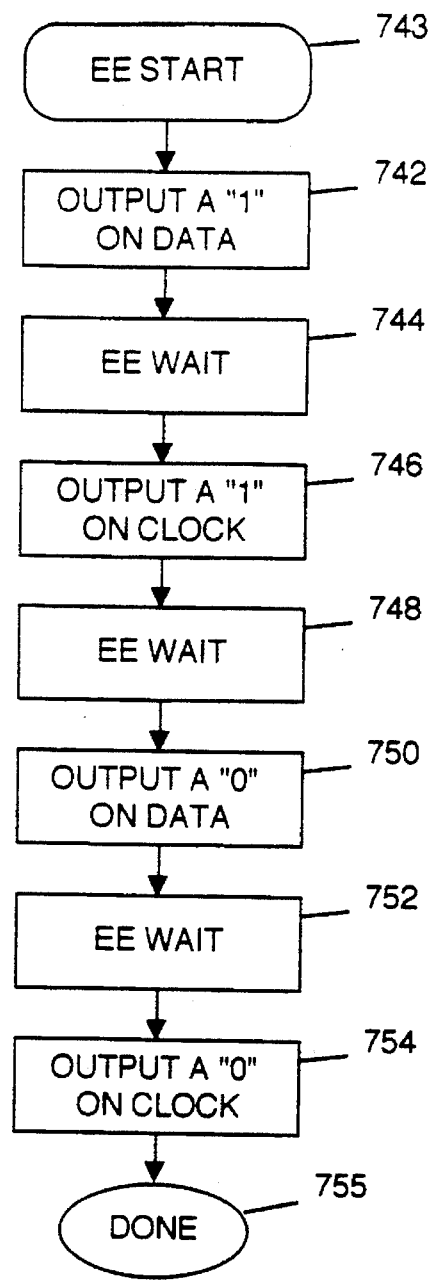
Figure 10H:
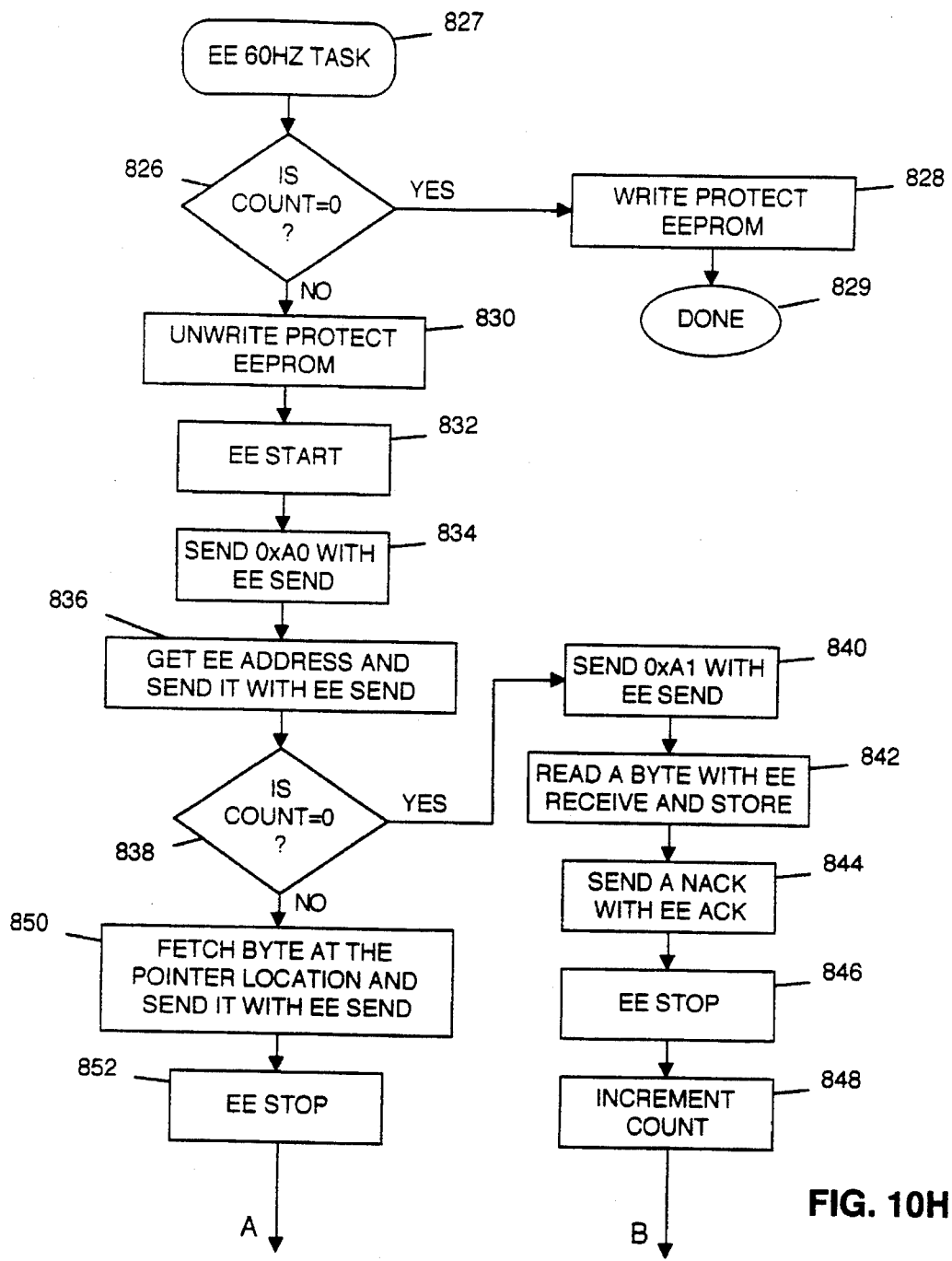
Figure 10I:
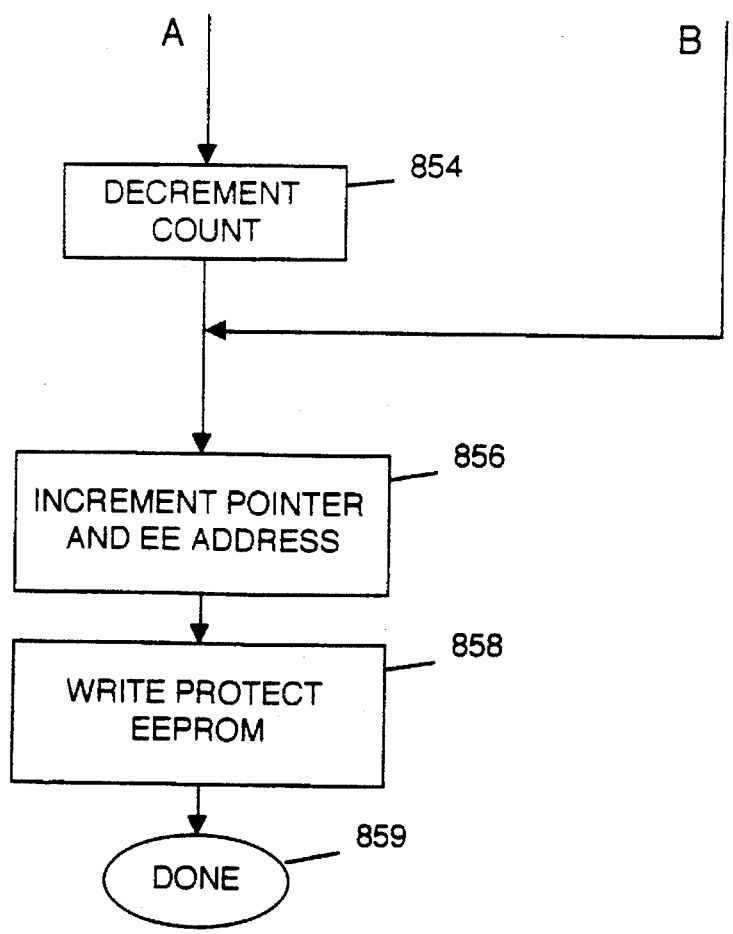

FIGS. 10b–10i are flow-charts of a routine directing reading and writing of an EEPROM. Subroutine EE_IM-MEDIATE_READ reads the requested number of bytes from EEPROM memory. The subroutine begins by performing subroutine EE_START (FIG. 10b). EE_START (FIG. 10g) performs the following: outputs from EEPROM a "1" on the data line 742, then waits 744; outputs a "1" on the clock line 746, then waits 748; outputs a "0" on the data line 750, then waits 752; and finally outputs a "0" on the clock line 754. After EE_START is run, EE_IMMEDIATE READ (FIG. 10b) sends a "0×A1" with subroutine EE_SEND 728 (discussed below). The EE address is then sent according to EE_SEND 730. EE_START is then performed again 732, followed by sending "0×A1" with EE_SEND 734. After "0×A1" is sent, the EEPROM is ready to receive a byte and store it. After receiving a byte 736, the pointer and EE address are incremented 738, and the count is decreased 740. If the count is not zero 742, an ACK is sent with EE_ACK 748 (discussed below) and another byte is received and stored until the count is zero. When the count is equal to zero, a NACK is sent with subroutine EE_NACK 744 and the subroutine is complete 746.

Subroutine EE_Delay (Wait) implements a delay 752.

Subroutine EE_CLOCK (FIG. 10c) proceeds by performing EE_WAIT 752, setting the clock 754, performing EE_WAIT again 756, clearing the clock 758, and performing EE_WAIT one more time 760 before completing the subroutine.

Subroutine EE_RECEIVE (FIG. 10d) allows data to be received by the EEPROM. A byte of information is sent to the EEPROM serially over the data line. Subroutine EE_RECEIVE begins by setting the loop counter to eight 762 (the number of bits in a byte). The data lines are changed to input so that the EEPROM will receive the data 764. The subroutine proceeds by performing EE_WAIT 766, setting the clock 768, and performing EE_WAIT again 770. Next, the bit is read and stored in EEPROM 772 and the loop counter is decreased 774. The subroutine goes back to the first EE_WAIT and reads the next bit until the loop counter is zero 776. Once loop counter is zero, the data lines are set to output 778.

Subroutine EE_SEND (FIG. 10e) allows data to be sent from the EEPROM. EE_SEND begins by setting the loop counter to eight, 780. Then, the next bit is shifted out of the EEPROM 782. If the bit is zero 784, then a "0" is output on the data line 788. Otherwise, a "1" is output 786. After a "0" or a "1" is output, EE_CLOCK is performed 790 followed by outputting a 792. Then, the loop counter is decreased 794 and checked 796 to see if it is zero. EE_SEND continues to shift out the next bit until it is zero. Once the loop counter is zero, EE_CLOCK is performed 798 before the subroutine is completed.

Subroutine EE_ACK (FIG. 10f), referred to above, outputs a "0" on the data line 802 if an ACK is to be sent 800 or a "1" otherwise 804. Then, EE_CLOCK is performed 806.

Subroutine EE_STOP (FIG. 10f) begins by outputting a "0" on the data line 808 and proceeds by: performing EE_WAIT 810; outputting a "1" on the clock line 812; performing EE_WAIT 814; outputting a "1" on the data line 816; performing EE_WAIT 818, outputting a "0" on the clock line 820, performing EE_WAIT 822, and finally outputting a "0" on the data line 824.

Subroutine EE_START begins by outputting a "1" on the data line 742 and proceeds by: performing EE_WAIT 744; outputting a "1" on the clock line 746; performing EE_WAIT 748, outputting a "0" on the data line 750; performing EE_WAIT 752, and finally outputting a "0" on the clock line 754 before completing the subroutine.

Routine EE (FIG. 10h) is a 60 Hertz task that begins by checking the count flag 826. If the count is zero, the routine write-protects the EEPROM before being completed 828. Otherwise, the routine proceeds by un-write-protecting the EEPROM 830 and performing EE_START 832. After EE_START is performed, "0×A1" followed by the EE address are sent by EE_SEND 834,836. The count is then checked 838 to see if it is less than zero. If the count is less than zero, then "0×A1" is sent by EE_SEND 840. Next a byte is read by EE_RECEIVE and stored 842, followed by a NACK being sent by EE_ACK 844. EE_STOP is performed 846, indicating that the byte was sent, and the count is increased 848. On the other hand if the count is greater than or equal to zero, a byte is fetched at the appropriate pointer location and sent with EE_SEND 850. EE_STOP is performed 852, indicating that the byte was received, and then the count is decreased 854. Once the count has been increased or decreased (depending upon whether a byte was received or sent, respectively), the pointer and the EE address are increased 856 and the EEPROM is write protected 858.

In addition to configuration parameters, line voltage samples are logged periodically in the EEPROM. The logging is performed in a circular fashion so that the oldest sample is overwritten by the newest sample. When a report is sent to the utility host, the utility host can extract a brief history of the line voltage as it was sampled before the triggering of the report. The period of time logged by the EEPROM depends on the logging rate which, in turn is set by the utility host. The period can range from 64 seconds for a 0.5 sec log rate to a 24 days for a 4.5 hour log rate.

Figure 11:
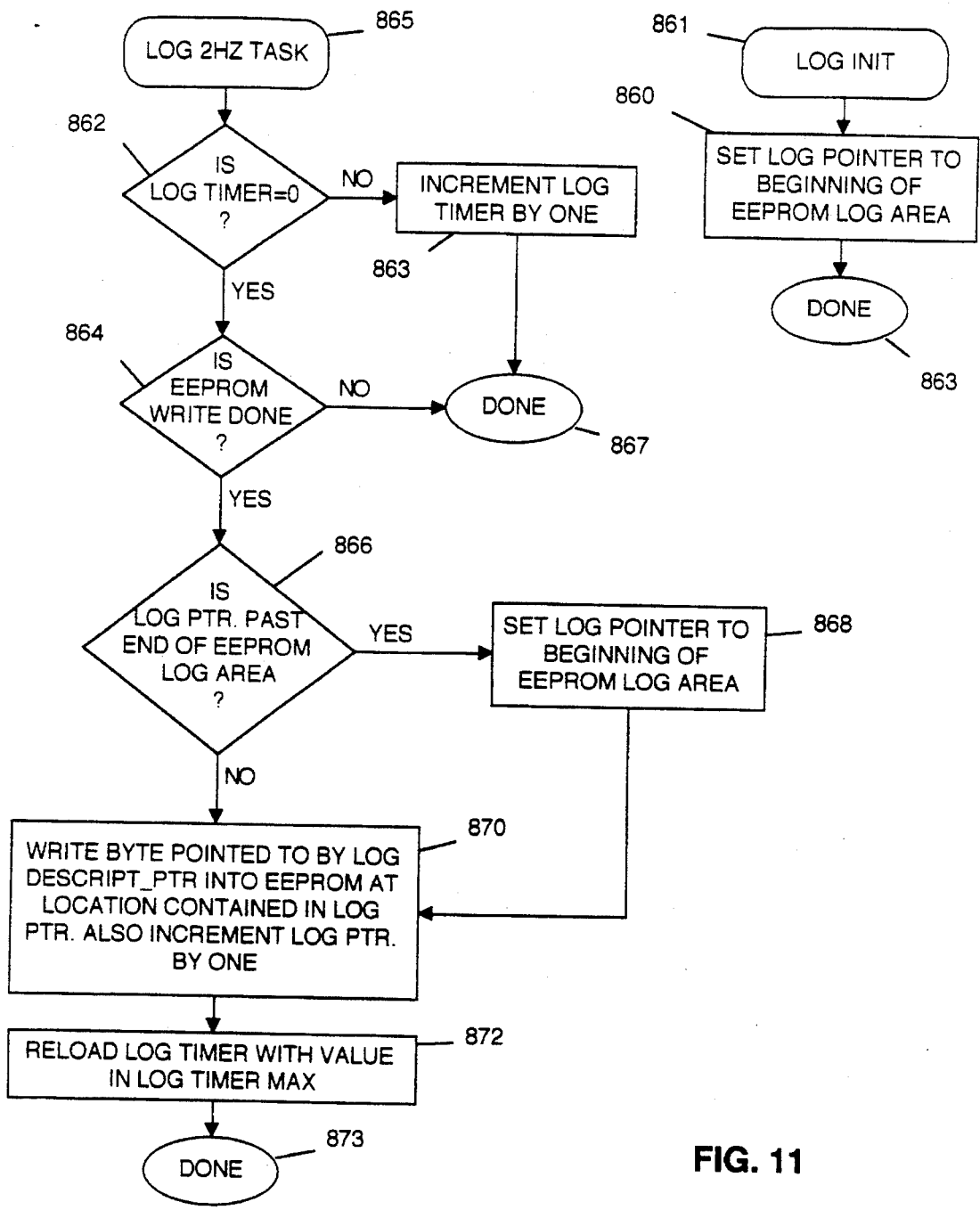
FIGS. 11a–11b are flow-charts of a routine controlling event logging.

FIGS. 11a–11b are flow-charts of a routine controlling event logging. The log area in EEPROM is set by subroutine LOG_INITIALIZATION (FIG. 11a) when called from MAIN during initialization. This routine sets the log pointer at the beginning of the EEPROM log area 860.

Routine LOG (FIG. 11a) is a 2 hertz task that starts by checking the log timer 862 (a negative value that is counted up). When log value equals 1, instantaneous voltage is logged using EEPROM_WRITE 863. When EEPROM_WRITE is done 864, the log pointer is checked to determine if it is at the end of EEPROM log area 866. If it is at the end, log pointer is set to the beginning of the EEPROM log area 868. After this, the byte pointed to by Log_descript_ptr is written into EEPROM at the location contained in Log pointer 870. Note that this process has the side effect of incrementing log pointer by one. Once the log pointer is increased, the log timer is reloaded with the max value 872.

The pattern of the LED indicates to the user the status of PMU. LED has two states: On (*) and off (_). A steady off () designates that the PMU is dead or sleeping. A steady on (*****) indicates that AC line voltage is on and that the PMU is monitoring the voltage. A slow flash () indicates that AC line voltage is on and that the PMU needs to report to the utility host. A fast flash () indicates that AC line voltage is off and that the PMU needs to report to the utility host. A really fast flash (*_*_*_*_) indicates that the PMU is reporting to the utility host. The slowest flash (* ) indicates that AC is off and reporting is complete. A faster flash (*_*) indicates that test mode—is active.

Figure 12:
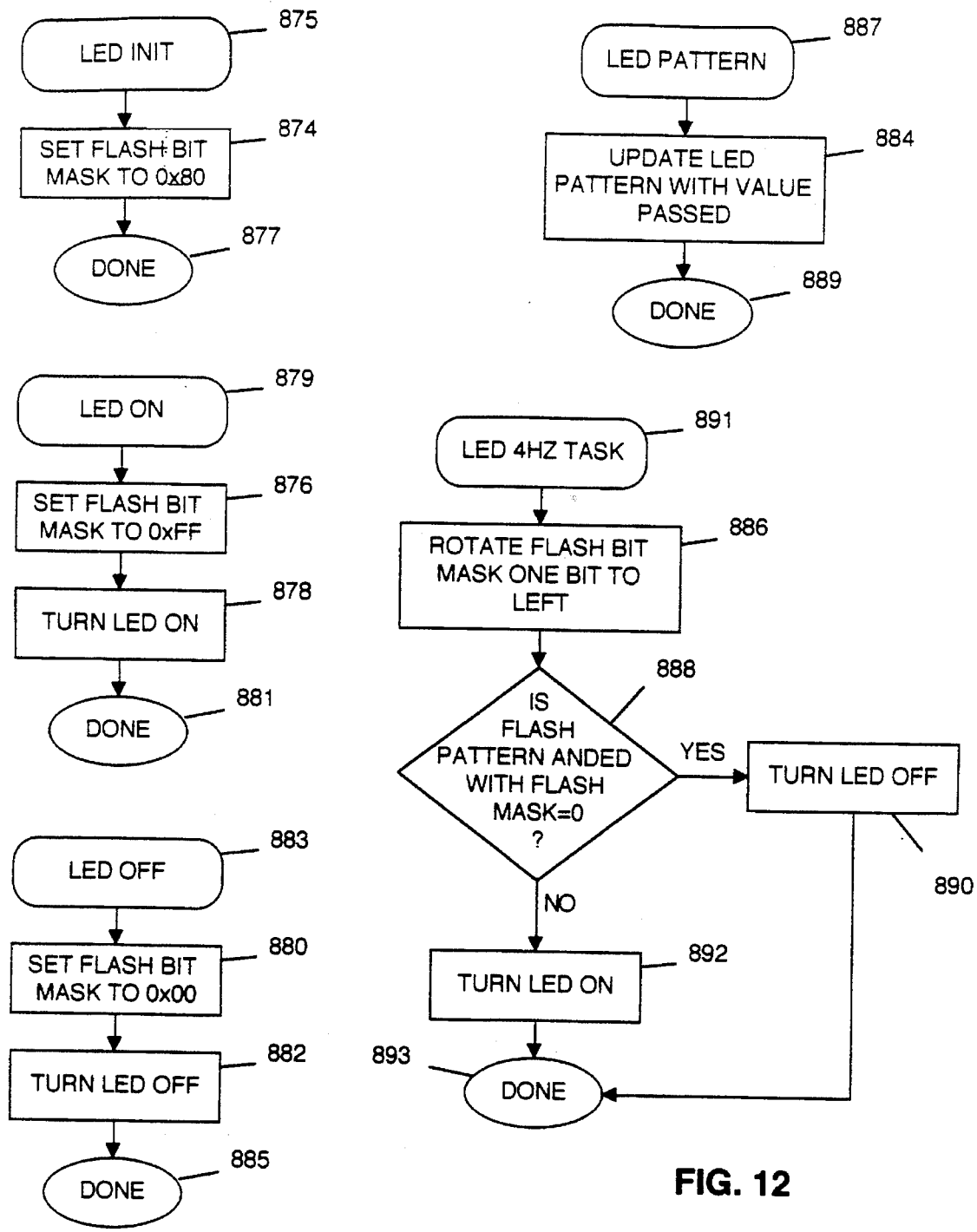
FIGS. 12a–12b are flow-charts of a routine controlling illumination of a light emitting diode.

FIGS. 12a–12b are flow-charts of a routine controlling illumination of a light emitting diode. Routine LED (FIG. 12b) generates the necessary signals to illuminate the LED. Subroutine LED_INITIALIZE (FIG. 12a) initializes the flash bit to a certain value "0×80" 874. Subroutine LED_ON sets the flash bit to "0×FF" 876 to turn on the LED 878. Subroutine LED OFF sets the flash bit to "0×00" 880 to turn off the LED 882. Subroutine LED_PATTERN updates the LED pattern with value of the flash bit that has passed 884. Routine LED (FIG. 12b) is a 4 Hertz task that proceeds through flash bit mask and ANDs the flash pattern 886,888. If the result of the AND is zero, LED Off runs 890, and if the result is not zero then LED On runs 892.

The PMU has a counter to determine how long it has been alive for up to 34 years.

Figure 13:
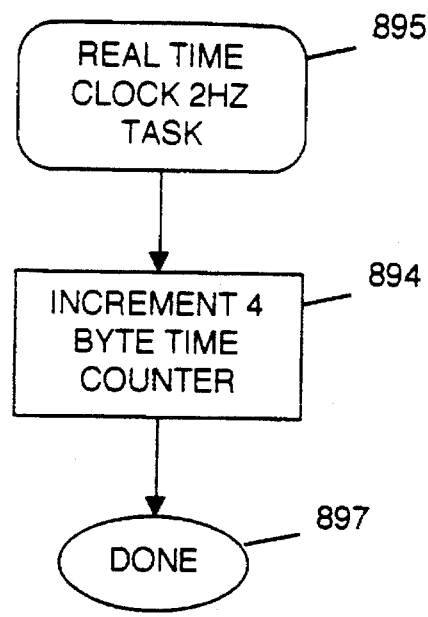
FIG. 13 is a flow-chart of a routine controlling a clock.

FIG. 13 is a flow-chart of a routine controlling a clock. Routine REAL_TIME_CLOCK is a 2 Hertz routine that increments a 4 byte time counter 894.

Figure 14:
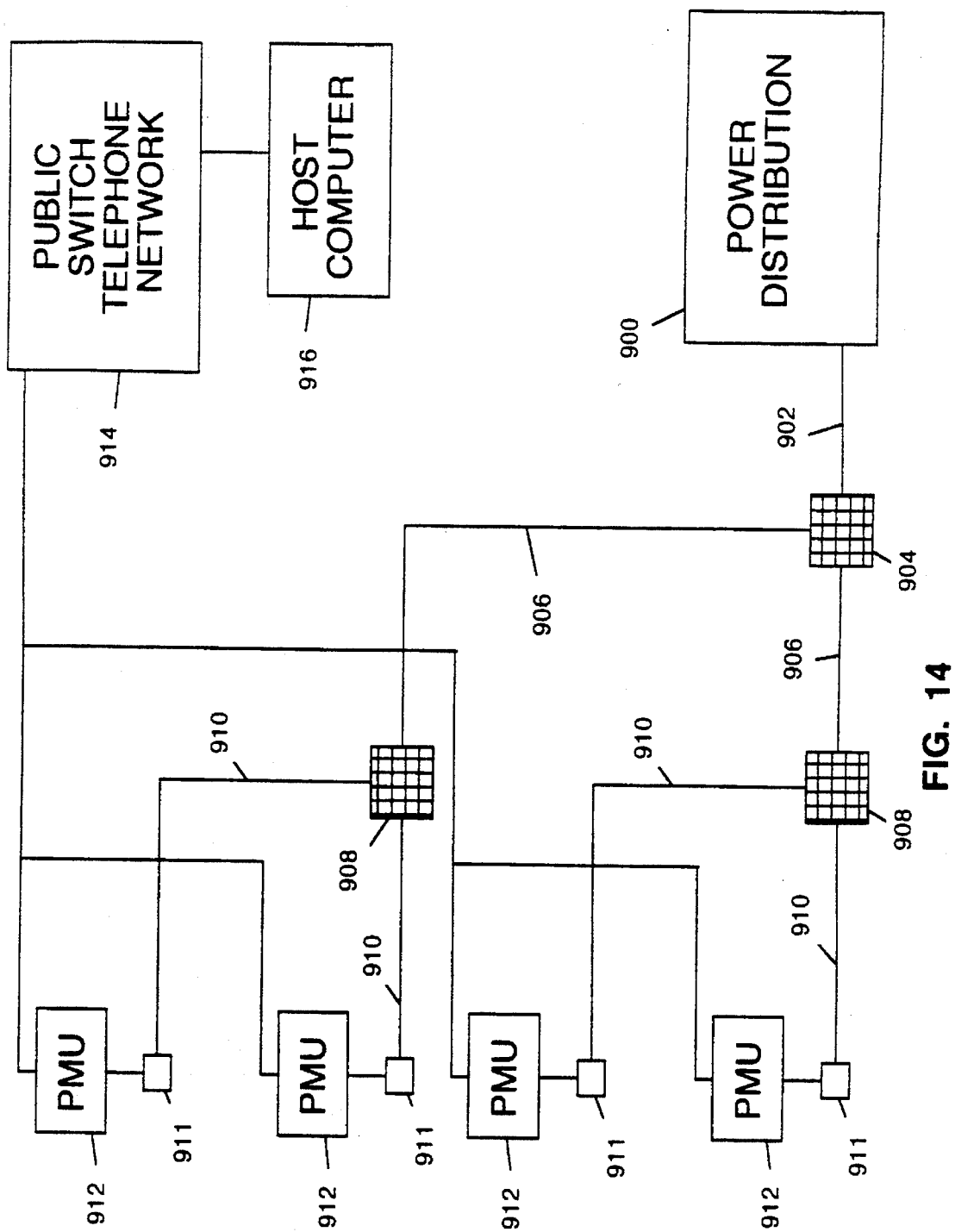
FIG. 14 illustrates a distribution network populated with power monitor units.

FIG. 14 illustrates a distribution network populated with power monitor units. A power distribution network 900 delivers A/C electrical power through a distribution network. In a well known manner, high tension lines 902 carry power to substations 904. Lower tension lines 906 further distribute power throughout a service area, ultimately arriving a local transformers 908 and end-user lines 910 and meters 911.

Power monitor units 912 are distributed substantially throughout a service area at the end-user locations. Power monitor units 912 also connect to the local, public switched telephone network 914. Also on the public switched network 914 is a host computer 916.

Variants of this preferred embodiment are contemplated, such as use in locations where the utility voltage is different from 117 VAC. In the alternative, tone dialing can be used in place of pulse dialing. These examples are meant to illustrate, not limit, the invention defined by the claims.

What is claimed is:

1. A unit for use in a power service area at locations downstream from customer metering units, for monitoring power and reporting to a central location comprising:

a first input receiving an A/C power signal to be monitored;

means responsive to the A/C power signal for sensing a zero crossing of the A/C power signal;

means responsive to the zero crossing of the A/C power signal for timing a delay interval substantially equal to a 90 degree phase shift in the A/C power signal;

means responsive to the delay interval for sampling the A/C power signal at the end of the delay interval;

a static recording medium for recording samples of the A/C power signal;

processing means responsive to the recorded samples of the A/C power signal for detecting an anomaly in the A/C signal power signal in accordance with recorded configuration values;

an interface from the processing means to a communication network distinct from the A/C power signal medium;

said processing means further for reporting to a central location through the interface a unit-dependant time after detecting an anomaly or after a unit-dependant routine interval;

said processing means further responsive to commands from the central location for reporting the recorded samples of the A/C power signal, for reporting a contemporaneous value of the A/C power signal, and for receiving and updating revised configuration values.

2. A power monitoring unit for use in a power service area at locations downstream from customer metering units comprising:

an A/C power signal connection;

a telephone connection;

an A/D converter operating under control of a computer processor and sampling voltage values of an A/C power signal;

a first interface circuit connecting the A/D converter to the A/C power signal connection;

a second interface circuit connecting the computer processor to the telephone connection;

a memory accessible to the computer processor and storing instructions directing the processor to detect anomalies on the A/C power signal and to attempt to report anomalies to a remote location, said program directing the processor to wait a unit-dependant time period after a failed reporting attempt before repeating an attempt to report an anomaly.

3. The unit of claim 2 wherein the memory further stores instructions directing the processor to:

sense a zero crossing of the A/C power signal;

delay a time interval substantially equal to a 90 degree phase shift in the A/C power signal; and sample the A/C power signal at the end of the delay interval.

4. The unit of claim 2 wherein the memory further stores instructions directing the processor to report a contemporaneous value of the A/C power signal to a remote location.

5. The unit of claim 2 wherein the memory further stores instructions directing the processor to compare voltage samples to stored configuration values.

6. The unit of claim 5 wherein the memory further stores instructions directing the processor to revise configuration values in response to a command from a remote location.

7. The unit of claim 2 further comprising a static recording medium for recording samples of the A/C power signal.

8. The unit of claim 7 wherein the memory further stores instructions directing the processor to report a recorded sample to a remote location.

9. A power distribution system carrying power signals via power distribution medium and having monitoring units at end-user locations, each monitoring unit comprising:

a power connection to the power distribution system at locations downstream from a customer metering units;

a communication connection to a communication system distinct from the power distribution medium;

a sensor for detecting power characteristics;

a first interface circuit connecting the sensor to the power connection;

a second interface circuit connecting a processor to the communication connection; said processor programmed to detect anomalies in the power distribution system and to attempt to report anomalies to a remote location, said processor waiting a unit-dependant time period after a failed reporting attempt before repeating an attempt to report an anomaly.

10. The system of claim 9 wherein said processor is further programmed to:

sense a zero crossing of the A/C power signal;

delay a time interval substantially equal to a 90 degree phase shift in the A/C power signal; and sample the A/C power signal at the end of the delay interval.

11. The unit of claim 9 wherein the processor is further programmed to report a contemporaneous value of the A/C power signal to the remote location.

12. The unit of claim 9 wherein the processor is further programmed to compare voltage samples to stored configuration values.

13. The unit of claim 12 wherein the processor is further programmed to revise configuration values in response to a command from the remote location.

14. The unit of claim 9 wherein each monitoring unit further comprises a static recording medium for recording samples of the A/C power signal.

15. The unit of claim 14 wherein the memory further stores instructions directing the processor to report a recorded sample to a remote location.

* * * * *